US012695274B2

(12) United States Patent
Takayama et al.

(10) Patent No.: US 12,695,274 B2
(45) Date of Patent: Jul. 28, 2026

(54) SEMICONDUCTOR LASER DEVICE AND METHOD OF MANUFACTURING THE SAME

(71) Applicant: Nuvoton Technology Corporation Japan, Kyoto (JP)

(72) Inventors: Toru Takayama, Toyama (JP); Togo Nakatani, Toyama (JP); Hiroki Nagai, Toyama (JP); Takashi Yumoto, Toyama (JP); Takeshi Yokoyama, Toyama (JP); Shoichi Takasuka, Hyogo (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 912 days.

(21) Appl. No.: 17/954,587

(22) Filed: Sep. 28, 2022

(65) Prior Publication Data

US 2023/0021325 A1    Jan. 26, 2023

Related U.S. Application Data

(63) Continuation of application No. PCT/JP2021/014301, filed on Apr. 2, 2021.

(30) Foreign Application Priority Data

Apr. 6, 2020    (JP) ................................. 2020-068647

(51) Int. Cl.
*H01S 5/30* (2006.01)
*H01S 5/343* (2006.01)

(52) U.S. Cl.
CPC ........ *H01S 5/34313* (2013.01); *H01S 5/3054* (2013.01); *H01S 5/34346* (2013.01)

(58) Field of Classification Search
CPC .......... H01S 5/16; H01S 5/162; H01S 5/3407; H01S 5/34346; H01S 5/309;
(Continued)

(56) References Cited

U.S. PATENT DOCUMENTS

| 5,392,306 A | * | 2/1995 | Usami | .................... B82Y 20/00 |
| | | | | 257/14 |
| 7,358,522 B2 | * | 4/2008 | Yanamoto | ........... H01S 5/34333 |
| | | | | 257/14 |

(Continued)

FOREIGN PATENT DOCUMENTS

| EP | 0405758 A2 | * | 1/1991 | ............. H01S 5/305 |
| JP | S62-249496 A | | 10/1987 | |

(Continued)

OTHER PUBLICATIONS

Chinese Office Action dated May 30, 2025 issued in the corresponding Chinese Patent Application No. 202180025008.1, with English translation of the Search Report.

(Continued)

*Primary Examiner* — Xinning(Tom) Niu
*Assistant Examiner* — Delma R Forde
(74) *Attorney, Agent, or Firm* — Rimon P.C.

(57) ABSTRACT

A semiconductor laser device includes an N-type cladding layer, an active layer, and a P-type cladding layer. The active layer includes a well layer, a P-side first barrier layer above the well layer, and a P-side second barrier layer above the P-side first barrier layer. The P-side second barrier layer has an Al composition ratio higher than an Al composition ratio of the P-side first barrier layer. The P-side second barrier layer has band gap energy greater than band gap energy of the P-side first barrier layer. The semiconductor laser device has an end face window structure in which band gap energy of a portion of the well layer in a vicinity of an end face that emits the laser light is greater than band gap energy of a central portion of the well layer in a resonator length direction.

24 Claims, 39 Drawing Sheets

(58) Field of Classification Search
CPC .. H01S 5/3095; H01S 5/34353; H01S 5/3436;
H01S 5/34366; H01S 5/34373; H01S
5/343
See application file for complete search history.

(56) References Cited

U.S. PATENT DOCUMENTS

| | | | |
|---|---|---|---|
| 2004/0120378 A1 * | 6/2004 | Tanaka | B82Y 20/00 372/45.01 |
| 2005/0152420 A1 | 7/2005 | Kim | |
| 2006/0166386 A1 | 7/2006 | Yamada et al. | |
| 2017/0201069 A1 * | 7/2017 | Hitaka | H01S 5/34313 |
| 2019/0074665 A1 | 3/2019 | Takayama et al. | |
| 2020/0412101 A1 | 12/2020 | Takayama et al. | |
| 2021/0021104 A1 * | 1/2021 | Huang | H01S 5/3403 |
| 2021/0167582 A1 | 6/2021 | Nakatani et al. | |

FOREIGN PATENT DOCUMENTS

| | | | | |
|---|---|---|---|---|
| JP | 2000-082862 A | | 3/2000 | |
| JP | 2004-087763 A | | 3/2004 | |
| JP | 2004087763 | * | 3/2004 | ............ H01S 5/343 |
| JP | 2005-191349 A | | 7/2005 | |
| JP | 2005-197755 A | | 7/2005 | |
| JP | 2009-224370 A | | 10/2009 | |
| WO | 2005/074047 A1 | | 8/2005 | |
| WO | 2017/195502 A1 | | 11/2017 | |
| WO | 2019/187583 A1 | | 10/2019 | |
| WO | WO-2020022116 A1 | * | 1/2020 | ............ H01S 5/3211 |

OTHER PUBLICATIONS

International Search Report issued on Jun. 15, 2021 in International Patent Application No. PCT/JP2021/014301, with English translation.

* cited by examiner

FIG. 4

| | | Working example 1 | Working example 2 | Working example 3 |
|---|---|---|---|---|
| P-type cladding layer (60) | Al composition $X_{PC}$ | 0.70 | 0.70 | 0.70 |
| | In composition $Y_{PC}$ | 0 | 0 | 0 |
| | Thickness | 1 μm | 1 μm | 1 μm |
| | Impurity concentration | $2 \times 10^{18}$ cm$^{-3}$ | $2 \times 10^{18}$ cm$^{-3}$ | $2 \times 10^{18}$ cm$^{-3}$ |
| Interface region between P-type cladding layer and P-type guiding layer | Al composition slope | 0.24→0.70 | 0.24→0.70 | 0.24→0.70 |
| | Thickness (μm) | 50 nm | 50 nm | 50 nm |
| P-type guiding layer (50) | Al composition $X_{PG}$ | 0.24 | 0.24 | 0.27 |
| | In composition $Y_{PG}$ | 0 | 0 | 0 |
| | Thickness (μm) | 0.20 μm | 0.20 μm | 0.20 μm |
| P-side second barrier layer (43b) | Al composition $X_{PB2}$ | 0.24 | 0.12→0.24 | 0.12→0.27 |
| | In composition $Y_{PB2}$ | 0 | 0 | 0 |
| | Thickness | 15 nm | 15 nm | 15 nm |
| P-side first barrier layer (43a) | Al composition $X_{PB1}$ | 0.12 | 0.12 | 0.12 |
| | In composition $Y_{PB1}$ | 0 | 0 | 0 |
| | Thickness/undoped region length | 15 nm/5 nm | 15 nm/5 nm | 15 nm/5 nm |
| Well layer (41) | Al composition $X_W$ | 0 (0.04) | 0 (0.04) | 0 (0.04) |
| | In composition $Y_W$ | 0.12 (0.14) | 0.12 (0.14) | 0.12 (0.14) |
| | Thickness (μm) | 8.5 nm | 8.5 nm | 8.5 nm |
| N-side first barrier layer (42a) | Al composition $X_{NB1}$ | 0.12 | 0.12 | 0.12 |
| | In composition $Y_{NB1}$ | 0 | 0 | 0 |
| | Thickness/undoped region length | 15 nm/5 nm | 15 nm/5 nm | 15 nm/5 nm |
| | Impurity concentration | $1 \times 10^{17}$ cm$^{-3}$ | $1 \times 10^{17}$ cm$^{-3}$ | $1 \times 10^{17}$ cm$^{-3}$ |
| N-side second barrier layer (42b) | Al composition $X_{NB2}$ | 0.24 | 0.24→0.12 | 0.24→0.12 |
| | In composition $Y_{NB2}$ | 0 | 0 | 0 |
| | Thickness | 15 nm | 15 nm | 15 nm |
| | Impurity concentration | $1.4 \times 10^{17}$cm$^{-3}$ | $1.4 \times 10^{17}$cm$^{-3}$ | $1.9 \times 10^{17}$cm$^{-3}$ |
| N-type guiding layer (30) | Al composition $X_{NG}$ | 0.240 | 0.240 | 0.240 |
| | In composition $Y_{NG}$ | 0 | 0 | 0 |
| | Thickness (μm) | 1 μm | 1 μm | 1 μm |
| | Impurity concentration | $2 \times 10^{17}$cm$^{-3}$/ $5 \times 10^{17}$cm$^{-3}$ | $2 \times 10^{17}$cm$^{-3}$/ $5 \times 10^{17}$cm$^{-3}$ | $2 \times 10^{17}$cm$^{-3}$/ $5 \times 10^{17}$cm$^{-3}$ |
| Interface region between N-type cladding layer and N-type guiding layer | Al composition slope | 0.32→0.24 | 0.32→0.24 | 0.32→0.24 |
| | Thickness (μm) | 30 nm | 30 nm | 30 nm |
| N-type cladding layer (20) | Al composition $X_{NC}$ | 0.320 | 0.320 | 0.320 |
| | In composition $Y_{NC}$ | 0 | 0 | 0 |
| | Thickness | 3 μm | 3 μm | 3 μm |
| | Impurity concentration | $2 \times 10^{18}$cm$^{-3}$ | $2 \times 10^{18}$cm$^{-3}$ | $2 \times 10^{18}$cm$^{-3}$ |

FIG. 6

[Al composition slope region length dependence of optical confinement rate]

[Al composition slope region length dependence of waveguide loss]

FIG. 8A

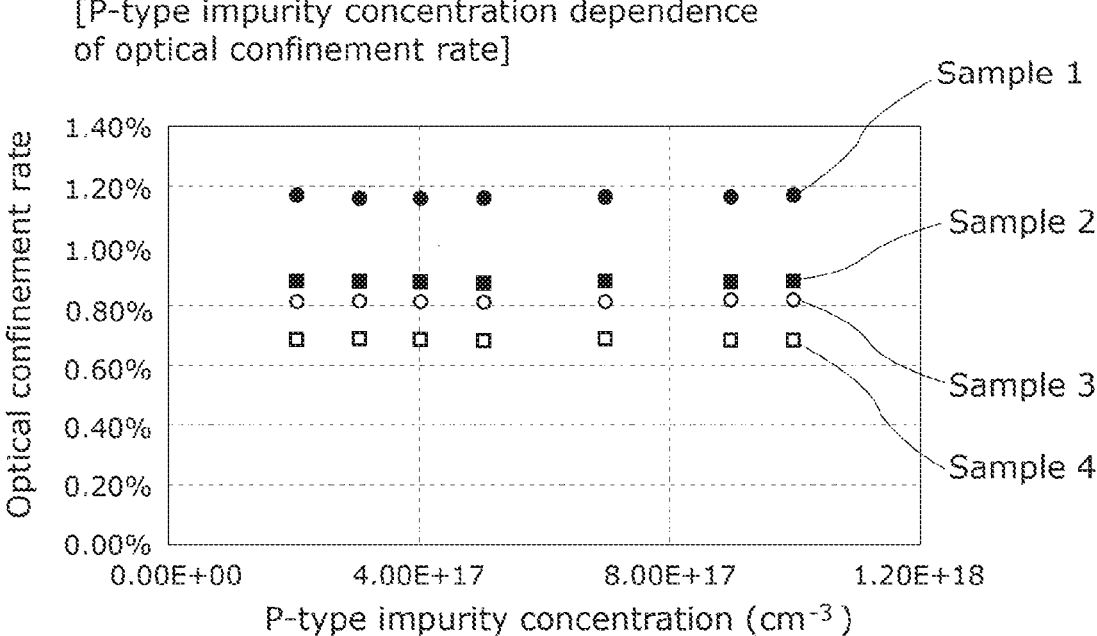

[P-type impurity concentration dependence of optical confinement rate]

● Sample 1: First barrier layer: Al composition of 0.12, thickness of 30 nm
Second barrier layer: Al composition increasing aslope from 0.12 to 0.24, thickness of 15 nm ▦ Sample 2: First barrier layer: Al composition of 0.12, thickness of 15 nm
Second barrier layer: Al composition increasing aslope from 0.12 to 0.24, thickness of 15 nm ○ Sample 3: First barrier layer: Al composition of 0.18, thickness of 30 nm
Second barrier layer: Al composition increasing aslope from 0.12 to 0.24, thickness of 15 nm □ Sample 4: First barrier layer: Al composition of 0.18, thickness of 15 nm
Second barrier layer: Al composition increasing aslope from 0.12 to 0.24, thickness of 15 nm

FIG. 8B

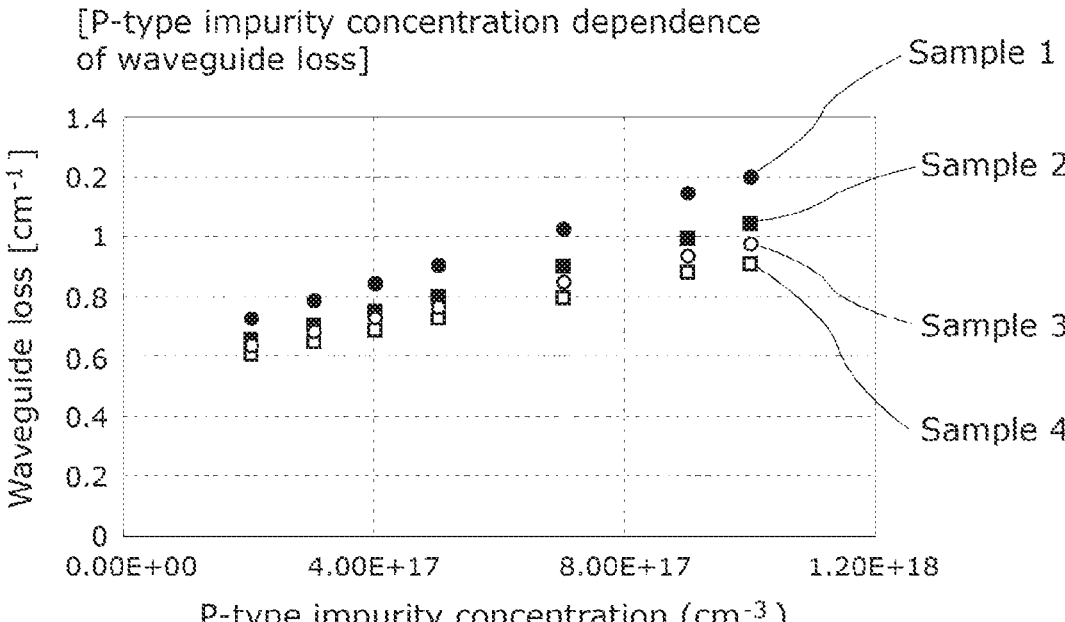

[P-type impurity concentration dependence of waveguide loss]

● Sample 1: First barrier layer: Al composition of 0.12, thickness of 30 nm
   Second barrier layer: Al composition increasing aslope from
   0.12 to 0.24, thickness of 30 nm ▨ Sample 2: First barrier layer: Al composition of 0.12, thickness of 15 nm
   Second barrier layer: Al composition increasing aslope from
   0.12 to 0.24, thickness of 15 nm ○ Sample 3: First barrier layer: Al composition of 0.18, thickness of 30 nm
   Second barrier layer: Al composition increasing aslope from
   0.12 to 0.24, thickness of 15 nm □ Sample 4: First barrier layer: Al composition of 0.18, thickness of 15 nm
   Second barrier layer: Al composition increasing aslope from
   0.12 to 0.24, thickness of 15 nm

[Relation of waveguide loss to optical confinement rate with regard to thickness of N-side first barrier layer and P-side first barrier layer]

[Relation of waveguide loss to optical confinement rate with regard to thickness of N-side second barrier layer and P-side second barrier layer]

[P-type impurity concentration
dependence of potential barrier (ΔEg) ]

[P-type impurity concentration dependence
of electron current density]

[P-type impurity concentration dependence
of potential barrier (ΔEg) ]

[P-type impurity concentration dependence
of electron current density]

[P-type impurity concentration dependence
of potential barrier (ΔEg) ]

[P-type impurity concentration dependence
of electron current density]

[P-type guiding layer Al composition dependence of potential barrier (ΔEg)]

[P-type guiding layer Al composition dependence of electron current density]

N-type impurity concentration dependence of hole current density
(Position at distance of 100 nm from N-side interface of well layer)

N-type impurity concentration dependence of hole current density
(Position of interface of N-type cladding layer on substrate side)

FIG. 21C

SEMICONDUCTOR LASER DEVICE AND METHOD OF MANUFACTURING THE SAME

CROSS REFERENCE TO RELATED APPLICATIONS

This is a continuation application of PCT International Application No. PCT/JP2021/014301 filed on Apr. 2, 2021, designating the United States of America, which is based on and claims priority of Japanese Patent Application No. 2020-068647 filed on Apr. 6, 2020. The entire disclosures of the above-identified applications, including the specifications, drawings and claims are incorporated herein by reference in their entirety.

FIELD

The present disclosure relates to a semiconductor laser device and a method of manufacturing the same.

BACKGROUND

Semiconductor laser elements have attracted attention as light sources for various applications such as light sources for image display devices like displays and projectors etc., light sources for vehicular headlamps, light sources for industrial lighting or household lighting, or light sources for industrial equipment like laser welding equipment, thin-film annealers, and laser processing equipment.

There has been a demand for, among those semiconductor laser elements, semiconductor laser elements used as light sources for laser processing equipment or laser welding equipment to have high-power characteristics in which light output considerably exceeds one watt. For example, there has been a demand for semiconductor laser elements in a wavelength band of 915 nm used as light sources for laser welding equipment to have high-power characteristics of at least 25 W.

A semiconductor laser element includes: for example, a substrate; an N-type cladding layer above the substrate; an active layer including a well layer and a barrier layer, above the N-type cladding layer; and a P-type cladding layer above the active layer (see Patent Literature (PTL) 1, for example).

In semiconductor laser elements having an oscillation laser wavelength in a range from 900 nm to 980 nm, an active layer having a quantum well structure in which a well layer comprises InGaAs and a barrier layer comprises AlGaAs is widely used.

CITATION LIST

Patent Literature

PTL 1: Japanese Unexamined Patent Application Publication No. 62-249496

SUMMARY

Technical Problem

Possible methods of making a semiconductor laser element watt-class high-power include increasing a thermal saturation level and increasing a catastrophic optical damage (COD) level.

However, if a window region is formed in an end face portion of a semiconductor laser element in order to increase a COD level, and additionally a well layer of an active layer is increased in thickness in order to increase a thermal saturation level, the following problems arise: temperature characteristics deteriorate, long-term reliability decreases, and the effect of increasing a COD level is blocked.

The present disclosure is intended to solve such problems, and provides a semiconductor laser device and a method of manufacturing the same that are capable of reducing blocking of the effect of increasing a COD level while reducing a deterioration of temperature characteristics and a decrease in long-term reliability even if a well layer is increased in thickness in the semiconductor laser device having an end face window structure.

Solution to Problem

In order to solve the above problems, a semiconductor laser device according to one aspect of the present disclosure is a semiconductor laser device that emits laser light, and includes: an N-type cladding layer, an active layer, and a P-type cladding layer, wherein the active layer includes: a well layer; a P-side first barrier layer above the well layer; and a P-side second barrier layer above the P-side first barrier layer, the P-side second barrier layer has an Al composition ratio higher than an Al composition ratio of the P-side first barrier layer, the P-side second barrier layer has band gap energy greater than band gap energy of the P-side first barrier layer, and the semiconductor laser device has an end face window structure in which band gap energy of a portion of the well layer in a vicinity of an end face that emits the laser light is greater than band gap energy of a central portion of the well layer in a resonator length direction.

Advantageous Effects

The present disclosure allows a semiconductor laser device having an end face window structure to reduce blocking of the effect of increasing a COD level while reducing a deterioration of temperature characteristics and a decrease in long-term reliability even if a well layer is increased in thickness.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 4 is a diagram showing, with regard to the semiconductor laser device according to the embodiment, specific examples of a composition, thickness, and impurity concentration of each semiconductor layer in Working Example 1, Working Example 2, and Working Example 3.

FIG. 6 is a diagram for illustrating functions and effects of the semiconductor laser device according to the embodiment.

FIG. 8A is a diagram illustrating a P-type impurity concentration dependence of an optical confinement rate in the semiconductor laser device according to the embodiment.

FIG. 8B is a diagram illustrating a P-type impurity concentration dependence of waveguide loss in the semiconductor laser device according to the embodiment.

FIG. 21C is a cross-sectional view of the semiconductor laser device according to the variation, along line XXIC-XXIC shown in FIG. 20.

DESCRIPTION OF EMBODIMENT

Figure 1:
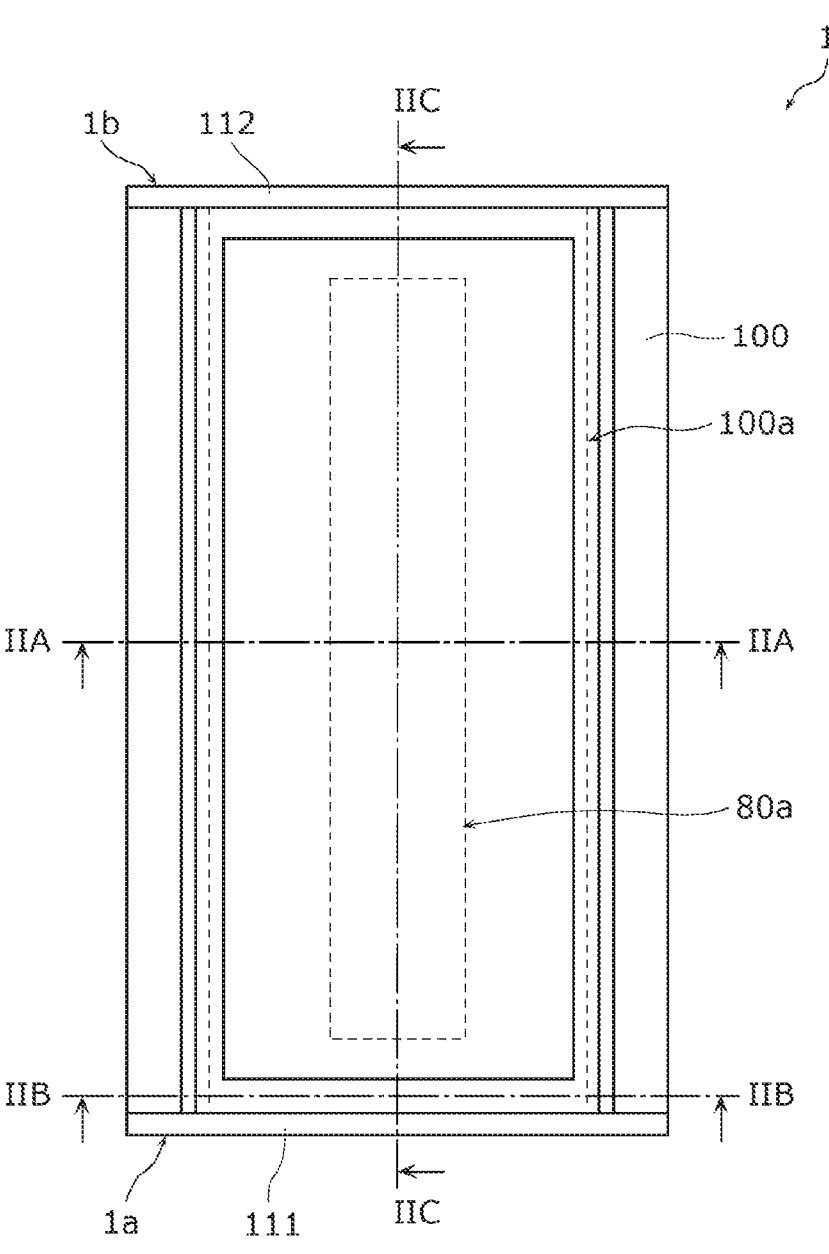
FIG. 1 is a top view of a semiconductor laser device according to an embodiment.

Circumstances which have led to an aspect of the present disclosure

First, circumstances which have led to an aspect of the present disclosure will be described before an embodiment of the present disclosure is described.

Possible methods of making a semiconductor laser element watt-class high-power include increasing a thermal saturation level, increasing a COD level, and reducing thermal resistance by increasing a resonator length.

Specifically, possible methods of increasing a thermal saturation level include: decreasing an oscillation threshold value by increasing a factor for confining light to a well layer by increasing the well layer in thickness; reducing the occurrence of electron overflow by increasing a potential barrier in height by increasing a conduction band offset (ΔEc) by increasing an Al composition of a barrier layer comprising AlGaAs; and decreasing an operating carrier density by increasing a resonator length.

Moreover, possible methods of increasing a COD level include causing a semiconductor laser element to have an end face window structure by forming a window region in an end face portion on a front end face side, which is a laser light emission end face. It is possible to form an end face window structure by disordering atomic arrangements of a barrier layer and a well layer in an end face portion using vacancy diffusion, impurity diffusion, or ion implantation.

However, if the well layer is increased in thickness in order to increase a factor for confining light to the well layer, it becomes difficult to disorder the atomic arrangements of the barrier layer and the well layer, which makes it difficult to form the window region.

In view of this, it is conceivable that, by increasing an annealing temperature when the window region is formed, an interchange of atoms is promoted between the well layer and the barrier layer, and the atomic arrangements are disordered.

However, the increase in annealing temperature when the window region is formed also causes an atomic exchange between the well layer and the barrier layer in an active layer in a gain portion for which the formation of the window region is not intended. As a result, band gap energy (Eg) increases in the gain portion, temperature characteristics deteriorate due to an increase in leakage current in the gain portion, and long-term reliability decreases due to a decrease in oscillation wavelength controllability by diffusion of vacancies introduced at the time of crystal growth or diffusion of vacancies in the surface of a growth layer due to dangling bond of the surface of the growth layer being made easier. Specifically, the increase in band gap energy causes a transition wavelength of a quantum well layer in the gain portion to be a short wavelength.

Moreover, the increase in annealing temperature when the window region is formed makes a transition region likely to be long, the transition region being formed at the boundary between a region (a window portion) for which the formation of the window region is intended and a region (the gain portion) for which the formation of the window region is not intended. In consequence, light absorption in the transition region blocks the effect of increasing a COD level produced by the window region.

If, as stated above, the window region is formed in the end face portion of the semiconductor laser element in order to increase a COD level, and additionally the well layer of the active layer is increased in thickness in order to increase a thermal saturation level, the following problems arise: temperature characteristics deteriorate, long-term reliability decreases, and the effect of increasing a COD level is blocked.

The present disclosure is intended to solve such problems, and provides a semiconductor laser device and a method of manufacturing the same that are capable of reducing blocking of the effect of increasing a COD level while reducing a deterioration of temperature characteristics and a decrease in long-term reliability, even if a well layer is increased in thickness in the semiconductor laser device having an end face window structure.

Moreover, since mounting strain when a semiconductor laser element is mounted results in higher susceptibility to the influence of band structural change if a resonator length is increased in order to reduce thermal resistance, the following problem also arises: a polarization ratio decreases easily.

Accordingly, the present disclosure also provides a semiconductor laser device and a method of manufacturing the same that are capable of reducing a decrease in polarization ratio even if a resonator length is increased.

Hereinafter, an embodiment of the present disclosure will be described with reference to the drawings. It should be noted that the embodiment described below shows a specific example of the present disclosure. Therefore, the numerical values, shapes, materials, constituent elements, and the arrangement and connection of the constituent elements described in the following embodiment are examples, and thus are not intended to limit the present disclosure.

Moreover, the drawings are schematic diagrams, and are not necessarily exact illustrations. Accordingly, scaling etc. is not necessarily consistent throughout the drawings. It should be noted that in the drawings, the same reference signs are given to substantially the same configurations, and overlapping descriptions are omitted or simplified.

Furthermore, in this Specification, the terms "above" and "below" do not refer to the upward (vertically upward) direction and downward (vertically downward) direction in terms of absolute spatial recognition, and are used as terms defined by relative positional relations based on the laying order of a stacked configuration. Additionally, the terms "above" and "below" are applied not only when two constituent elements are disposed with a gap therebetween and another constituent element is interposed between the two constituent elements, but also when two constituent elements are disposed in contact with each other.

EMBODIMENT

[Layer Configuration of Semiconductor Laser Device]

Figure 2A:
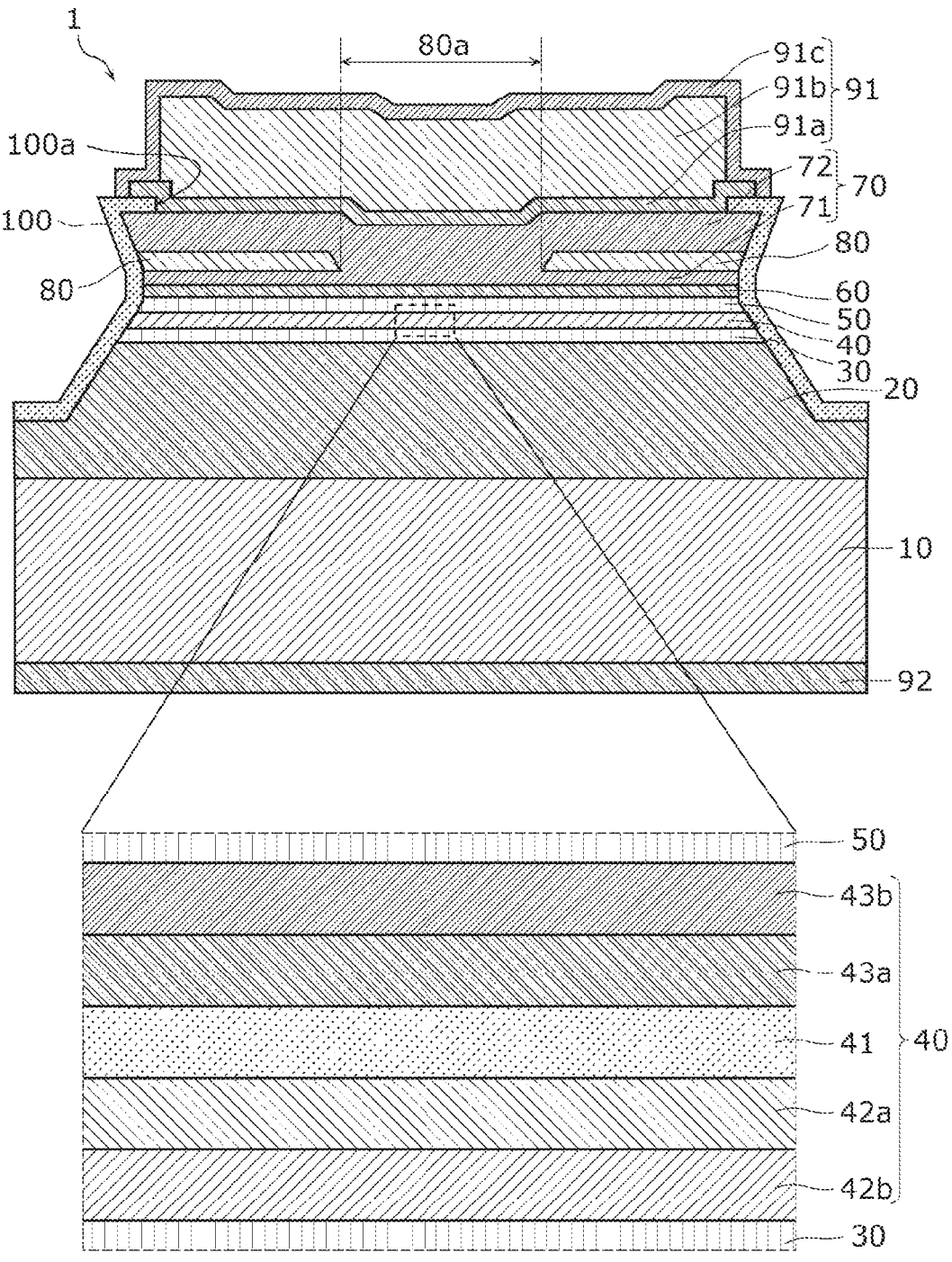
FIG. 2A is a cross-sectional view of the semiconductor laser device according to the embodiment, along line IIA-IIA shown in FIG. 1.
Figure 2B:
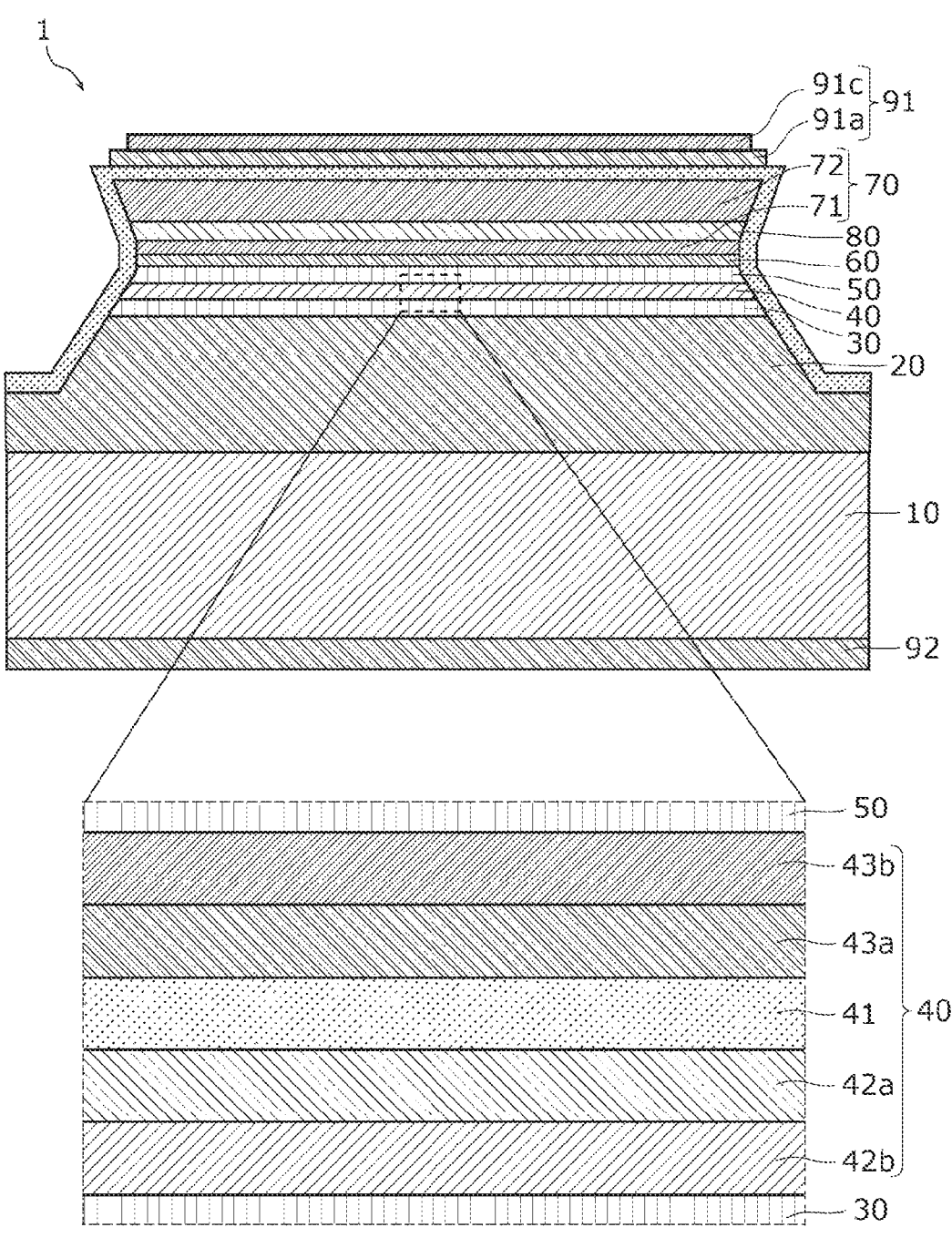
FIG. 2B is a cross-sectional view of the semiconductor laser device according to the embodiment, along line IIB-IIB shown in FIG. 1.
Figure 2C:
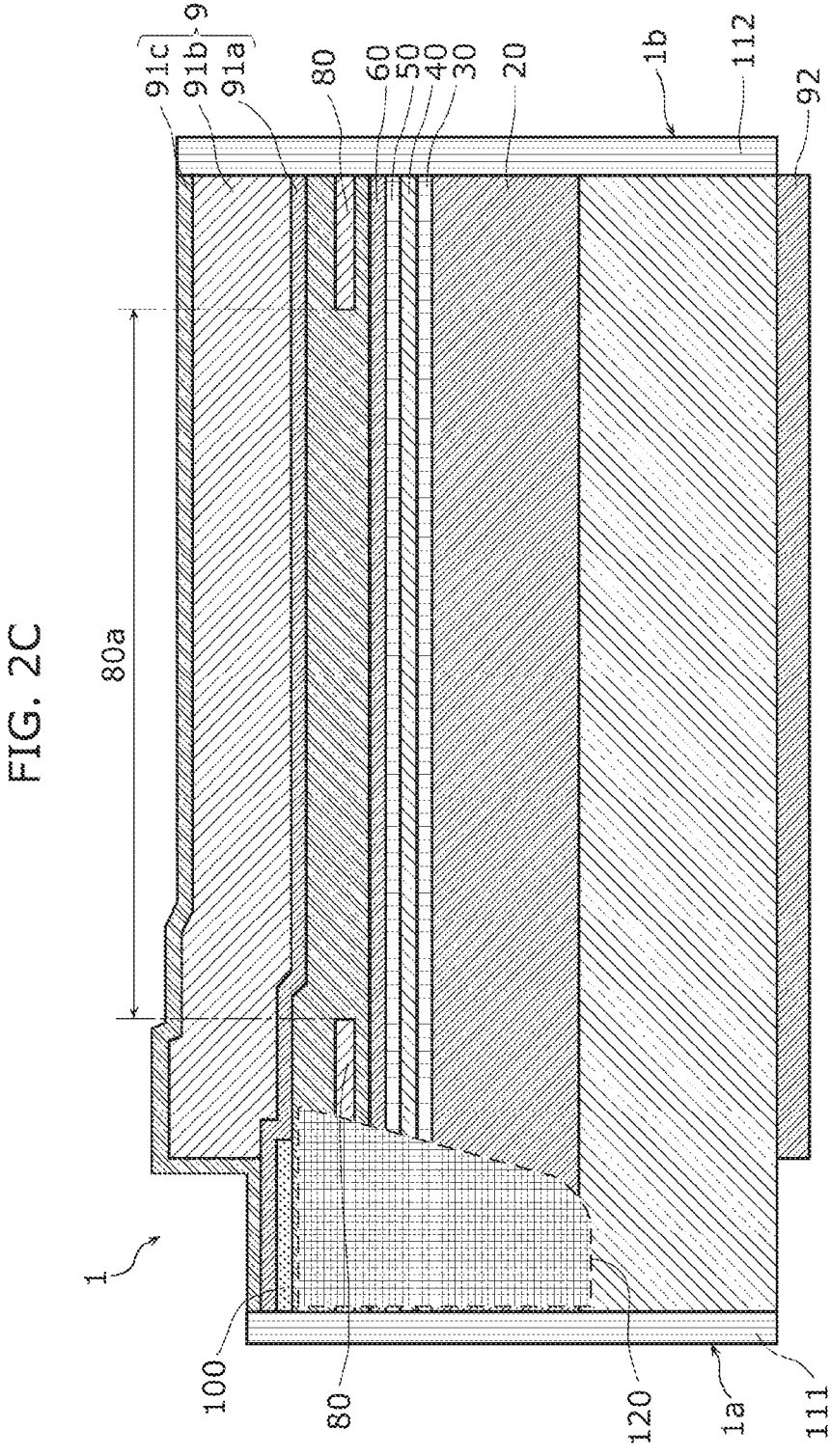
FIG. 2C is a cross-sectional view of the semiconductor laser device according to the embodiment, along line IIC-IIC shown in FIG. 1.

First, a layer configuration of semiconductor laser device 1 according to an embodiment will be described with reference to FIG. 1, FIG. 2A, FIG. 2B, and FIG. 2C. FIG. 1 is a top view of semiconductor laser device 1 according to the embodiment. FIG. 2A is a cross-sectional view of semiconductor laser device 1 taken along line IIA-IIA in FIG. 1. FIG. 2B is a cross-sectional view of semiconductor laser device 1 taken along line IIB-IIB in FIG. 1. FIG. 2C is a cross-sectional view of semiconductor laser device 1 taken along line IIC-IIC in FIG. 1. It should be noted that FIG. 2A shows a cross section in a gain portion of semiconductor laser device 1, and FIG. 2B shows a cross section in an end face portion on a front end face 1a side of semiconductor laser device 1.

Semiconductor laser device 1 is a semiconductor laser element that emits laser light, and includes a substrate and a semiconductor stacked body (a semiconductor stacked structure) including semiconductor layers above the substrate. Specifically, as shown in FIG. 1 to FIG. 2C, semiconductor laser device 1 includes, as semiconductor layers constituting the semiconductor stacked body, N-type cladding layer 20 above substrate 10, active layer 40 above N-type cladding layer 20, and P-type cladding layer 60 above active layer 40.

Semiconductor laser device 1 further includes, as semiconductor layers constituting the semiconductor stacked body: N-type guiding layer 30 between N-type cladding layer 20 and active layer 40; P-type guiding layer 50 between active layer 40 and P-type cladding layer 60; P-type contact layer 70 above P-type cladding layer 60; and current blocking layer 80.

Additionally, semiconductor laser device 1 includes P-side electrode 91 and N-side electrode 92 connected to the semiconductor stacked body, and insulating film 100 covering at least a portion of the semiconductor stacked body.

Semiconductor laser device 1 according to the present embodiment is a semiconductor laser element that emits laser light having a wavelength in a range from 900 nm to 980 nm. For example, the semiconductor stacked body in semiconductor laser device 1 includes a III-V group compound semiconductor comprising an AlGaInAs-based material. As an example, semiconductor laser device 1 emits laser light in a wavelength band of 915 nm. Moreover, though the details will be given below, semiconductor laser device 1 has an end face window structure in which window region 120 is provided to the semiconductor stacked body.

Hereinafter, each constituent element of semiconductor laser device 1 according to the present embodiment will be described in detail.

Substrate 10 is a planar substrate whose principal surface is evenly flat. Substrate 10 is a semiconductor substrate such as a GaAs substrate, or an insulating substrate such as a sapphire substrate. In the present embodiment, substrate 10 is an n-type GaAs substrate. It should be noted that a buffer layer may be provided between substrate 10 and N-type cladding layer 20. The buffer layer is, for example, an n-type GaAs layer, and is stacked on substrate 10.

N-type cladding layer 20 is provided above substrate 10. If the buffer layer is provided on substrate 10, N-type cladding layer 20 is provided on the buffer layer. N-type cladding layer 20 is an N-type semiconductor layer intentionally doped with impurities, and is, for example, an n-type AlGaAs layer. Examples of the impurities with which N-type cladding layer 20 is doped include silicon (Si).

N-type guiding layer 30 is disposed between N-type cladding layer 20 and N-side second barrier layer 42b of active layer 40. Specifically, N-type guiding layer 30 is provided on N-type cladding layer 20. N-type guiding layer 30 is an N-type semiconductor layer intentionally doped with impurities, and is, for example, an n-type AlGaAs layer. Examples of the impurities with which N-type guiding layer 30 is doped include silicon (Si).

Active layer 40 is a semiconductor layer including an emission layer, and is located between N-type cladding layer 20 and P-type cladding layer 60. Specifically, active layer 40 is located between N-type guiding layer 30 and P-type guiding layer 50. In the present embodiment, active layer 40 is provided on N-type guiding layer 30.

Active layer 40 includes: well layer 41; N-side first barrier layer 42a below well layer 41; N-side second barrier layer 42b below N-side first barrier layer 42a; P-side first barrier layer 43a above well layer 41; and P-side second barrier layer 43b above P-side first barrier layer 43a.

Well layer 41 is located between N-side first barrier layer 42a and P-side first barrier layer 43a, and is in contact with N-side first barrier layer 42a and P-side first barrier layer 43a. Specifically, well layer 41 is provided on N-side first barrier layer 42a.

Well layer 41 has, for example, a single quantum well structure including a single quantum well layer. Well layer 41 is, for example, an undoped GaInAs layer. It should be noted that well layer 41 is not limited to the single quantum well structure, and may be a multiple quantum well structure including quantum well layers. It should also be noted that in the present embodiment, well layer 41 is thick and has, for example, a thickness of at least 6 nm.

N-side first barrier layer 42a and N-side second barrier layer 42b are located between N-type cladding layer 20 and well layer 41, and are disposed in stated order from well layer 41 to N-type cladding layer 20. Specifically, N-side first barrier layer 42a and N-side second barrier layer 42b are located between N-type guiding layer 30 and well layer 41.

N-side first barrier layer 42a is provided on N-side second barrier layer 42b. In the present embodiment, N-side first barrier layer 42a is an N-type semiconductor layer intentionally doped with impurities, and is, for example, an n-type AlGaAs layer. Examples of the impurities with which N-side first barrier layer 42a is doped include silicon (Si).

N-side first barrier layer 42a may include an undoped region doped with no impurities, in addition to a doped region doped with impurities. In this case, N-side first barrier layer 42a may include the undoped region in a region closer to well layer 41, and the doped region in a region farther from well layer 41. The undoped region of N-side first barrier layer 42a may have a thickness of at least 5 nm. Although series resistance of semiconductor laser device 1 decreases when N-side first barrier layer 42a in the vicinity of well layer 41 is doped with impurities, free carrier loss occurs, and waveguide loss increases. Since the series resistance of semiconductor laser device 1 increases if the undoped region increases in thickness excessively, in order to reduce an increase in free carrier loss due to the doping of the impurities while reducing an increase in series resistance, the undoped region may have a thickness of at least 5 nm and at most 40 nm. If an impurity doping concentration in N-type guiding layer 30 gradually increases in a direction away from well layer 41, it is also possible to reduce an increase in waveguide loss even if the undoped region is caused to have a thickness of at most 20 nm.

N-side second barrier layer 42b below N-side first barrier layer 42a is provided on N-type guiding layer 30. In the present embodiment, N-side second barrier layer 42b is an N-type semiconductor layer intentionally doped with impurities, and is, for example, an n-type AlGaAs layer. Examples of the impurities with which N-side second barrier layer 42b is doped include silicon (Si).

P-side first barrier layer 43a and P-side second barrier layer 43b are located between well layer 41 and P-type cladding layer 60, and are disposed in stated order from well layer 41 to P-type cladding layer 60. Specifically, P-side first barrier layer 43a and P-side second barrier layer 43b are located between well layer 41 and P-type guiding layer 50.

P-side first barrier layer 43a is provided on well layer 41. In the present embodiment, P-side first barrier layer 43a is a P-type semiconductor layer intentionally doped with impurities, and is, for example, a P-type AlGaAs layer. Examples of the impurities with which P-side first barrier layer 43a is doped include carbon (C).

P-side first barrier layer 43a may include an undoped region doped with no impurities, in addition to a doped region doped with impurities. In this case, P-side first barrier layer 43a may include the undoped region in a region closer to well layer 41, and the doped region in a region farther from well layer 41. The undoped region of P-side first barrier layer 43a may have a thickness of at least 5 nm. Although the series resistance of semiconductor laser device 1 decreases if P-side first barrier layer 43a in the vicinity of well layer 41 is doped with impurities, free carrier loss occurs, and waveguide loss increases. Since the series resistance of semiconductor laser device 1 increases if the undoped region increases in thickness excessively, in order to reduce an increase in free carrier loss due to the doping of the impurities while reducing an increase in series resistance, the undoped region may have a thickness of at least 5 nm and at most 40 nm. If an impurity doping concentration in P-type guiding layer 50 gradually increases in a direction away from well layer 41, it is also possible to reduce an increase in waveguide loss even if the undoped region is caused to have a thickness of at most 20 nm.

P-side second barrier layer 43b is provided on P-side first barrier layer 43a. In the present embodiment, P-side second barrier layer 43b is a P-type semiconductor layer intentionally doped with impurities, and is, for example, a P-type AlGaAs layer. Examples of the impurities with which P-side second barrier layer 43b is doped include carbon (C).

P-type guiding layer 50 is disposed between P-side second barrier layer 43b of active layer 40 and P-type cladding layer 60. Specifically, P-type guiding layer 50 is provided on P-side second barrier layer 43b. P-type guiding layer 50 is a P-type semiconductor layer intentionally doped with impurities, and is, for example, a P-type AlGaAs layer. Examples of the impurities with which P-type guiding layer 50 is doped include carbon (C).

P-type cladding layer 60 is provided on P-type guiding layer 50. P-type cladding layer 60 is a P-type semiconductor layer intentionally doped with impurities, and is, for example, a P-type AlGaAs layer. C is doped as the impurities. Examples of the impurities with which P-type cladding layer 60 is doped include carbon (C).

P-type contact layer 70 is provided on P-type cladding layer 60. P-type contact layer 70 is provided between P-type cladding layer 60 and P-side electrode 91. P-type contact layer 70 is a P-type semiconductor layer intentionally doped with impurities, and is, for example, a P-type GaAs layer.

In the present embodiment, P-type contact layer 70 is a stacked film obtained by stacking first contact layer 71 and second contact layer 72 in stated order from a P-type cladding layer 60 side. As an example, first contact layer 71 is a P-type GaAs layer having a thickness of 0.2 μm. Moreover, second contact layer 72 is a P-type GaAs layer having a thickness of 1 μm, and is provided on first contact layer 71 and current blocking layer 80, filling opening 80a of current blocking layer 80.

Current blocking layer 80 is provided inside P-type contact layer 70. Specifically, current blocking layer 80 is provided on first contact layer 71 of P-type contact layer 70. In the present embodiment, current blocking layer 80 includes a N-type semiconductor layer intentionally doped with impurities. Specifically, current blocking layer 80 is an n-type GaAs layer doped with silicon (Si) as impurities.

Current blocking layer 80 includes opening 80a for defining a current injection region. Opening 80a of current blocking layer 80 extends linearly in a resonator length direction of semiconductor laser device 1. Although opening 80a of current blocking layer 80 is present in a gain portion of semiconductor laser device 1, opening 80a is not present in an end face portion of semiconductor laser device 1. Accordingly, as shown in FIG. 2A, in the gain portion of semiconductor laser device 1, current blocking layer 80 does not cover the central portion of first contact layer 71. On the other hand, as shown in FIG. 2B, since opening 80a of current blocking layer 80 is not provided to the end face portion of semiconductor laser device 1, current blocking layer 80 covers first contact layer 71 entirely.

N-type current blocking layer 80 is provided inside P-type contact layer 70 as above. Consequently, an effective refractive index step is formed relative to a horizontal direction of active layer 40 by heat generated in first contact layer 71 that becomes a current injection region as a result of current confinement performed by current blocking layer 80. Accordingly, it is possible to perform optical confinement in the horizontal direction.

P-side electrode 91 is disposed on the P-type cladding layer 60 side and is connected to P-type contact layer 70. Specifically, P-side electrode 91 is provided on P-type contact layer 70. P-side electrode 91 contains, for example, at least one metal from a group comprising Pt, Ti, Cr, Ni, Mo, and Au.

In the present embodiment, P-side electrode 91 includes layers. Specifically, P-side electrode 91 includes three layers composed of first P electrode layer 91a, plated layer 91b, and second P electrode layer 91c. First P electrode layer 91a, plated layer 91b, and second P electrode layer 91c are stacked on P-type contact layer 70 in stated order. Moreover, first P electrode layer 91a and second P electrode layer 91c each include films and have, for example, a three-layer structure of Ti/Pt/Au. Furthermore, plated layer 91b is an Au plated film.

As shown in FIG. 2A, although the three layers composed of first P electrode layer 91a, plated layer 91b, and second P electrode layer 91c are present in the gain portion of semiconductor laser device 1, in the end face portion of semiconductor laser device 1, plated layer 91b is not present, and two layers composed of first P electrode layer 91a and second P electrode layer 91c are present.

N-side electrode 92 is disposed on an N-type cladding layer 20 side. In the present embodiment, N-side electrode 92 is provided to a lower surface of substrate 10 (i.e., a principal surface on the back side of substrate 10). N-side electrode 92 includes, for example, an AuGe film, an Ni film, an Au film, a Ti film, a Pt film, and an Au film stacked sequentially from a substrate 10 side.

Insulating film 100 is a dielectric film that covers at least lateral surfaces of active layer 40. In the present embodiment, insulating film 100 covers a pair of lateral surfaces of the semiconductor stacked body. Specifically, insulating film 100 covers lateral surfaces of N-type cladding layer 20, N-type guiding layer 30, active layer 40, P-type guiding layer 50, P-type cladding layer 60, P-type contact layer 70, and current blocking layer 80. Insulating film 100 includes an insulating film comprising, for example, SiN or $SiO_2$, and serves as a current blocking film.

In the present embodiment, the pair of lateral surfaces of the semiconductor stacked body are inclined surfaces, and insulating film 100 covers at least the inclined surfaces. Additionally, the inclined surfaces of the semiconductor stacked body are provided to at least the lateral surfaces of active layer 40. Since the lateral surfaces of active layer 40 are inclined, it is possible to reduce return of stray light again to a central portion of active layer 40 in a width direction, the stray light traveling from the central portion to the lateral surfaces. For this reason, since it is possible to reduce a competition between the stray light and laser light that is oscillated in active layer 40, a laser drive operation becomes stable.

Moreover, insulating film 100 includes opening 100a. Opening 100a of insulating film 100 extends linearly in the resonator length direction of semiconductor laser device 1. Although opening 100a of insulating film 100 is present in the gain portion of semiconductor laser device 1, opening 100a is not present in the end face portion of semiconductor laser device 1. Accordingly, as shown in FIG. 2A, in the gain portion of semiconductor laser device 1, insulating film 100 covers only an end portion of P-type contact layer 70. On the other hand, as shown in FIG. 2B, since opening 100a of insulating film 100 is not provided to the end face portion of semiconductor laser device 1, insulating film 100 covers P-type contact layer 70 entirely.

As shown in FIG. 1 and FIG. 2C, semiconductor laser device 1 includes front end face 1a (a light-emitting end face) that is an end face on the front side from which laser light is emitted, and back end face 1b that is an end face on the rear side opposite to the front side on which front end face 1a is located.

The semiconductor stacked body of semiconductor laser device 1 includes an optical waveguide for which front end face 1a and back end face 1b are used as reflecting mirrors of a resonator. Accordingly, front end face 1a and back end face 1b become end faces of the resonator, and a resonator length of semiconductor laser device 1 is a distance between front end face 1a and back end face 1b. In the present embodiment, the resonator length of semiconductor laser device 1 is at least 2 mm and further may be at least 4 mm. It should be noted that the resonator length of semiconductor laser device 1 may be less than 2 mm.

The width of the current injection region for injecting current into the optical waveguide is defined by opening 80a of current blocking layer 80. Opening 80a of current blocking layer 80 is provided more inwardly than front end face 1a and back end face 1b. In other words, the end portions of the current injection region in the resonator length direction are located more inwardly than front end face 1a and back end face 1b.

In semiconductor laser device 1, first end face coating film 111 is provided to front end face 1a of the semiconductor stacked body, and second end face coating film 112 is provided to back end face 1b of the semiconductor stacked body. First end face coating film 111 and second end face coating film 112 are each a reflective film including a dielectric multilayer film. For example, first end face coating film 111 is a multilayer film comprising $Al_2O_3$ and $Ta_2O_5$, and second end face coating film 112 is a multilayer film comprising $Al_2O_3$, $SiO_2$, and $Ta_2O_5$. As an example, first end face coating film 111 has a reflectance of 2%, and second end face coating film 112 has a reflectance of 95%.

It should be noted that the reflectances of first end face coating film 111 and second end face coating film 112 are not limited to the above example. For example, if semiconductor laser device 1 is used for a semiconductor laser module including an external resonator, first end face coating film 111 may have a reflectance of at most 0.2%. This feature makes it possible to reduce the occurrence of problems such as the generation of kinks by a competition between a laser oscillation mode in semiconductor laser device 1 and a laser oscillation mode in the external resonator.

In the present embodiment, the semiconductor stacked body in semiconductor laser device 1 has end face window structures in both end portions in the resonator length direction. Specifically, window regions 120 are provided in regions having a predetermined length from front end face 1a in current non-injection regions close to both end faces of the optical waveguide in active layer 40. Window region 120 is provided to an end face portion of the semiconductor stacked body on the front end face 1a side. It should be noted that a similar window region may be provided to an end face portion of the semiconductor stacked body on a back end face 1b side. The window region on back end face 1b side need not always be provided.

Here, if Eg1 denotes peak energy of photoluminescence in a region of active layer 40 in which window region is not provided, Eg2 denotes peak energy of photoluminescence in a region of active layer 40 in which window region 120 is provided, and AEg denotes a difference between Eg1 and Eg2, window region 120 is provided so that, for example, the relation $\Delta Eg=Eg2-Eg1=100$ meV is satisfied. In other words, a band gap of active layer 40 in the regions in the vicinity of front end face 1a and back end face 1b is made greater than a band gap of active layer 40 in regions other than those in the vicinity of front end face 1a and back end face 1b. Specifically, the band gap energy of portions of active layer 40 in the vicinity of front end face 1a and back end face 1b is greater than the band gap energy of the central portion of active layer 40 in the resonator length direction.

Generally speaking, methods for providing window regions 120 include impurity diffusion and vacancy diffusion. In present embodiment, windows are provided by vacancy diffusion. This is because in a semiconductor laser device that outputs super-high power of more than 10 W per emitter, it is important to decrease the amount of absorbed light by reducing loss. To put it another way, if window regions are provided by impurity diffusion, it is difficult to reduce light absorption loss since impurities increase light absorption, but vacancy diffusion does not use impurities, so light absorption loss resulting from introduction of impurities can be eliminated by providing window regions by vacancy diffusion. Window region 120 is provided as an end face window structure by vacancy diffusion on the front end face 1a side. In addition, a similar window region is provided on the back end face 1b side.

It should be noted that the vacancy diffusion makes it possible to provide window regions by rapid high-temperature processing. For example, by diffusing Ga vacancies by exposing a protective film that generates the Ga vacancies at the time of high-temperature processing to very high-temperature heat in a range from 800° C. to 950° C. near a crystal growth temperature after the protective film is provided on a semiconductor layer of a region in which a window region is provided, counter diffusion of vacancies and group III elements makes it possible to disorder a quantum well structure of active layer 40. As a result, it is possible to increase a band gap of active layer 40 and cause the region in which the quantum well structure is disordered to serve as a window region (make the quantum well structure transparent). Moreover, it is possible to reduce the disordering of the quantum well structure in regions other than the window region by providing a protective film that reduces generation of Ga vacancies at the time of high-temperature processing.

As stated above, by causing semiconductor laser device 1 to have the end face window structure, it is possible to make the end face of the resonator of semiconductor laser device 1 transparent and to reduce the light absorption in the vicinity of front end face 1a. Accordingly, it is possible to reduce the occurrence of COD in front end face 1a.

[Method of Manufacturing Semiconductor Laser Device]

Next, a method of manufacturing semiconductor laser device 1 according to the embodiment will be described with reference to FIG. 3A to FIG. 3H. FIG. 3A to FIG. 3H are each a diagram for illustrating a corresponding one of steps in the method of manufacturing semiconductor laser device 1 according to the embodiment. It should be noted that in FIG. 3B to FIG. 3H, the upper diagram shows a cross section of a portion corresponding to a current injection region that is a region into which current is injected, and the lower diagram shows a cross section of a portion corresponding to a current non-injection region that is a region into which current is not injected.

Figure 3A:
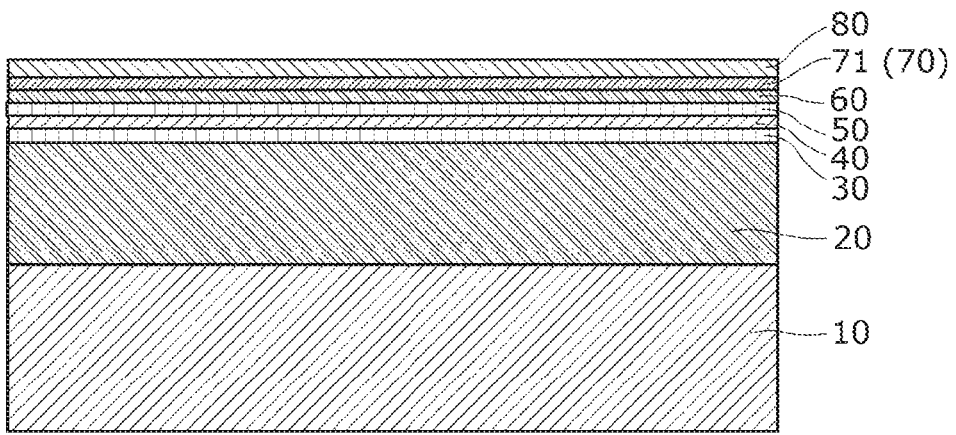
FIG. 3A is a diagram for illustrating a semiconductor layer stacking step in a method of manufacturing a semiconductor laser device according to the embodiment.

As shown in FIG. 3A, first, substrate 10 is prepared, and semiconductor layers are stacked on substrate 10. A step of stacking semiconductor layers includes at least a step of disposing N-type cladding layer 20 above substrate 10, a step of disposing active layer 40 above N-type cladding layer 20, and a step of disposing P-type cladding layer 60 above active layer 40.

Specifically, N-type cladding layer 20, N-type guiding layer 30, active layer 40, P-type guiding layer 50, P-type cladding layer 60, first contact layer 71 of P-type contact layer 70, and current blocking layer 80 are stacked on substrate 10, which is an n-GaAs wafer, by causing sequential crystal growth of these layers using a crystal growth technique based on metalorganic chemical vapor deposition (MOCVD).

N-side second barrier layer 42b, N-side first barrier layer 42a, well layer 41, P-side first barrier layer 43a, and P-side second barrier layer 43b are stacked as active layer 40 on N-type guiding layer 30 by causing sequential crystal growth of these layers.

Figure 3B:
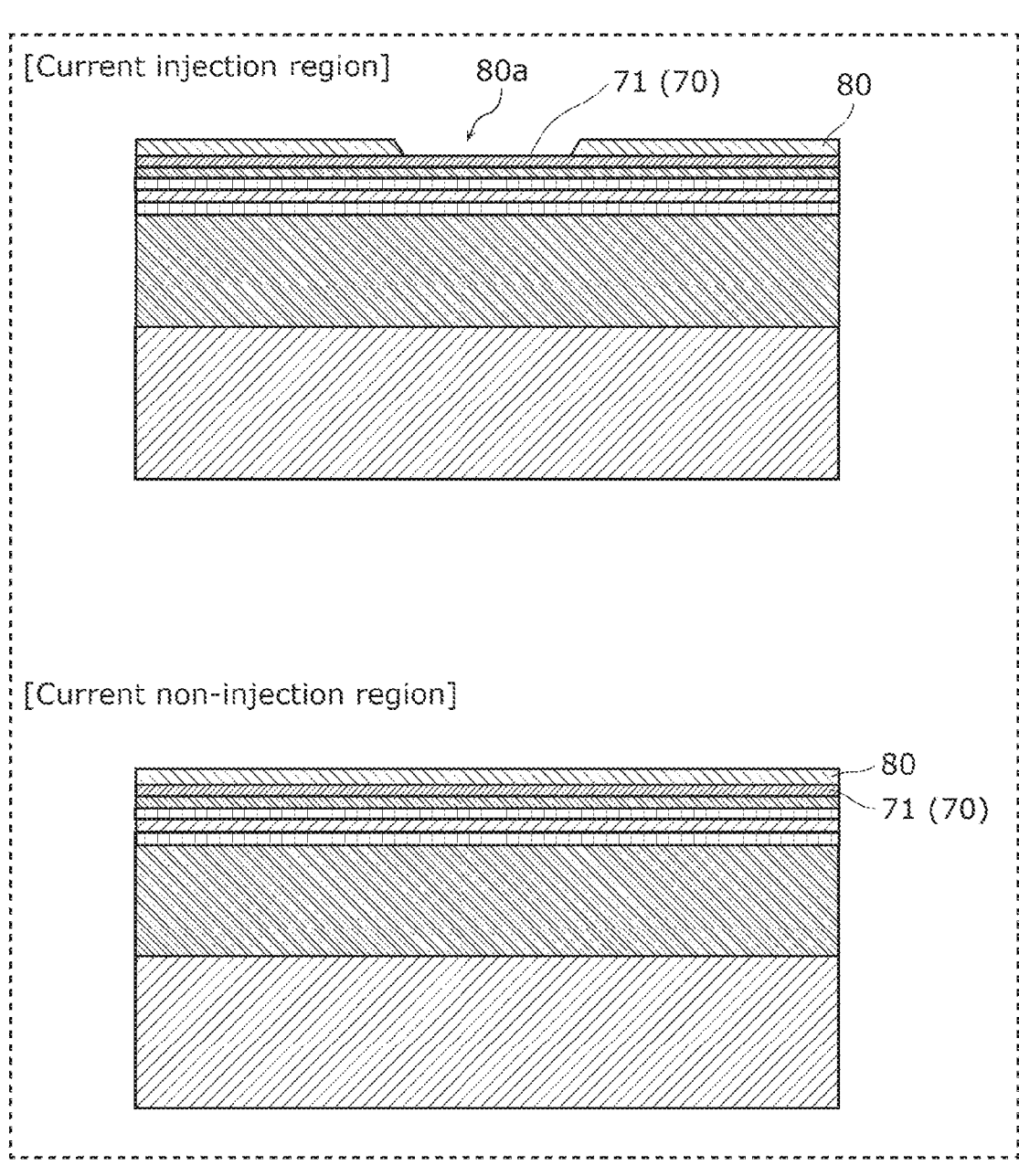
FIG. 3B is a diagram for illustrating a current injection region forming step in the method of manufacturing the semiconductor laser device according to the embodiment.
Figure 3C:
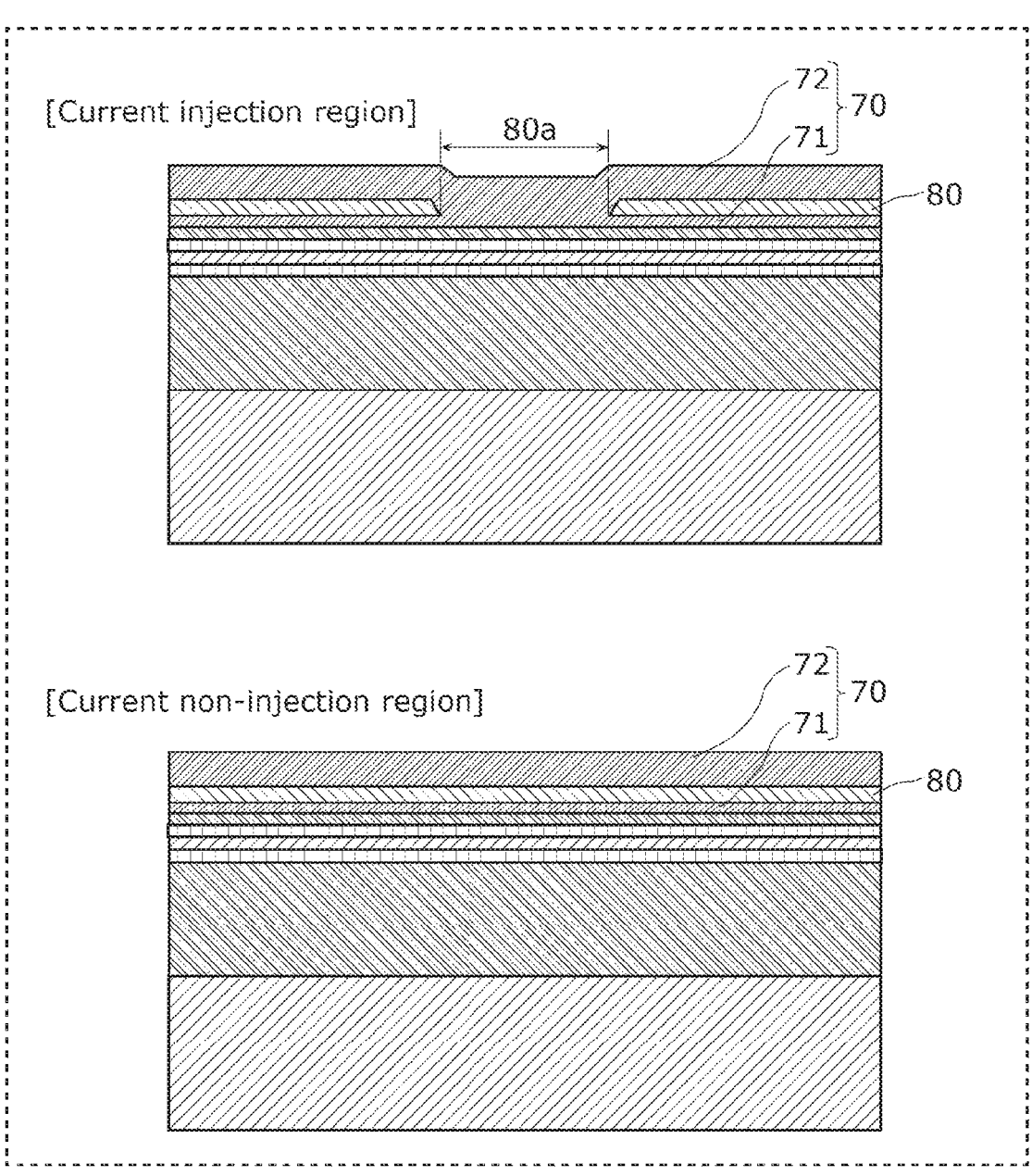
FIG. 3C is a diagram for illustrating an embedding step in the method of manufacturing the semiconductor laser device according to the embodiment.

Next, as shown in FIG. 3B, opening 80a for defining a current injection region is formed in current blocking layer 80. Specifically, a mask comprising SiO₂ etc. is formed in a predetermined pattern on first contact layer 71 using a photolithography technique, and opening 80a is formed in a portion of current blocking layer 80 corresponding to the current injection region by etching current blocking layer 80 using a wet etching technique until first contact layer 71 is exposed. In contrast, in a current non-injection region in an end face portion of semiconductor laser device 1, opening 80a is not formed in current blocking layer 80. It should be noted that etchant for etching current blocking layer 80 is desirably sulfuric acid-based etchant. For example, etchant having a 1:1:40 composition of sulfuric acid, hydrogen peroxide water, and water by volume can be used.

Next, as shown in FIG. 3, after a mask when opening 80a is formed in current blocking layer 80 is removed by hydrofluoric acid-based etchant, crystal growth is caused in second contact layer 72 of P-type contact layer 70 using the crystal growth technique based on MOCVD. Specifically, crystal growth of second contact layer 72 is caused on current blocking layer 80 and first contact layer 71 exposed from opening 80a of current blocking layer 80, filling opening 80a of current blocking layer 80 in the current injection region.

Figure 3D:
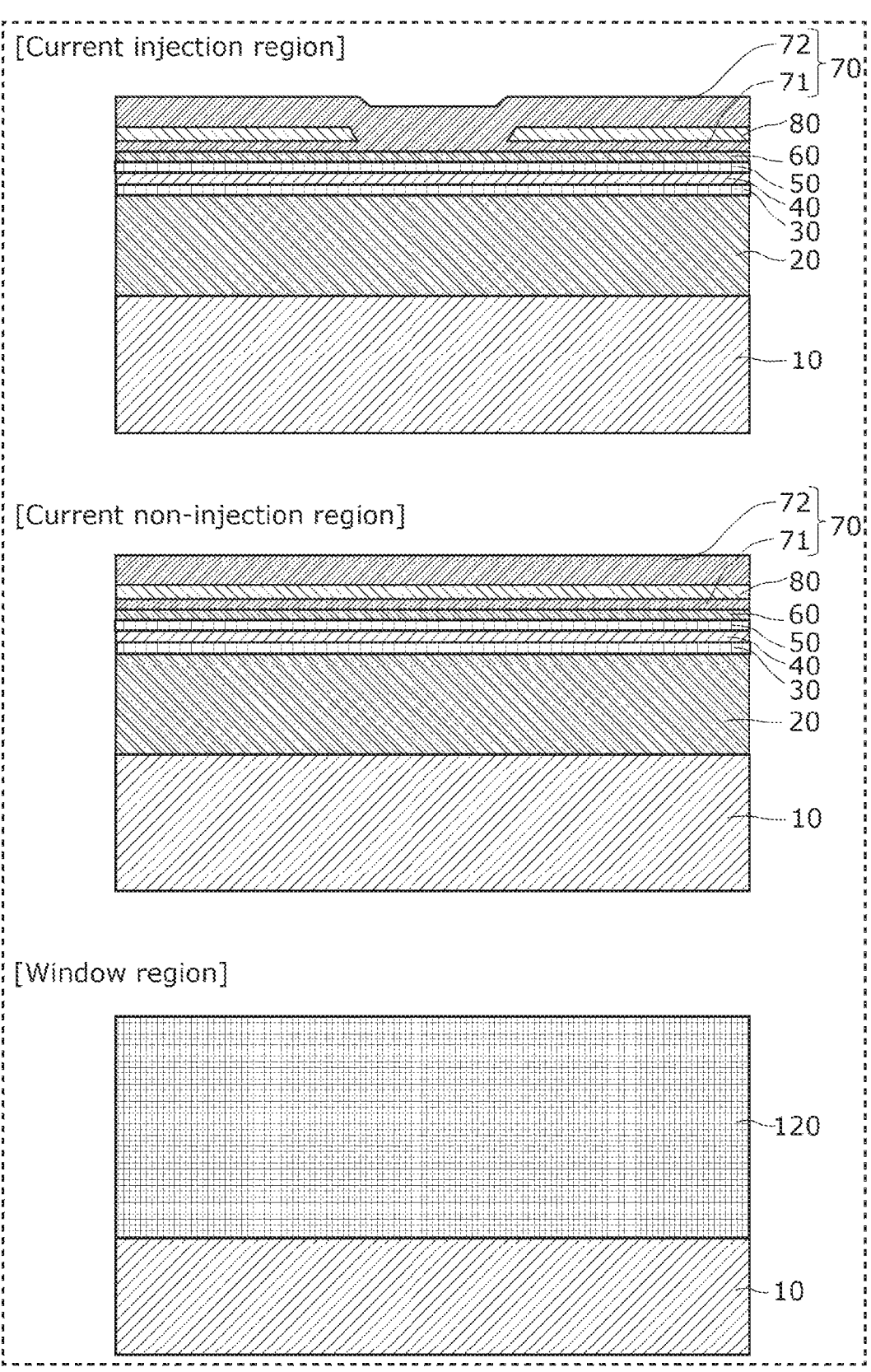
FIG. 3D is a diagram for illustrating a window region forming step in the method of manufacturing the semiconductor laser device according to the embodiment.

Next, as shown in FIG. 3D, window region 120 is formed in a portion corresponding to an end face portion of a semiconductor stacked body, which includes the semiconductor layers, in the resonator length direction. Specifically, window region 120 is formed in a portion corresponding to an end face portion of the semiconductor stacked body on the front end face 1a side. In the present embodiment, window region 120 is formed in a portion corresponding to the vicinity of front end face 1a in portions of P-type contact layer 70, P-type cladding layer 60, P-type guiding layer 50, active layer 40, N-type guiding layer 30, N-type cladding layer 20, and substrate 10. It should be noted that although window region 120 is formed by vacancy diffusion, the present embodiment is not limited to this example.

Figure 3E:
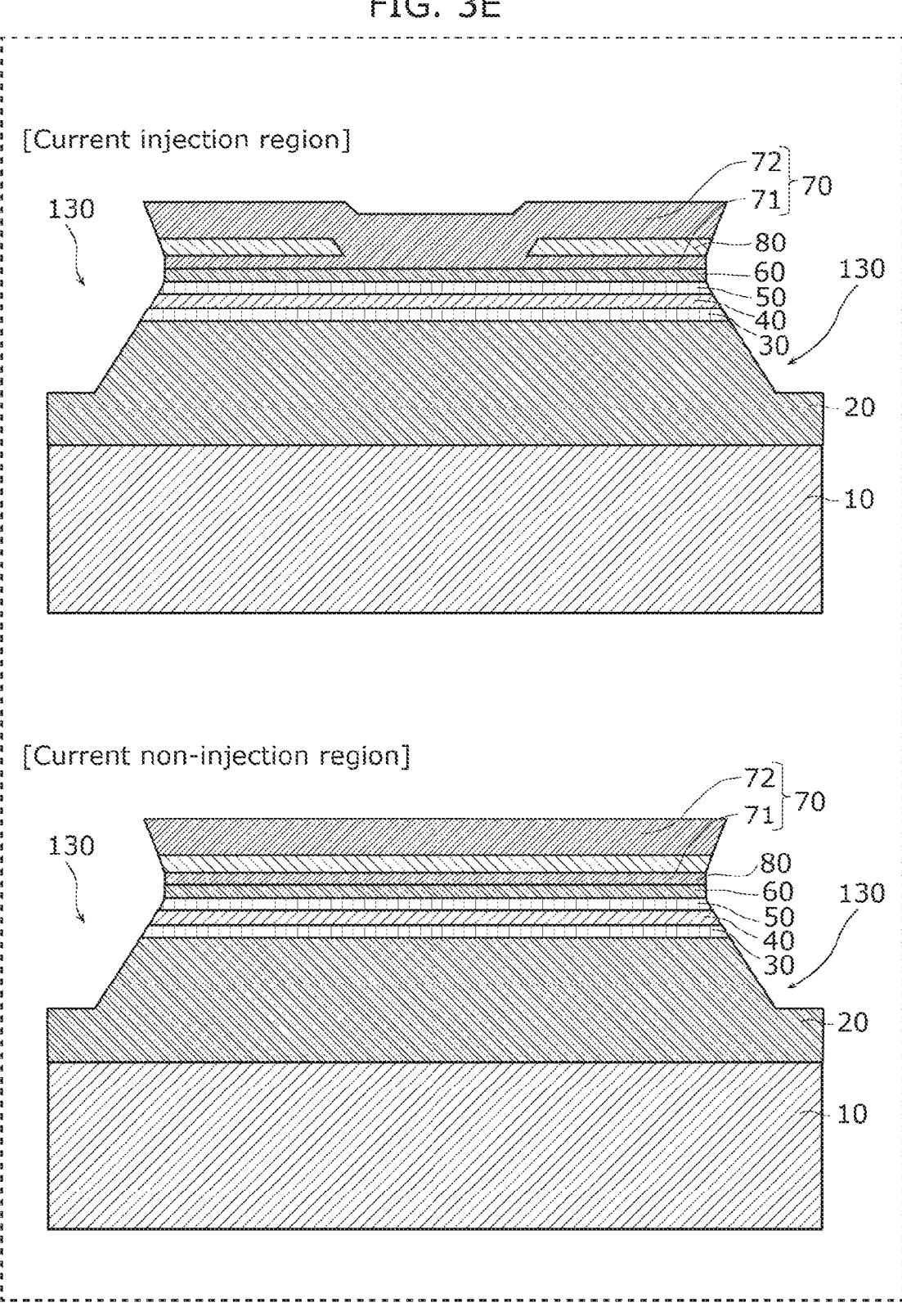
FIG. 3E is a diagram for illustrating a groove forming step in the method of manufacturing the semiconductor laser device according to the embodiment.

Next, as shown in FIG. 3E, groove 130 having inclined surfaces is formed to a lateral surface of the semiconductor stacked body. Specifically, after a mask comprising SiO₂ etc. is formed in a predetermined pattern on P-type contact layer 70 using the photolithography technique, groove 130 inclined on the lateral surface of the semiconductor stacked body can be formed by etching a surface from P-type contact layer 70 to a portion of N-type cladding layer 20 using the wet etching technique. Groove 130 is an isolation groove when semiconductor laser device 1 is obtained by dicing a wafer, and extends in the resonator length direction in a top view.

It should be noted that examples of etchant when groove 130 is formed include sulfuric acid-based etchant. In this case, etchant having a 1:1:10 composition of sulfuric acid, hydrogen peroxide water, and water by volume can be used. In addition, etchant is not limited to sulfuric acid-based etchant, and organic acid-based etchant or ammonia-based etchant may be used.

Moreover, groove 130 is formed by isotropic wet etching. This makes it possible to form a constricted structure (i.e., an overhung structure) to the semiconductor layers by forming the inclined surfaces to the lateral surfaces of the semiconductor layers. The inclination angle of each lateral surface of groove 130 changes with an Al composition ratio of an AlGaAs material of a corresponding one of the semiconductor layers. In this case, increasing the Al composition of the AlGaAs material makes it possible to increase an etching rate. For this reason, in order to form the lateral surfaces having such inclinations as shown in FIG. 3E to the semiconductor layers, an etching rate in the lateral direction (horizontal direction) can be set to highest by making an Al composition ratio of P-type cladding layer 60 highest. As a result, it is possible to form a narrowest portion of the semiconductor layers (a narrowest portion in the horizontal direction) close to P-type cladding layer 60.

Figure 3F:
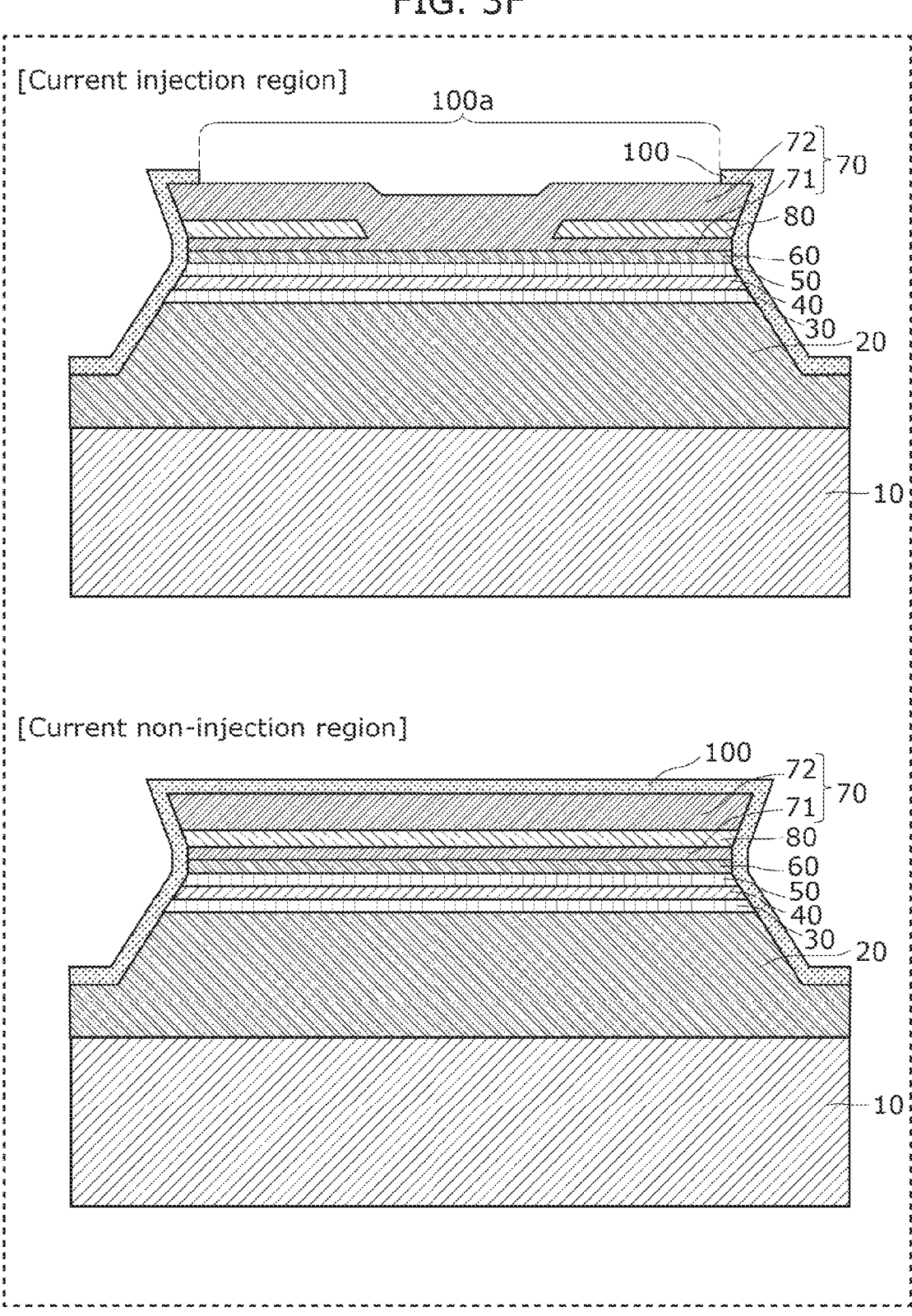
FIG. 3F is a diagram for illustrating an insulating film forming step in the method of manufacturing the semiconductor laser device according to the embodiment.

Next, as shown in FIG. 3F, after a mask when groove 130 is formed is removed by hydrofluoric acid-based etchant, a SiN film is deposited as insulating film 100 on the entire surface of substrate 10, and then opening 100a is formed by removing a portion of insulating film 100 corresponding to the current injection region using the photolithography technique and the etching technique. It should be noted that a portion of insulating film 100 corresponding to the current non-injection region is not removed, and opening 100a is not formed in the portion corresponding to the current non-injection region.

The etching of insulating film 100 may be wet etching using hydrofluoric acid-based etchant or drying etching based on reactive-ion etching. Moreover, although insulating film 100 is a SiN film, the present embodiment is not limited to this example, and insulating film 100 may be an $SiO_2$ film.

Figure 3G:
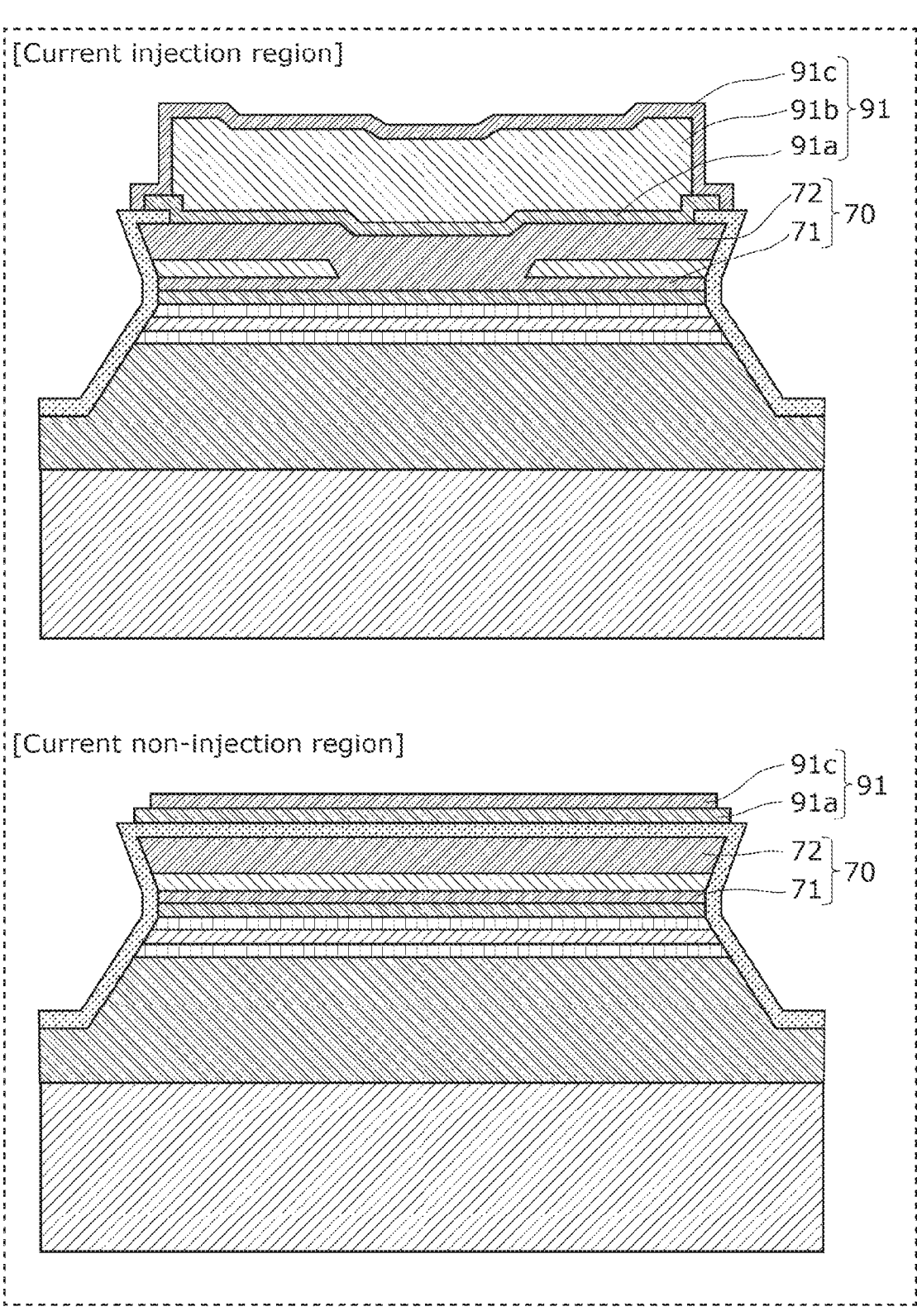
FIG. 3G is a diagram for illustrating a P-side electrode forming step in the method of manufacturing the semiconductor laser device according to the embodiment.

Next, as shown in FIG. 3G, P-side electrode 91 is formed on the semiconductor stacked body. In the present embodiment, first P electrode layer 91a, plated layer 91b, and second P electrode layer 91c are formed in stated order as P-side electrode 91 on P-type contact layer 70.

Specifically, first P electrode layer 91a including a stacked film composed of a Ti film and a Pt film is formed as a base electrode using an electron beam deposition method, and then plated layer 91b including an Au plated film is formed using an electrolytic plating method. After that, a portion of plated layer 91b corresponding to the current non-injection region is removed by selective etching using the photolithography technique and a lift-off technique. In this case, iodine solution can be used as etchant for etching plated layer 91b including the Au plated film. In the present embodiment, in order to make etching stable, the etching is further performed in a bubbling state using iodine solution having a 289:490:3500 composition of iodine, potassium iodine, and water by weight. Subsequently, second P electrode layer 91c including a stacked film composed of a Ti film, a Pt film, and an Au film is formed on plated layer 91b using the electron beam deposition method. As described above, although first P electrode layer 91a and second P electrode layer 91c are formed over substantially the entire length of the semiconductor stacked body in the resonator length direction, plated layer 91b is not formed in the current non-injection region.

Figure 3H:
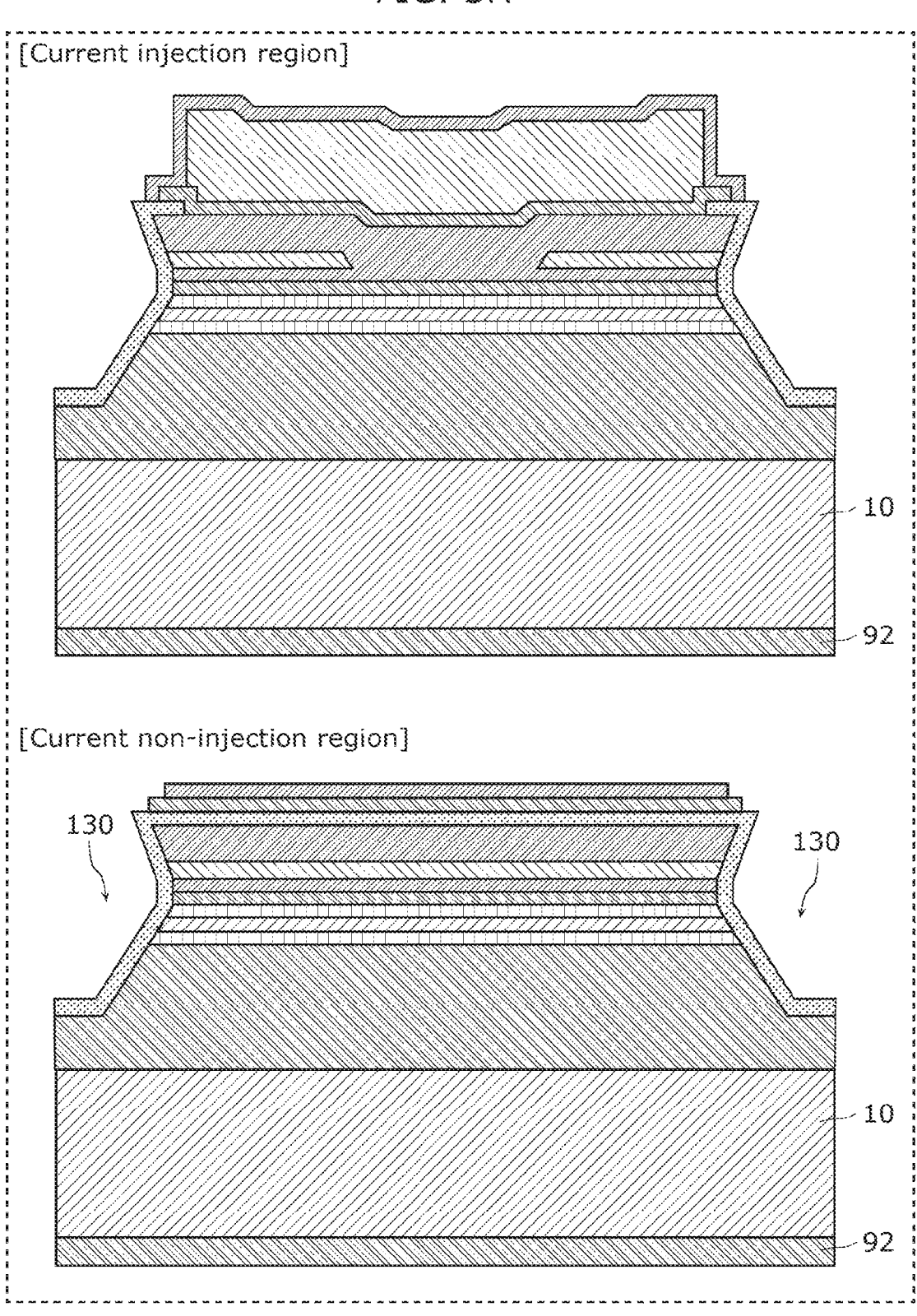
FIG. 3H is a diagram for illustrating an N-side electrode forming step in the method of manufacturing the semiconductor laser device according to the embodiment.

Next, as shown in FIG. 3H, N-side electrode 92 is formed on the lower surface of substrate 10. Specifically, N-side electrode 92 is formed by sequentially forming an AuGe film, an Ni film, an Au film, a Ti film, a Pt film, and an Au film from the substrate 10 side.

Finally, though not shown in the figure, substrate 10 on which the semiconductor stacked body is formed is separated into bars by dicing, cleaving, etc. using a blade, and then chip separation is performed by cutting groove 130 as a cut area. Accordingly, it is possible to manufacture semiconductor laser device 1 in a shape resulting from dicing.

[Composition and Band Structure of Semiconductor Layer]

Next, specific examples of semiconductor laser device 1 according to the present embodiment will be described.

FIG. 4 is a diagram showing, with regard to semiconductor laser device 1 according to the embodiment, specific examples of a composition, thickness, and impurity concentration of each semiconductor layer in Working Example 1, Working Example 2, and Working Example 3.

Each semiconductor layer of the semiconductor stacked body in semiconductor laser device 1 according to the present embodiment includes a III-V group compound semiconductor comprising an AlGaInAs-based material, and is represented by a composition formula of $Al_XGa_{1-X-Y}In_YAs$, where X denotes an Al composition, Y denotes an In composition, $0<X<1$, and $0<Y<1$.

In FIG. 4, an Al composition and an In composition of N-type cladding layer 20 are denoted by $X_{NC}$ and $Y_{NC}$; an Al composition and an In composition of N-type guiding layer 30 are denoted by $X_{NG}$ and $Y_{NG}$; an Al composition and an In composition of N-side second barrier layer 42b in active layer 40 are denoted by $X_{NB2}$ and $Y_{NB2}$; an Al composition and an In composition of N-side first barrier layer 42a in active layer 40 are denoted by $X_{NB1}$ and $Y_{NB1}$; an Al composition and an In composition of well layer 41 in active layer 40 are denoted by $X_W$ and $Y_W$; an Al composition and an In composition of P-side first barrier layer 43a in active layer 40 are denoted by $X_{PB1}$ and $Y_{PB1}$; an Al composition and an In composition of P-side second barrier layer 43b in active layer 40 are denoted by $X_{PB2}$ and $Y_{PB2}$; an Al composition and an In composition of P-type guiding layer 50 are denoted by $X_{PG}$ and $Y_{PG}$; and an Al composition and an In composition of P-type cladding layer 60 are denoted by $X_{PC}$ and $Y_{PC}$. It should be noted that FIG. 4 shows conditions for obtaining laser light in a wavelength band of 915 nm.

As shown in FIG. 4, in active layer 40 in semiconductor laser device 1 according to the present embodiment, N-side second barrier layer 42b has an Al composition ratio higher than an Al composition ratio of N-side first barrier layer 42a, and P-side second barrier layer 43b has an Al composition ratio higher than an Al composition ratio of P-side first barrier layer 43a.

Moreover, in semiconductor laser device 1 according to the present embodiment, the Al compositions change in an interface region between N-type cladding layer 20 and N-type guiding layer 30 and an interface region between P-type guiding layer 50 and P-type cladding layer 60. Specifically, the Al composition at least in the interface region between N-type cladding layer 20 and N-type guiding layer 30 gradually increases with distance from well layer 41. Similarly, the Al composition at least in the interface region between P-type guiding layer 50 and P-type cladding layer 60 gradually increases with distance from well layer 41.

Next, an impurity concentration profile and a band structure of the semiconductor stacked body in semiconductor laser device 1 in each of Working Examples 1 to 3 shown in FIG. 4 will be described with reference to FIG. 5A to FIG. 5C.

Figure 5A:
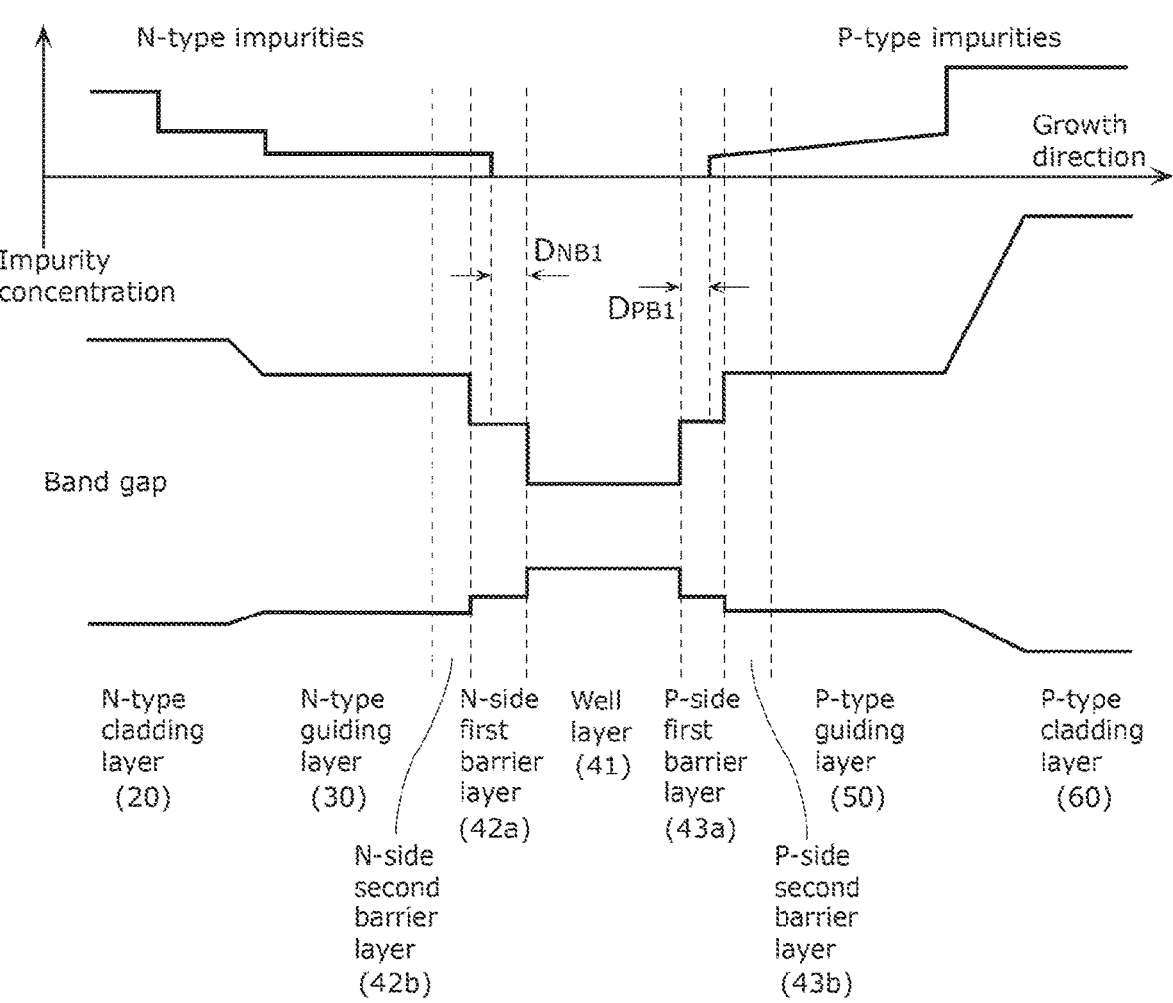
FIG. 5A is a diagram illustrating an impurity concentration profile and a band structure of a semiconductor stacked body in a semiconductor laser device in Working Example 1.

FIG. 5A is a diagram illustrating an impurity concentration profile and a band structure of the semiconductor stacked body in semiconductor laser device 1 in Working Example 1.

Figure 5B:
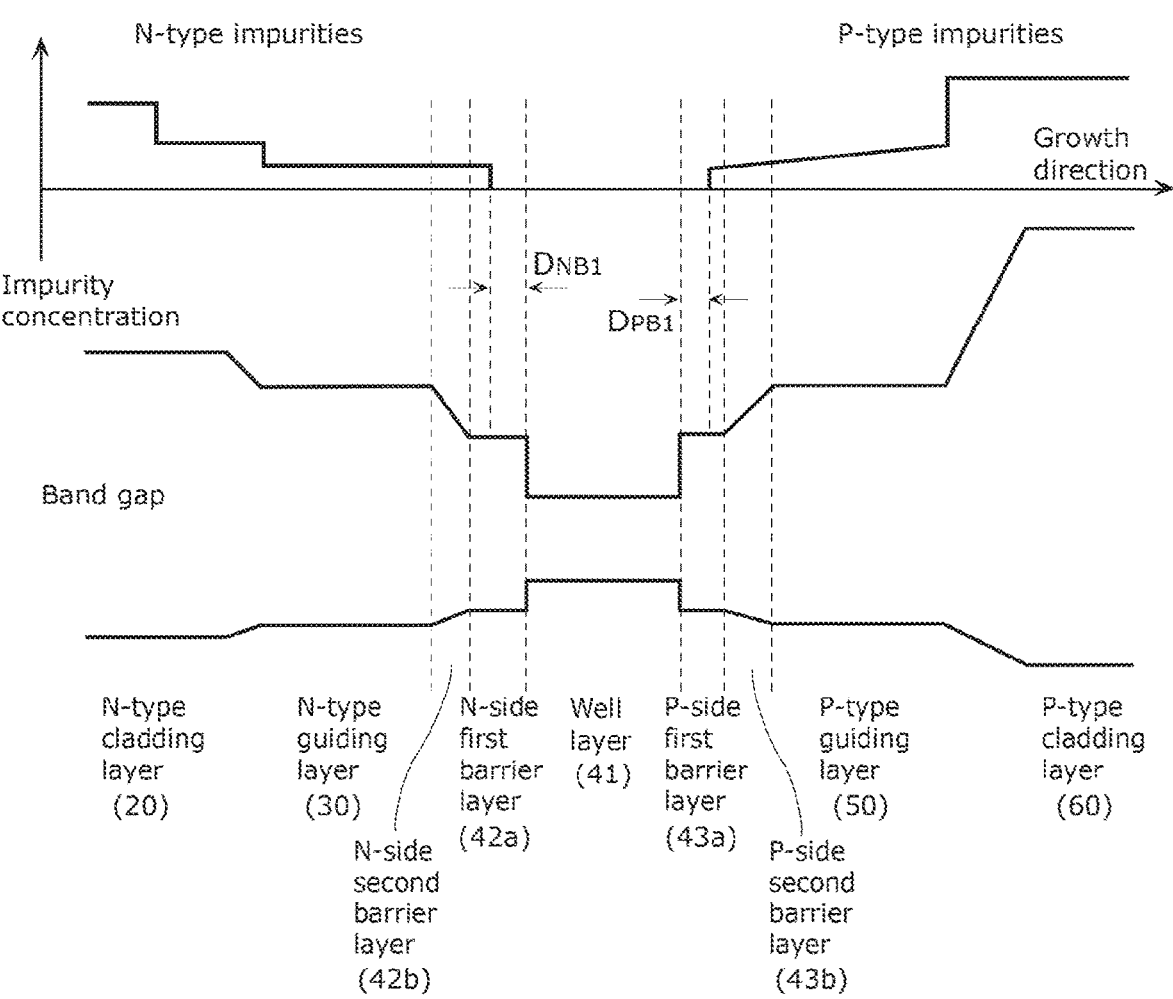
FIG. 5B is a diagram illustrating an impurity concentration profile and a band structure of a semiconductor stacked body in a semiconductor laser device in Working Example 2.

FIG. 5B is a diagram illustrating an impurity concentration profile and a band structure of the semiconductor stacked body in semiconductor laser device 1 in Working Example 2.

Figure 5C:
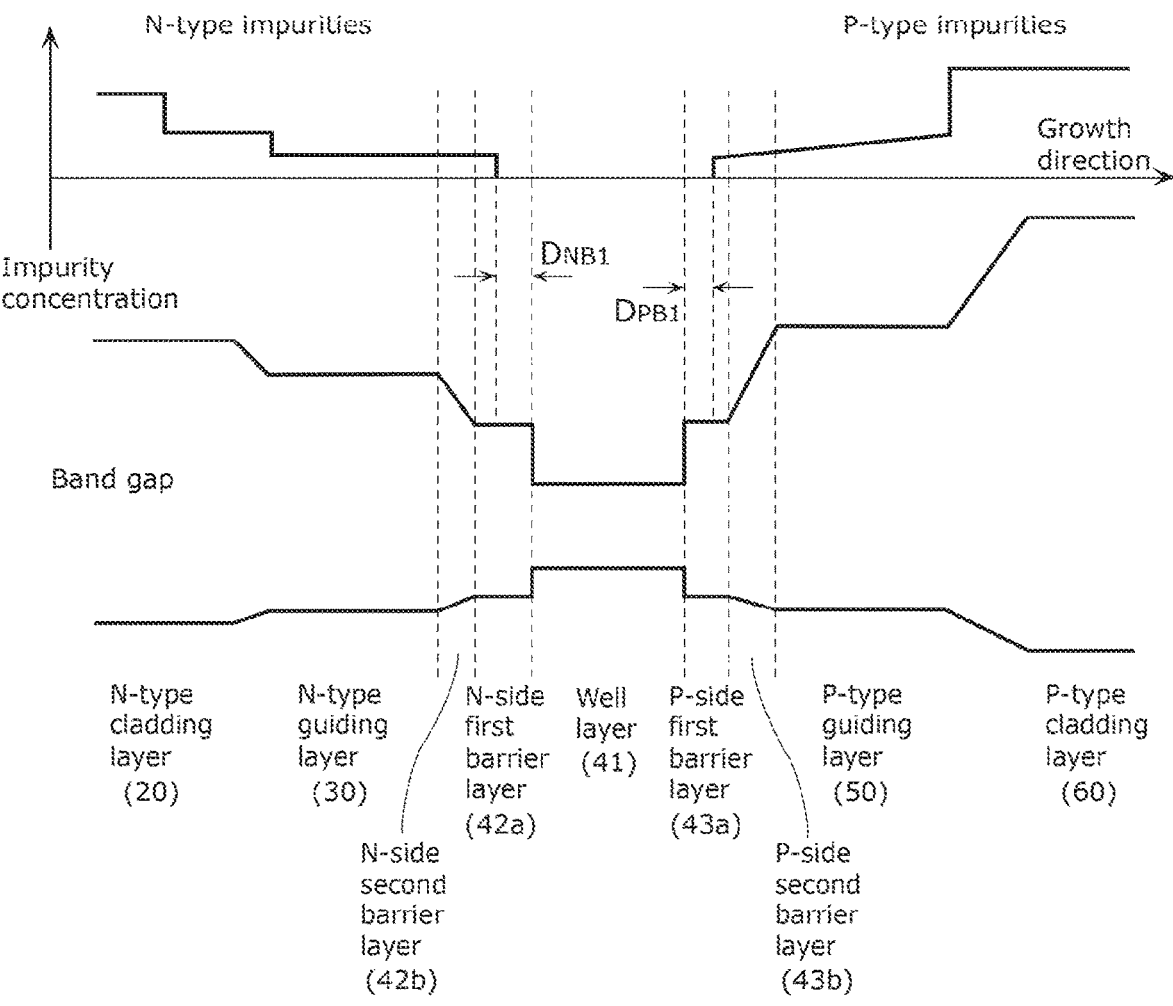
FIG. 5C is a diagram illustrating an impurity concentration profile and a band structure of a semiconductor stacked body in a semiconductor laser device in Working Example 3.

FIG. 5C is a diagram illustrating an impurity concentration profile and a band structure of the semiconductor stacked body in semiconductor laser device 1 in Working Example 3.

It should be noted that in each of FIG. 5A to FIG. 5C, $D_{NB1}$ indicates the length of an undoped region in N-side first barrier layer 42a, and $D_{PB1}$ indicates the length of an undoped region in P-side first barrier layer 43a.

As shown in FIG. 5A to FIG. 5C, in semiconductor laser device 1 according to the present embodiment in any one of Working Example 1 to Working Example 3, a concentration of impurities with which each of N-type cladding layer 20, N-type guiding layer 30, N-side second barrier layer 42b, and N-side first barrier layer 42a is doped increases in stages with distance from well layer 41. In other words, the impurity concentration increases in stages with distance from well layer 41, in order of N-side first barrier layer 42*a*, N-side second barrier layer 42*b*, N-type guiding layer 30, and N-type cladding layer 20. Moreover, in the present embodiment, the impurity concentration is constant in each of N-side first barrier layer 42*a*, N-side second barrier layer 42*b*, N-type guiding layer 30, and N-type cladding layer 20.

It should be noted that the concentration of the impurities with which each of N-type cladding layer 20, N-type guiding layer 30, N-side second barrier layer 42*b*, and N-side first barrier layer 42*a* is doped may gradually increase with distance from well layer 41 (i.e., increase aslope), instead of increasing in stages.

On the other hand, a concentration of impurities with which the interface region between P-type cladding layer 60 and P-type guiding layer 50 is doped is constant at $2 \times 10^{18}$ cm$^{-3}$. An impurity concentration of P-type cladding layer 60 may be caused to increase in stages or continuously increase in a direction away from well layer 41. Since the intensity of vertical-direction light-distribution of guided light attenuates in a region of P-type cladding layer 60 on a side far from well layer 41, the region may be doped with impurities at a higher impurity concentration. In the region, the occurrence of free carrier absorption loss caused by impurities due to a low light-distributed intensity is low, and a resistance value decreases due to an increase in impurity concentration, so it is possible to reduce the series resistance of semiconductor laser device 1 without causing waveguide loss to increase. Specifically, a P-type impurity concentration of P-type cladding layer 60 may be caused to gradually increase so that an impurity concentration of a well layer 41 side is $2 \times 10^{18}$ cm$^{-3}$, and an impurity concentration of a portion farthest from well layer 41 is $5 \times 10^{18}$ cm$^{-3}$, or may be caused to increase in stages so that an impurity concentration increases in the direction away from well layer 41. Here, if an Al composition of P-type cladding layer 60 is at least two times higher than an Al composition of P-type guiding layer 50, a light-distributed intensity in a direction perpendicular to a substrate normal direction rapidly attenuates from P-type guiding layer 50 toward P-type cladding layer 60 because a difference in refractive index between P-type cladding layer 60 and P-type guiding layer 50 is large. In this case, in order to reduce the series resistance of semiconductor laser device 1 while reducing an increase in waveguide loss due to the occurrence of free carrier loss caused by impurity doping, an impurity concentration may be caused to continuously increase from well layer 41 toward P-type cladding layer 60. It is because this method reduces an increase in waveguide loss while producing effects of reducing an increase in waveguide loss because an impurity concentration is low in a region having a high light-distributed intensity, and reducing the series resistance of semiconductor laser device 1 because an impurity concentration is high in a region having a low light-distributed intensity.

A concentration of impurities with which each of P-type guiding layer 50, P-side second barrier layer 43*b*, and P-side first barrier layer 43*a* is doped gradually increases with distance from well layer 41 (i.e., increases aslope). In the structures described in Working Example 1 to Working Example 3, an impurity concentration is caused to continuously increase so that a P-type impurity concentration changes from $2 \times 10^{17}$ cm$^{-3}$ to $5 \times 10^{17}$ cm$^{-3}$. Moreover, the concentration of the impurities with which the interface region between P-type cladding layer 60 and p-type guiding layer 50 is doped may be caused to continuously increase from $5 \times 10^{17}$ cm$^{-3}$ to $2 \times 10^{18}$ cm$^{-3}$. In this case, it is possible to reduce an increase in waveguide loss caused by free carrier absorption loss that occurs due to impurity doping in the interface region between P-type cladding layer 60 and P-type guiding layer 50.

As shown in FIG. 5A to FIG. 5C, N-side first barrier layer 42*a* includes an undoped region doped with no impurities in a region on a side close to well layer 41, and a doped region doped with impurities in a region on a side far from well layer 41. In the present embodiment, the undoped region of N-side first barrier layer 42*a* has a thickness of 5 nm.

On the other hand, the entire region of N-side second barrier layer 42*b* is doped with impurities. In other words, N-side second barrier layer 42*b* is completely doped with impurities in a thickness direction by intention. The impurity concentration of N-side second barrier layer 42*b* is the same as the impurity concentration of the doped region of N-side first barrier layer 42*a*.

Likewise, P-side first barrier layer 43*a* includes an undoped region doped with no impurities in a region on the side close to well layer 41, and a doped region doped with impurities in a region on the side far from well layer 41. In the present embodiment, the undoped region of P-side first barrier layer 43*a* has a thickness of 5 nm.

In contrast, the entire region of P-side second barrier layer 43*b* is doped with impurities. In other words, P-side second barrier layer 43*b* is completely doped with impurities in a thickness direction by intention.

With regard to the band gap energy in each working example, as shown in FIG. 5A to FIG. 5C, in an N-side semiconductor region of active layer 40, band gap energy of N-side second barrier layer 42*b* is greater than band gap energy of N-side first barrier layer 42*a*. Similarly, in a P-side semiconductor region of active layer 40, band gap energy of P-side second barrier layer 43*b* is greater than band gap energy of P-side first barrier layer 43*a*.

Moreover, band gap energy of P-type cladding layer 60 is greater than band gap energy of N-type cladding layer 20.

As described above, semiconductor laser device 1 has the end face window structure in which window region 120 is provided. Specifically, semiconductor laser device 1 has the end face window structure in which band gap energy of well layer 41 in the vicinity of front end face 1*a* is greater than band gap energy of the central portion of well layer 41 in the resonator length direction of semiconductor laser device 1.

It should be noted that although the band gap energy of N-side second barrier layer 42*b* is constant in FIG. 5A, the present embodiment is not limited to this example. For example, as shown in FIG. 5B, the band gap energy of N-side second barrier layer 42*b* may gradually increase with distance from well layer 41. This feature makes it possible to reduce the formation of heterostructure spikes or notches in a conduction band or a valance band formed in an interface between N-side first barrier layer 42*a* and N-side second barrier layer 42*b*, and to reduce operating voltage.

Likewise, although the band gap energy of P-side second barrier layer 43*b* is constant in FIG. 5A, the present embodiment is not limited to this example. For example, the band gap energy of P-side second barrier layer 43*b* may gradually increase with distance from well layer 41. This feature makes it possible to reduce the formation of heterostructure spikes or notches in a conduction band or a valance band formed in an interface between P-side first barrier layer 43*a* and P-side second barrier layer 43*b*, and to reduce operating voltage.

Moreover, although band gap energy of P-type guiding layer 50 is the same as band gap energy of N-type guiding layer 30 in FIG. 5A and FIG. 5B, the present embodiment is not limited to this example. To put it another way, N-type guiding layer 30 and P-type guiding layer 50 may be asymmetry in terms of composition. For example, as shown in FIG. 5C, if the band gap energy of P-type guiding layer 50 is greater than the band gap energy of N-type guiding layer 30, it is possible to reduce the occurrence of current leaking to P-type guiding layer 50 by electrons injected into well layer 41 being excited by heat. Moreover, since N-type guiding layer 30 has a refractive index higher than a refractive index of P-type guiding layer 50, it is possible to cause a light distribution of a waveguide in the direction perpendicular to the substrate normal direction to be lean to an N-type layer. In this case, it is possible to control the light distribution in the perpendicular direction precisely by controlling a difference in Al composition between N-type guiding layer 30 and P-type guiding layer 50. As a result, it is possible to reproducibly obtain a semiconductor laser device that has superior temperature characteristics and is capable of performing a high-temperature high-output operation while reducing waveguide loss. If P-type guiding layer 50 has an excessively high Al composition with regard to the difference in Al composition between N-type guiding layer 30 and P-type guiding layer 50, the light distribution in the perpendicular direction is caused to be excessively lean to the N-type layer. In consequence, a factor for confining light to well layer 41 decreases, which causes an increase in oscillation threshold current value. Accordingly, with regard to the difference in Al composition between N-type guiding layer 30 and P-type guiding layer 50, the Al composition of P-type guiding layer 50 may be made relatively higher, and the difference may be at most 0.05.

Furthermore, if the band gap energy of P-type guiding layer 50 is less than the band gap energy of N-type guiding layer 30, it is possible to cause the light distribution of the waveguide in the direction perpendicular to the substrate normal direction to be lean to a P side by causing the refractive index of N-type guiding layer 30 to be lower than the refractive index of P-type guiding layer 50. As a result, it is possible to obtain a high factor for confining light to well layer 41, and to obtain a semiconductor laser device that has superior temperature characteristics and is capable of performing a high-temperature high-output operation while reducing oscillation threshold current. If N-type guiding layer 30 has an excessively high Al composition with regard to the difference in Al composition between N-type guiding layer 30 and P-type guiding layer 50, the light distribution in the perpendicular direction is caused to be excessively lean to the P-type layer. Consequently, waveguide loss increases, which causes an increase in oscillation threshold current and a decrease in slope efficiency. Accordingly, with regard to the difference in Al composition between N-type guiding layer 30 and P-type guiding layer 50, the Al composition of N-type guiding layer 30 may be made relatively higher, and the difference may be at most 0.04.

Moreover, although the maximum value of the band gap energy of P-side second barrier layer 43b is the same as the maximum value of the band gap energy of N-side second barrier layer 42b in FIG. 5A and FIG. 5B, the present embodiment is not limited to this example. For example, the maximum value of the band gap energy of P-side second barrier layer 43b may be greater than the maximum value of the band gap energy of N-side second barrier layer 42b. This feature makes it possible to reduce the occurrence of current leaking to P-type guiding layer 50 by electrons injected into well layer 41 being excited by heat. Additionally, since N-type guiding layer 30 has the refractive index higher than the refractive index of P-type guiding layer 50, it is possible to cause the light distribution of the waveguide in the direction perpendicular to the substrate normal direction to be lean to the N-type layer. In this case, it is possible to control the light distribution in the perpendicular direction precisely by controlling the Al compositions of N-side second barrier layer 42b, N-type guiding layer 30, P-side second barrier layer 43b, and P-type guiding layer 50. As a result, it is possible to reproducibly obtain a semiconductor laser device that has superior temperature characteristics and is capable of performing a high-temperature high-output operation. If P-side second barrier layer 43b has an excessively high Al composition with regard to the difference in Al composition between the maximum value of the Al composition of P-side second barrier layer 43b and the maximum value of the Al composition of N-side second barrier layer 42b, the light distribution in the perpendicular direction is caused to be excessively lean to the N-type layer. In consequence, a factor for confining light to well layer 41 decreases, which causes an increase in oscillation threshold current value. Accordingly, with regard to the difference in Al composition between the maximum value of the Al composition of P-side second barrier layer 43b and the maximum value of the Al composition of N-side second barrier layer 42b, the maximum value of the Al composition of P-side second barrier layer 43b may be made relatively higher, and the difference may be at most 0.05.

Furthermore, the maximum value of the band gap energy of P-side second barrier layer 43b may be less than the maximum value of the band gap energy of N-side second barrier layer 42b. In this case, the band gap energy of P-type guiding layer 50 becomes less than the band gap energy of N-type guiding layer 30. If the band gap energy of P-type guiding layer 50 is less than the band gap energy of N-type guiding layer 30, it is possible to cause the light distribution of the waveguide in the direction perpendicular to the substrate normal direction to be lean to a P side by causing the refractive index of N-type guiding layer 30 to be lower than the refractive index of P-type guiding layer 50. As a result, it is possible to obtain a high factor for confining light to well layer 41, and to obtain a semiconductor laser device that has superior temperature characteristics and is capable of performing a high-temperature high-output operation while reducing oscillation threshold current. If N-type guiding layer 30 has an excessively high Al composition with regard to the difference in Al composition between N-type guiding layer 30 and P-type guiding layer 50, the light distribution in the perpendicular direction is caused to be excessively lean to the P-type layer. Consequently, waveguide loss increases, which causes an increase in oscillation threshold current and a decrease in slope efficiency. Accordingly, with regard to the difference in Al composition between N-type guiding layer 30 and P-type guiding layer 50, the Al composition of N-type guiding layer 30 may be made relatively higher, and the difference may be at most 0.04. In other words, with regard to the difference in Al composition between the maximum value of the Al composition of N-side second barrier layer 42b and the maximum value of the Al composition of P-side second barrier layer 43b, the Al composition of N-side second barrier layer 42b may be made relatively higher, and the difference may be at most 0.04.

Figure 5D:
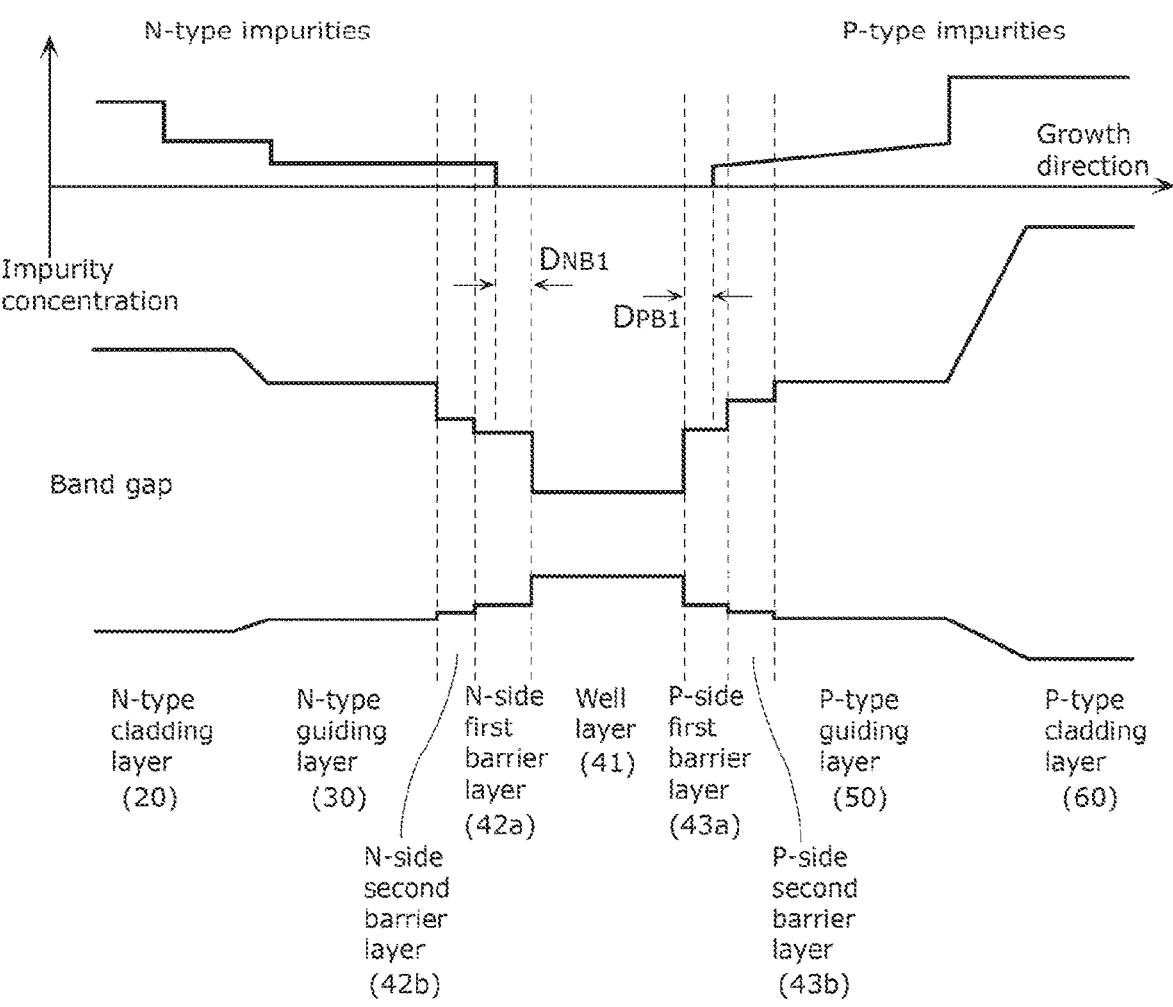
FIG. 5D is a diagram illustrating an impurity concentration profile and a band structure of a semiconductor stacked body in a semiconductor laser device in Working Example 4.

It should be noted that although the band gap energy of P-side guiding layer 50 is the same as the band gap energy of P-side second barrier layer 43b in FIG. 5A, the present embodiment is not limited to this example. For example, as shown in FIG. 5D, the band gap energy of P-type guiding layer 50 may be greater than the band gap energy of P-side second barrier layer 43b. This feature makes it possible to reduce the occurrence of electron current leaking to P-type guiding layer 50 by electrons injected into well layer 41 being excited by heat at the time of a high-temperature high-output operation. As a result, it is possible to obtain a semiconductor laser device that performs a superior high-temperature high-output operation.

Moreover, by causing the band gap energy of P-side second barrier layer 43*b* to be greater than the band gap energy of N-side second barrier layer 42*b*, it is possible to reduce the occurrence of the electron current leaking to P-type guiding layer 50 by the electrons injected into well layer 41 being excited by the heat at the time of the high-temperature high-output operation. As a result, it is possible to obtain a semiconductor laser device that performs a superior high-temperature high-output operation.

Furthermore, although the band gap energy of N-side first barrier layer 42*a* may be the same as the band gap energy of N-side second barrier layer 42*b*, the band gap energy of N-type guiding layer 30 may be greater than or equal to the band gap energy of N-side second barrier layer 42*b*. This feature makes the refractive indexes of N-side second barrier layer 42*b* and N-side first barrier layer 42*a* higher than or equal to the refractive index of N-type guiding layer 30, which allows a factor for confining light to well layer 41 to increase. As a result, an oscillation threshold value and leakage current at the time of a high-temperature high-output operation are reduced, and it is possible to obtain a semiconductor laser device that performs a superior high-temperature high-output operation.

Moreover, although the band gap energy of P-side first barrier layer 43*a* may be the same as the band gap energy of P-side second barrier layer 43*b*, the band gap energy of P-type guiding layer 50 may be greater than or equal to the band gap energy of P-side second barrier layer 43*b*. This feature makes the refractive indexes of P-side second barrier layer 43*b* and P-side first barrier layer 43*a* higher than or equal to the refractive index of P-type guiding layer 50, which allows a factor for confining light to well layer 41 to increase.

As a result, an oscillation threshold value and leakage current at the time of a high-temperature high-output operation are reduced, and it is possible to obtain a semiconductor laser device that performs a superior high-temperature high-output operation.

Figure 5E:
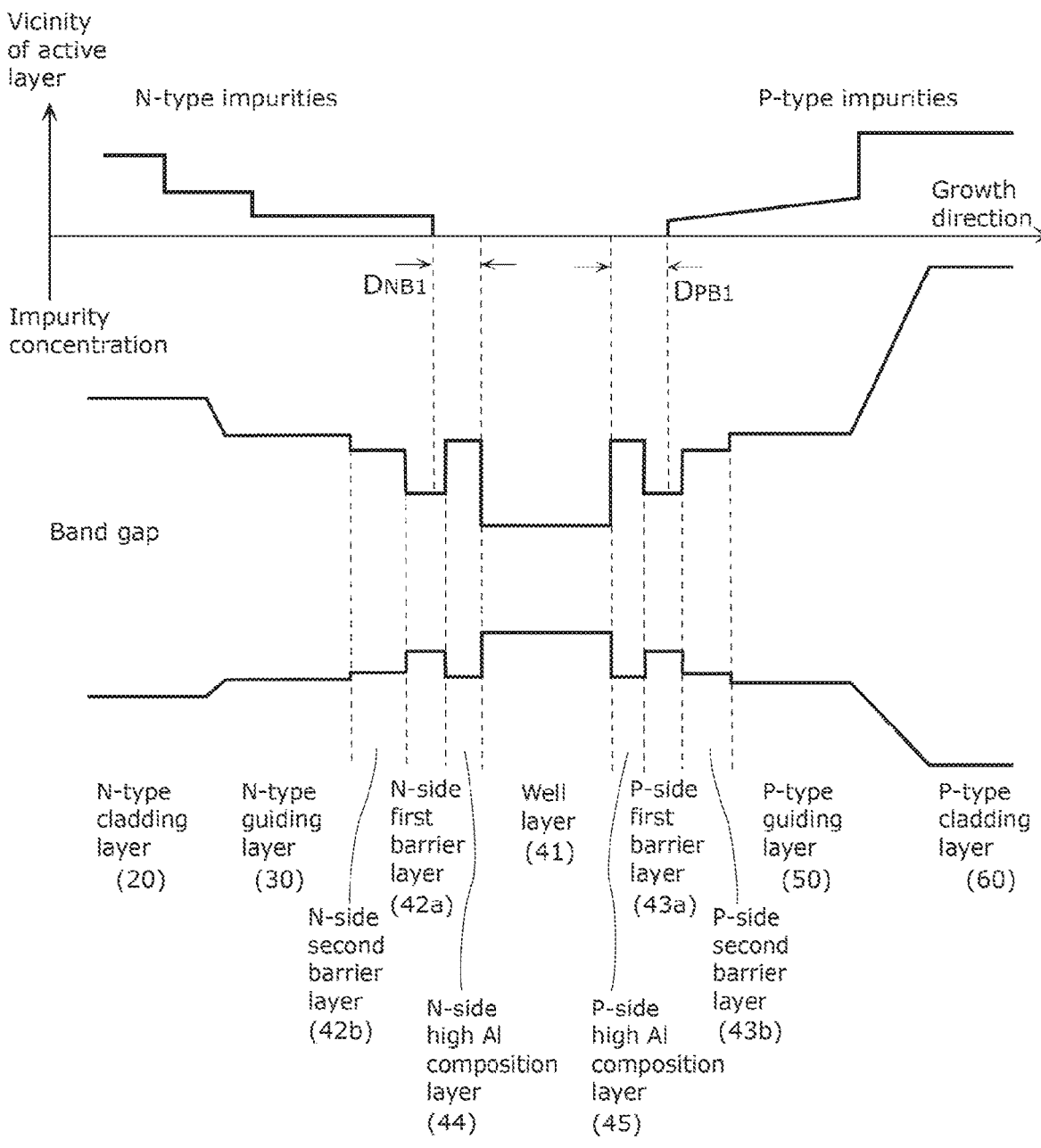
FIG. 5E is a diagram illustrating an impurity concentration profile and a band structure of a semiconductor stacked body in a semiconductor laser device in Working Example 5.

FIG. 5E shows an impurity concentration profile and a band structure of a semiconductor stacked body in a semiconductor laser device in Working Example 5 that includes, in the structure of the semiconductor laser device shown in Working Example 1, both N-side high Al composition layer 44 between N-side first barrier layer 42*a* and well layer 41 and P-side high Al composition layer 45 between P-side first barrier layer 43*a* and well layer 41, N-side high Al composition layer 44 having a higher Al composition than N-side first barrier layer 42*a* does, P-side high Al composition layer 45 having a higher Al composition than P-side first barrier layer 43*a* does. It should be noted that both N-side high Al composition layer 44 and P-side high Al composition layer 45 are included in Working Example 5 shown in FIG. 5E, at least only one of N-side high Al composition layer 44 or P-side high Al composition layer 45 may be included.

Since this structure increases differences in Al composition between well layer 41 and N-side high Al composition layer 44 and between well layer 41 and P-side high Al composition layer 45 at the time of forming a window by a thermal annealing step or ion injection if a window portion is formed by vacancy diffusion and impurity diffusion, band gap energy of the window portion in well layer 41 is likely to increase due to an interchange of atoms between the former layers and between the latter layers. For this reason, a different between the band gap energy of the window portion and band gap energy of a gain portion is likely to increase. Accordingly, even if well layer 41 is thick, it is possible to form window region 120 more easily.

If N-side high Al composition layer 44 and P-side high Al composition layer 45 decrease in thickness excessively, an effect of disordering a quantum well structure due to an interchange of atoms with well layer 41 is reduced, and an effect of increasing band gap energy of window region 120 in well layer 41 due to a window formation thermal annealing step is reduced. Conversely, if N-side high Al composition layer 44 and P-side high Al composition layer 45 increase in thickness excessively, a factor for confining light to well layer 41 decreases since N-side high Al composition layer 44 has a lower refractive index than N-side first barrier layer 42*a* does, and P-side high Al composition layer 45 has a lower refractive index than P-side first barrier layer 43*a* does. In addition, since band gap energy of N-side high Al composition layer 44 is greater than the band gap energy of N-side first barrier layer 42*a*, and band gap energy of P-side high Al composition layer 45 is greater than the band gap energy of P-side first barrier layer 43*a*, N-side high Al composition layer 44 prevents electrons from being injected into well layer 41, and P-side high Al composition layer 45 prevents holes from being injected into well layer 41. In consequence, operating voltage increases.

Accordingly, N-side high Al composition layer 44 and P-side high Al composition layer 45 may have a thickness of at least 3 nm and at most 10 nm.

Moreover, if Al compositions of N-side high Al composition layer 44 and P-side high Al composition layer 45 become too low, an effect of a disordering quantum well structure due to an interchange of atoms with well layer 41 is reduced, and an effect of increasing band gap energy of window region 120 in well layer 41 due to a window formation thermal annealing step is reduced. Conversely, if the Al compositions become too high, a factor for confining light to well layer 41 decreases since N-side high Al composition layer 44 has a lower refractive index than N-side first barrier layer 42*a* does, and P-side high Al composition layer 45 has a lower refractive index than P-side first barrier layer 43*a* does. In addition, since the band gap energy of N-side high Al composition layer 44 is greater than the band gap energy of N-side first barrier layer 42*a*, and the band gap energy of P-side high Al composition layer 45 is greater than the band gap energy of P-side first barrier layer 43*a*, N-side high Al composition layer 44 prevents electrons from being injected into well layer 41, and P-side high Al composition layer 45 prevents holes from being injected into well layer 41. In consequence, operating voltage increases.

Accordingly, N-side high Al composition layer 44 and P-side high Al composition layer 45 may have an Al composition of at least 0.27 and at most 0.35.

Including N-side high Al composition layer 44 and P-side high Al composition layer 45 makes it easy to increase the band gap energy of window region 120 in well layer 41 even if well layer 41 becomes thicker; and makes it possible to easily obtain a semiconductor laser device that has superior high-temperature operating characteristics and a high COD level.

Although an example is shown in which N-side high Al composition layer 44 and P-side high Al composition layer 45 are not doped with impurities in the structure shown in FIG. 5E, it is possible to reduce series resistance of the semiconductor laser device by doping N-side high Al composition layer 44 and P-side high Al composition layer 45 with N-type impurities and P-type impurities, respectively. Moreover, since potential energy of a valance band decreases if N-side high Al composition layer 44 is doped with the N-type impurities, it is possible to reduce leakage of hole current injected into well layer 41. Furthermore, since potential energy of a conduction band increases if P-side high Al composition layer 45 is doped with the P-type impurities, it is possible to reduce leakage of electron current injected into well layer 41. As a result, it is possible to reduce the occurrence of leakage current if a semiconductor laser device is caused to perform a high-temperature high-output operation, and it is possible to obtain the semiconductor laser device that has superior temperature characteristics. In order to allow the semiconductor laser device to achieve the reduction of series resistance and the improvement of temperature characteristics, N-side high Al composition layer 44 may be doped with the N-type impurities in a range from $1\times10^{17}$ cm$^{-3}$ to $1\times10^{18}$ cm$^{-3}$, and P-side high Al composition layer 45 may be doped with the P-type impurities in a range from $1\times10^{17}$ cm$^{-3}$ to $5\times10^{17}$ cm$^{-3}$.

N-side high Al composition layer 44 and P-side high Al composition layer 45 may each be an AlGaAs layer or an AlGaInAs layer. Using AlGaInAs for P-side high Al composition layer 45 makes it possible to increase potential energy of a conduction band while decreasing potential energy of a valance band of P-side first barrier layer 43a, and to form window region 120 easily while reducing the occurrence of electrons leaking from well layer 41 to a P-type layer side.

In particular, if N-side high Al composition layer 44 and P-side high Al composition layer 45 include AlGaInAs, it is possible to reduce a difference in potential energy of valence band between P-side first barrier layer 43a and P-side high Al composition layer 45 by causing an Al composition to be at least 0.3 and at most 0.45 and an In composition to be at least 0.05 and at most 0.15. Moreover, since the band gap energy of N-side high Al composition layer 44 decreases by causing N-side high Al composition layer 44 to contain In, it is possible to reduce a difference in potential energy of conduction band between N-side first barrier layer 42a and N-side high Al composition layer 44. As a result, compared to a case in which an AlGaAs layer having the same Al composition is used, injection of electrons and holes into well layer 41 is made easy, and operating voltage decreases. Furthermore, since a difference in Al composition between (i) well layer 41 and (ii) N-side high Al composition layer 44 and P-side high Al composition layer 45 increases, disordering of group III atomic arrangement is likely to occur due to atomic exchange by the window formation thermal annealing step or ion injection step for forming window region 120, and a difference in band gap energy between the window portion and the gain portion is likely to increase. Accordingly, it is possible to obtain a semiconductor laser device having a high COD level.

Moreover, if N-type guiding layer 30 is caused to be an AlGaInAs layer containing In and having an In composition of at least 0.02, it is possible to increase the refractive index of N-type guiding layer 30 slightly while reducing the occurrence of a lattice defect in N-type guiding layer 30, and it becomes easy to focus light on N-type guiding layer 30 in the light distribution in the perpendicular direction. For this reason, it is possible to improve controllability of a light distribution shape that is lean to the N-type layer. In this case, N-type guiding layer 30 may be formed of a superlattice of InGaAs and AlGaAs.

[Functions and Effects of Semiconductor Laser Device]

Figure 6:
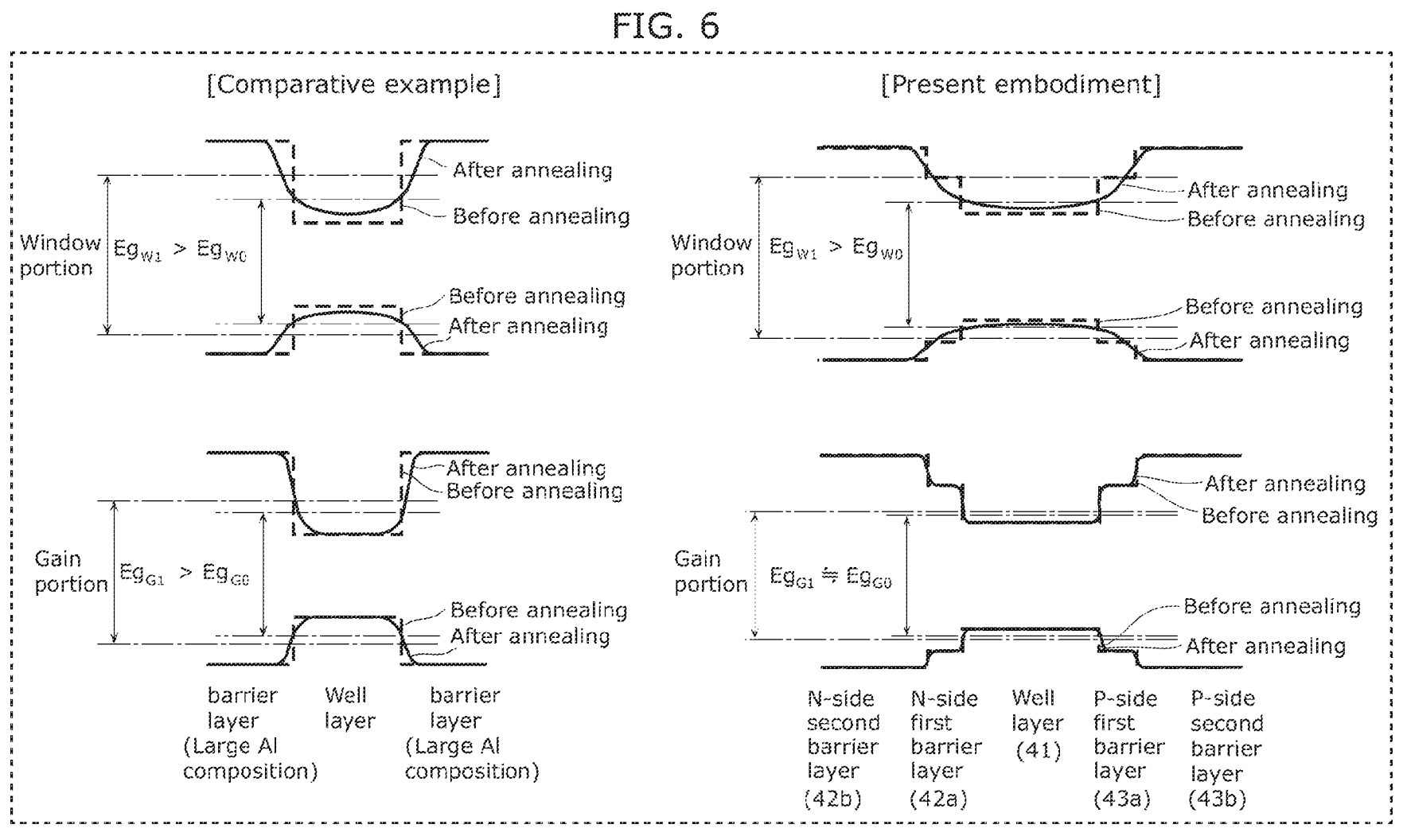

Next, functions and effects of semiconductor laser device 1 according to the present embodiment will be described with reference to FIG. 6. FIG. 6 is a diagram for illustrating the functions and effects of semiconductor laser device 1 according to the embodiment. FIG. 6 shows band structures before (dashed line) and after annealing (solid line) in a region (a window portion) for which the formation of a window region is intended and a region (a gain portion) for which the formation of a window region is not intended, in a semiconductor laser device having an end face window structure).

In FIG. 6, "Present embodiment" represents semiconductor laser device 1 according to the present embodiment.

Moreover, in FIG. 6, "Comparative example" represents a semiconductor laser device according to a comparative example. The semiconductor laser device according to the comparative example includes an active layer in which a well layer comprising InGaAs is disposed between an N-side barrier layer comprising AlGaAs and a P-side barrier layer comprising AlGaAs, and has a configuration in which a thermal saturation level is increased by increasing the Al compositions of the barrier layers in order to achieve high power.

In a semiconductor laser device, in order to achieve high power, a window region is formed in the vicinity of an end face, and a COD level is improved. It is possible to form the window region by disordering atomic arrangements of a barrier layer and a well layer in an end face portion using vacancy diffusion etc.

In a semiconductor laser device having an end face window structure, in order to achieve higher power, it is conceivable that an optical confinement factor is increased by increasing a well layer in thickness. However, if the well layer is increased in thickness, it becomes difficult to disorder atomic arrangements of a barrier layer and the well layer, which makes it difficult to form a window region. In view of this, it is conceivable that, by increasing an annealing temperature when the window region is formed, an interchange of atoms is promoted between the well layer and the barrier layer, and the atomic arrangements are disordered.

In this case, as shown in FIG. 6, it is possible to make band gap energy after annealing ($Eg_{W1}$) greater than band gap energy before annealing ($Eg_{W0}$) in the window portion for which the formation of the window region is intended. Accordingly, even if the well layer is thick, it is possible to form the window region.

However, the increase in annealing temperature when the window region is formed also causes an atomic exchange between the well layer and the barrier layer in an active layer in the gain portion for which the formation of the window region is not intended. As a result, the band gap energy after annealing ($Eg_{W1}$) is made greater than the band gap energy before annealing ($Eg_{W0}$) also in the gain portion. In other words, the band gap energy increases not only in the window portion but also in the gain portion. In consequence, temperature characteristics deteriorate due to an increase in leakage current in the gain portion, and long-term reliability decreases due to a decrease in oscillation wavelength controllability by diffusion of vacancies introduced at the time of crystal growth or diffusion of vacancies in the surface of a growth layer due to dangling bond of the surface of the growth layer being made easier.

On the other hand, in semiconductor laser device 1 according to the present embodiment, as described above, P-side first barrier layer 43a and P-side second barrier layer 43b are provided on one side of well layer 41, and the Al composition is caused to change at least in two stages. Specifically, the Al composition ratio of P-side second barrier layer 43b is caused to be relatively higher than the Al composition ratio of P-side first barrier layer 43a. To put it another way, the Al composition ratio of P-side first barrier layer 43a closer to well layer 41 is caused to be low, and the Al composition ratio of P-side second barrier layer 43b farther from well layer 41 is caused to be high. Additionally, in semiconductor laser device 1 according to the present embodiment, the band gap energy of P-side second barrier layer 43b is caused to be greater than the band gap energy of P-side first barrier layer 43a.

In this way, even if the annealing temperature when the window region is formed by increasing the well layer in thickness is increased, as shown in "Present embodiment" in FIG. 6, it is possible to make the band gap energy after annealing ($Eg_{G1}$) approximately equivalent to the band gap energy before annealing ($Eg_{G0}$) in the gain portion for which the formation of the window region is not intended, while making the band gap energy after annealing ($Eg_{W1}$) greater than the band gap energy before annealing ($Eg_{W0}$) in the window portion for which the formation of the window region is intended.

In other words, it is possible to increase the band gap energy in the window portion while reducing an increase in band gap energy by reducing a change of band gap energy before and after annealing in the gain portion. Accordingly, it is possible to prevent the semiconductor stacked body including active layer 40 from being made transparent in the gain portion while helping make the semiconductor stacked body including active layer 40 transparent in the window portion.

As just described, according to semiconductor laser device 1 according to the present embodiment, since P-side first barrier layer 43a having a low Al composition and a high refractive index is used, a factor for confining light to well layer 41 increases, and operating carrier density decreases. Moreover, even if the annealing temperature when the window region is formed is increased to form the window region by increasing the band gap energy of the window portion when well layer 41 is increased in thickness, since P-side first barrier layer 43a has the low Al composition, the band gap energy of well layer 41 in the gain portion is not susceptible to a change caused by impurity diffusion, and it is possible to reduce a wavelength change of well layer 41 in the gain portion due to the increase in band gap energy. As a result, it is possible to reduce a decrease in long-term reliability. Additionally, it is possible not only to reduce blocking of the effect of increasing a COD level but also to reduce a decrease in slope efficiency and a deterioration of temperature characteristics.

Therefore, according to semiconductor laser device 1 according to the present embodiment, in a semiconductor laser device having an end face window structure, even if well layer 41 is increased in thickness, it is possible to reduce the blocking of the effect of increasing a COD level while reducing the deterioration of the temperature characteristics and the decrease in the long-term reliability.

Moreover, in semiconductor laser device 1 according to the present embodiment, the band gap energy of P-type cladding layer 60 is greater than the band gap energy of N-type cladding layer 20.

Since this feature causes the refractive index of P-type cladding layer 60 to be lower than the refractive index of N-type cladding layer 20, the light distribution in the substrate perpendicular direction is caused to be lean to N-type cladding layer 20, and it is possible to reduce the waveguide loss in the optical waveguide. Accordingly, it is possible to achieve semiconductor laser device 1 that emits light highly efficiently.

Furthermore, if semiconductor laser device 1 is junction-down mounted (i.e., a portion on a P-side electrode 91 side far from substrate 10 is mounted on a submount), P-type cladding layer 60 becomes susceptible to the influence of mounting strain. On top of that, lattice misfit strain with substrate 10 is large due to the high Al composition, and the influence of the mounting strain grows. For this reason, if birefringence occurs and light propagating through the optical waveguide leaks more greatly toward P-type cladding layer 60 than toward the N-type cladding layer 20 side, a polarization ratio decreases.

At this time, by causing the band gap energy of P-type cladding layer 60 to be greater than the band gap energy of N-type cladding layer 20, the light distribution in the substrate perpendicular direction is caused to be lean to N-type cladding layer 20, and it is possible to decrease a ratio of light in P-type cladding layer 60. As a result, it is also possible to reduce a decrease in polarization ratio.

Moreover, in semiconductor laser device 1 according to the present embodiment, well layer 41 has a thickness of at least 6 nm.

Since it is possible to significantly increase the factor for confining light to well layer 41 by causing well layer 41 to have a thickness of at least 6 nm, the operating carrier density decreases, and it is possible to increase the thermal saturation level. Consequently, it is possible to improve the temperature characteristics.

Furthermore, if the light distribution is caused to be lean to N-type cladding layer 20, the factor for confining light to well layer 41 decreases, the oscillation threshold value increases, and the operating current value increases, which cause the occurrence of leakage current and a decrease in thermal saturation level. By causing well layer 41 to have a thickness of at least 6 nm, however, it is possible to reduce the influence of the decrease in factor for confining light to well layer 41, even if the light distribution is caused to be lean to N-type cladding layer 20.

Moreover, in semiconductor laser device 1 according to the present embodiment, well layer 41 comprises a semiconductor material represented by a composition formula of $Al_X Ga_{a1-X-Y} In_Y As$, where $0<X<1$ and $0<Y<1$.

With this configuration, the compression strain of well layer 41 increases, and it is possible to increase level energy between heavy holes in the first level (H1) and light holes in the first level (L1). As a result, a light hole count (LH count) that contributes to a TM mode decreases. Additionally, it is possible to cause a level count of light holes (LH level count) formed in P-side first barrier layer 43a and N-side first barrier layer 42a to one level. Accordingly, it is possible to increase a polarization ratio.

Of AlAs, GaAs, and InAs, InAs has the largest lattice constant and the least band gap energy. In this case, if desired band energy is obtained using a semiconductor material having a quaternary component including AlGaInAs for a well layer and barrier layers of an active layer, compression strain increases due to a higher In content rate, compared to a case in which desired band gap energy is obtained using InGaAs or AlGaAs.

For this reason, since strain energy of the well layer decreases if, as in the present embodiment, an end face window structure is formed by diffusing vacancies or impurities into a front end face that emits laser light in a semiconductor laser device in which AlGaInAs is used for the well layer and the barrier layers, In atoms of the well layer are likely to be exchanged with Al atoms or Ga atoms in group III lattice locations relative to a stacking direction, and band gap energy (Eg) of the well layer is likely to increase.

As a result, since the band gap energy of the well layer in the vicinity of the front end face having a high light density, which is an emission end face for laser light, increases easily, even if band gap energy in the vicinity of the front end face decreases due to heat generation, the well layer in the vicinity of the front end face is capable of easily maintaining a state in which light absorption is small.

Therefore, as with semiconductor laser device 1 according to the present embodiment, by causing well layer 41 to include AlGaInAs, it is possible to reduce the occurrence of COD in which the vicinity of front end face 1a is melted and damaged by laser light absorption.

In addition, as with the present embodiment, by forming window region 120 using vacancy diffusion, it is possible to reduce the occurrence of free carrier loss due to the presence of impurities, compared to a case in which window region 120 is formed using impurity diffusion. Accordingly, it is possible to reduce a decrease in slope efficiency.

Furthermore, in semiconductor laser device 1 according to the present embodiment, the band gap energy of P-side second barrier layer 43b gradually increases with distance from well layer 41.

This configuration makes it possible to increase an average refractive index of P-side second barrier layer 43b. In consequence, since it is possible to significantly increase the factor for confining light to well layer 41, the operating carrier density decreases, and it is possible to increase the thermal saturation level. Accordingly, it is possible to improve the temperature characteristics.

Additionally, by causing the band gap energy of P-side second barrier layer 43b to gradually increase with distance from well layer 41, it is possible to reduce the series resistance of semiconductor laser device 1. Accordingly, it is possible to achieve semiconductor laser device 1 that is driven at low voltage.

Moreover, in semiconductor laser device 1 according to the present embodiment, P-side first barrier layer 43a may include an undoped region that is doped with no impurities, and the undoped region may have a thickness of at least 5 nm.

Since this feature causes doping of impurities to start from a portion of P-side first barrier layer 43a, it is possible to reduce the series resistance of semiconductor laser device 1. In addition, since an electron potential barrier of P-side first barrier layer 43a increases, it is possible to reduce leakage electrons. Since the series resistance of semiconductor laser device 1 increases if the undoped region becomes excessively thick, the undoped region may have a thickness of at most 40 nm.

Furthermore, in semiconductor laser device 1 according to the present embodiment, P-side second barrier layer 43b is entirely doped with impurities, and P-side first barrier layer 43a includes an undoped region doped with no impurities in a region close to well layer 41, and a doped region doped with impurities in a region far from well layer 41.

Since this feature causes doping of impurities to start from a portion of P-side first barrier layer 43a, it is possible to reduce the series resistance of semiconductor laser device 1. In addition, since an electron potential barrier of each of P-side first barrier layer 43a and P-side second barrier layer 43b increases, it is possible to reduce leakage electrons.

Moreover, in semiconductor laser device 1 according to the present embodiment, a concentration of impurities with which P-side second barrier layer 43b is doped gradually increases with distance from well layer 41.

Since this feature causes the electron potential barrier of P-side second barrier layer 43b to increase, it is possible to reduce the series resistance of semiconductor laser device 1 while simultaneously reducing current leakage and an increase in waveguide loss.

Furthermore, semiconductor laser device 1 according to the present embodiment further includes P-type guiding layer 50 between P-side second barrier layer 43b and P-type cladding layer 60.

By providing P-type guiding layer 50 as above, it is possible to further increase the factor for confining light to well layer 41. As a result, the operating carrier density further decreases, and it is possible to further increase the thermal saturation level. Accordingly, it is possible to further improve the temperature characteristics.

Moreover, in semiconductor laser device 1 according to the present embodiment, an AI composition at least in an interface region between P-type guiding layer 50 and P-type cladding layer 60 gradually increases with distance from well layer 41.

This feature makes it possible to increase aslope the band gap energy in the interface region between P-type guiding layer 50 and P-type cladding layer 60. In this way, it is possible to reduce the occurrence of heterojunction spikes or notches in a valance band in the interface between P-type guiding layer 50 and P-type cladding layer 60, and to reduce the series resistance of semiconductor laser device 1 by hole conductivity being improved.

Figure 7A:
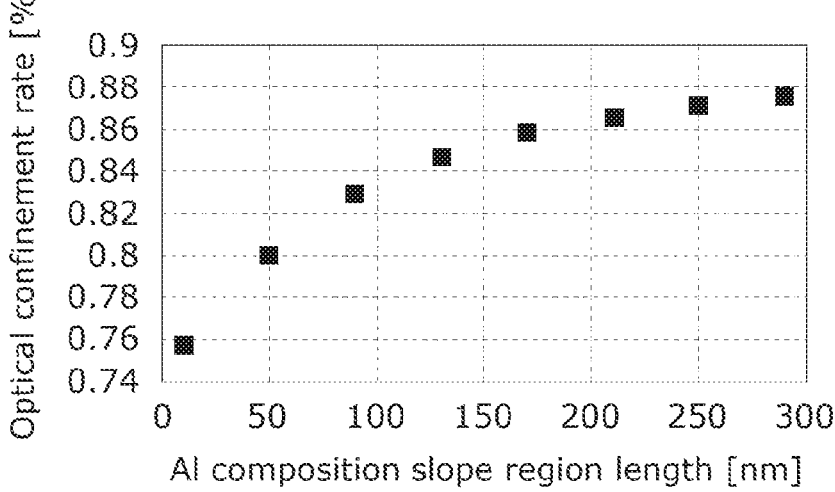
FIG. 7A is a diagram illustrating an Al composition slope region length dependence of an optical confinement rate in the semiconductor laser device according to the embodiment.
Figure 7B:
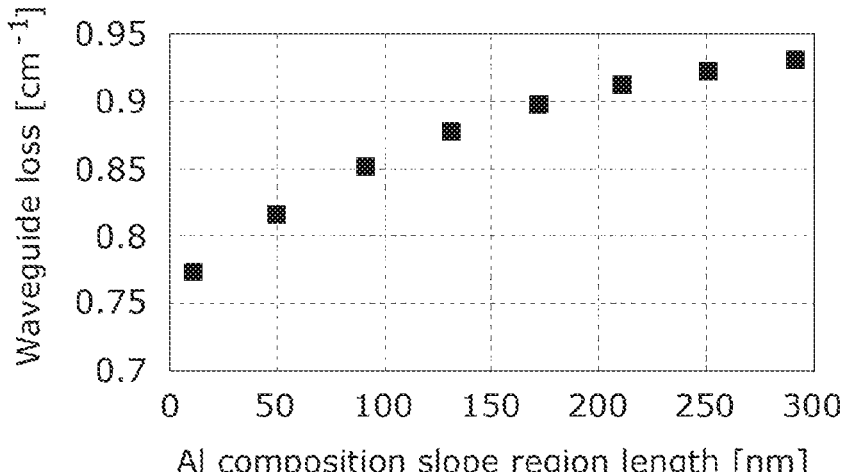
FIG. 7B is a diagram illustrating an Al composition slope region length dependence of waveguide loss in the semiconductor laser device according to the embodiment.

Additionally, it is also possible to obtain a high optical confinement rate by causing the AI composition in the interface region between P-type guiding layer 50 and P-type cladding layer 60 to gradually increase with distance from well layer 41. This point will be described with reference to FIG. 7A and FIG. 7B. FIG. 7A is a diagram illustrating an AI composition slope region length dependence of an optical confinement rate in semiconductor laser device 1 according to the embodiment. FIG. 7B is a diagram illustrating an AI composition slope region length dependence of waveguide loss in semiconductor laser device 1 according to the present embodiment. It should be noted that, in FIG. 7A and FIG. 7B, an AI composition slope region length is a length of a region whose AI composition increases aslope, in the interface region between P-type guiding layer 50 and P-type cladding layer 60.

Since it is possible to increase the optical confinement rate by increasing the AI composition slope region length as shown in FIG. 7A, it is possible to reduce operating threshold current and improve a maximum light output. On the other hand, as shown in FIG. 7B, if the AI composition slope region length is increased excessively, resistance components increase, and waveguide loss increases. For this reason, it is desirable that the AI composition slope region length be less than or equal to 200 nm. It should be noted that, from the viewpoint of reducing the occurrence of spikes in the valance band in the interface between P-type guiding layer 50 and P-type cladding layer 60 as described above, the AI composition slope region length may be at least 20 nm.

Furthermore, in semiconductor laser device 1 according to the present embodiment, a concentration of impurities with which P-type guiding layer 50 is doped gradually increases with distance from well layer 41. In other words, the concentration of the impurities with which P-type guiding layer 50 is doped increases aslope.

Since this feature causes an electron potential barrier of P-type guiding layer 50 to increase, it is possible to reduce the series resistance of semiconductor laser device 1 while simultaneously reducing current leakage and an increase in waveguide loss.

Here, sloping a P-type impurity concentration of a P-side semiconductor layer will be described with reference to FIG. 8A and FIG. 8B. FIG. 8A is a diagram illustrating a P-type impurity concentration dependence of an optical confinement rate in semiconductor laser device 1 according to the embodiment. FIG. 8B is a diagram illustrating a P-type impurity concentration dependence of waveguide loss in semiconductor laser device 1 according to the present embodiment. FIG. 8A and FIG. 8B show simulation results of four samples when AI compositions and thicknesses of P-side first barrier layer 43*a* and P-side second barrier layer 43*b* are changed in semiconductor laser device 1 according to the present embodiment. In FIG. 8A and FIG. 8B, P-side first barrier layer 43*a* having an AI composition of 0.12 and a thickness of 30 nm, and P-side second barrier layer 43*b* having an AI composition increasing aslope from 0.12 to 0.24 and a thickness of 15 nm are used in sample 1; P-side first barrier layer 43*a* having an AI composition of 0.12 and a thickness of 15 nm, and P-side second barrier layer 43*b* having an AI composition increasing aslope from 0.12 to 0.24 and a thickness of 15 nm are used in sample 2; P-side first barrier layer 43*a* having an AI composition of 0.18 and a thickness of 30 nm, and P-side second barrier layer 43*b* having an AI composition increasing aslope from 0.12 to 0.24 and a thickness of 15 nm are used in sample 3; and P-side first barrier layer 43*a* having an AI composition of 0.18 and a thickness of 15 nm, and P-side second barrier layer 43*b* having an AI composition increasing aslope from 0.12 to 0.24 and a thickness of 15 nm are used in sample 4.

As shown in FIG. 8A, it is clear that although the P-type impurity concentration does not almost depend on the optical confinement rate, an effect of increasing the optical confinement rate is greater if the AI composition of P-side first barrier layer 43*a* is decreased than if the thickness of P-side first barrier layer 43*a* is increased. In contrast, as shown in FIG. 8B, since the waveguide loss increases if the P-type impurity concentration is increased excessively, it is desirable that the P-type impurity concentration be not increased excessively.

Moreover, in semiconductor laser device 1 according to the present embodiment, active layer 40 further includes N-side first barrier layer 42*a* below well layer 41, and N-side second barrier layer 42*b* below N-side first barrier layer 42*a*. N-side second barrier layer 42*b* has an AI composition ratio higher than an AI composition ratio of N-side first barrier layer 42*a*, and has band gap energy greater than band gap energy of N-side first barrier layer 42*a*.

If the annealing temperature when the window region is formed by increasing well layer 41 in thickness is increased, not only in a P-side region but also in an N-side region of well layer 41, this feature makes it possible to promote a change in wavelength of well layer 41 in the window portion by increasing band gap energy while reducing a change in wavelength of well layer 41 in the gain portion due to an increase in band gap energy. Accordingly, it is possible to further reduce the blocking of the effect of increasing a COD level while further reducing the deterioration of the temperature characteristics and the decrease in the long-term reliability.

Furthermore, in semiconductor laser device 1 according to the present embodiment, the band gap energy of N-side second barrier layer 42*b* gradually increases with distance from well layer 41.

This feature makes it possible to increase an average refractive index of N-side second barrier layer 42*b*. As a result, since it is possible to further increase the factor for confining light to well layer 41, the operating carrier density further decreases, and it is possible to further increase the thermal saturation level. Accordingly, it is possible to further improve the temperature characteristics.

Additionally, by causing the band gap energy of N-side second barrier layer 42*b* to gradually increase with distance from well layer 41, it is possible to reduce the series resistance of semiconductor laser device 1.

Moreover, in semiconductor laser device 1 according to the present embodiment, N-side second barrier layer 42*b* is entirely doped with impurities, and N-side first barrier layer 42*a* includes an undoped region doped with no impurities in a region close to well layer 41, and a doped region doped with impurities in a region far from well layer 41.

Since this feature causes doping of impurities to start from a portion of N-side first barrier layer 42*a*, it is possible to reduce the series resistance of semiconductor laser device 1. In addition, since an electron potential barrier of each of N-side first barrier layer 42*a* and N-side second barrier layer 42*b* increases, it is possible to reduce leakage electrons. On top of that, by causing the interface between N-side first barrier layer 42*a* and well layer 41 to be the undoped region, it is also possible to reduce a decrease in gain of well layer 41.

Furthermore, in semiconductor laser device 1 according to the present embodiment, P-side second barrier layer 43*b* has the band gap energy greater than the band gap energy of N-side second barrier layer 42*b*.

Accordingly, it is possible to effectively reduce the occurrence of leakage electrons while reducing an increase in operating voltage.

Moreover, semiconductor laser device 1 according to the present embodiment further includes N-type guiding layer 30 between N-side second barrier layer 42*b* and N-type cladding layer 20.

By providing N-type guiding layer 30 as above, it is possible to further increase the factor for confining light to well layer 41. As a result, the operating carrier density further decreases, and it is possible to further increase the thermal saturation level. Accordingly, it is possible to further improve the temperature characteristics.

Furthermore, in semiconductor laser device 1 according to the present embodiment, an AI composition at least in an interface region between N-type guiding layer 30 and N-type cladding layer 20 gradually increases with distance from well layer 41.

This feature makes it possible to increase aslope the band gap energy in the interface region between N-type guiding layer 30 and N-type cladding layer 20. Accordingly, it is possible to reduce the occurrence of spikes in a valance band in the interface between N-type guiding layer 30 and N-type cladding layer 20, and to reduce the series resistance of semiconductor laser device 1 by hole conductivity being improved.

Moreover, in semiconductor laser device 1 according to the present embodiment, it is desirable that a concentration of impurities with which each of N-type cladding layer 20, N-type guiding layer 30, N-side second barrier layer 42*b*, and N-side first barrier layer 42*a* is doped gradually increase with distance from well layer 41 or increase in stages.

This feature makes it possible to reduce the waveguide loss while reducing the series resistance of semiconductor laser device 1, and to achieve highly efficient laser oscillation due to a high slope efficiency while reducing the operating voltage.

Furthermore, in semiconductor laser device 1 according to the present embodiment, it is desirable that active layer 40 include N-side first barrier layer 42a below well layer 41, and N-side second barrier layer 42b below N-side first barrier layer 42a, that N-side second barrier layer 42b have an AI composition ratio higher than an AI composition ratio of N-side first barrier layer 42a, and have band gap energy greater than band gap energy of N-side first barrier layer 42a, that active layer 40 include N-type guiding layer 30 between N-side second barrier layer 42b and N-type cladding layer 20, and that P-type guiding layer 50 have band gap energy different from band gap energy of N-type guiding layer 30.

If the band gap energy of P-type guiding layer 50 is greater than the band gap energy of N-type guiding layer 30, this feature makes it possible to increase an electron potential barrier and reduce the occurrence of leakage electrons.

Additionally, if the band gap energy of P-type guiding layer 50 is less than the band gap energy of N-type guiding layer 30, a refractive index of N-type guiding layer 30 becomes lower than a refractive index of P-type guiding layer 50, and confinement of light to N-type guiding layer 30 is weakened, which makes it possible to obtain a high factor for confining light to well layer 41.

Moreover, it is desirable that semiconductor laser device 1 according to the present embodiment include N-side first barrier layer 42 and N-side second barrier layer 42b between well layer 41 and N-type cladding layer 20, in a direction from well layer 41 to N-type cladding layer 20, that N-side second barrier layer 42b have an AI composition ratio higher than an AI composition ratio of N-side first barrier layer 42a, and have band gap energy greater than band gap energy of N-side first barrier layer 42a, that the band gap energy of N-side second barrier layer 42b gradually increase with distance from well layer 41, and that a maximum value of the band gap energy of P-side second barrier layer 43b be larger than a maximum value of the band gap energy of N-side second barrier layer 42b.

This feature makes it possible to increase an electron potential barrier and reduce the occurrence of leakage electrons.

Figure 9:
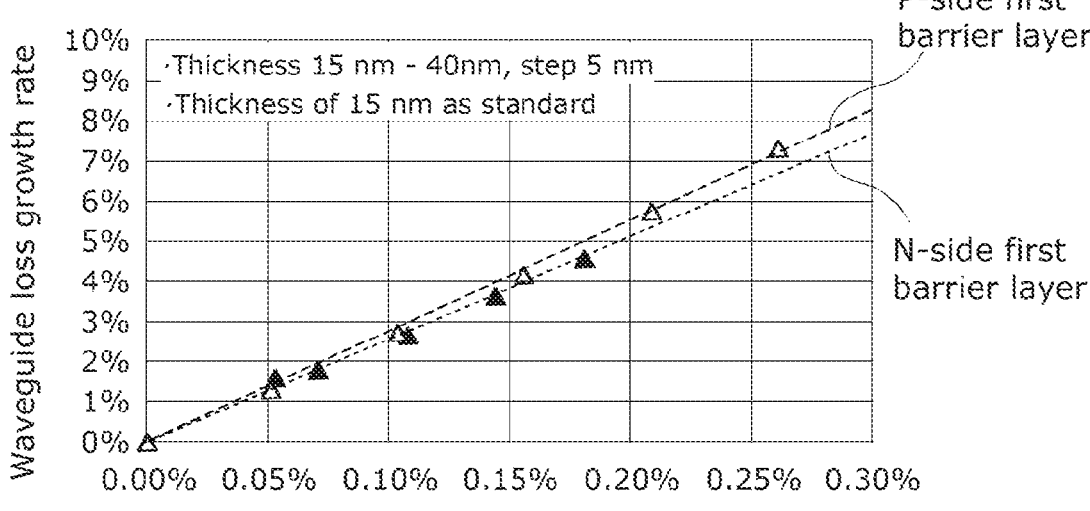
FIG. 9 is a diagram illustrating a relation of waveguide loss to an optical confinement rate with regard to thickness of an N-side first barrier layer and a P-side first barrier layer in the semiconductor laser device according to the embodiment.
Figure 10:
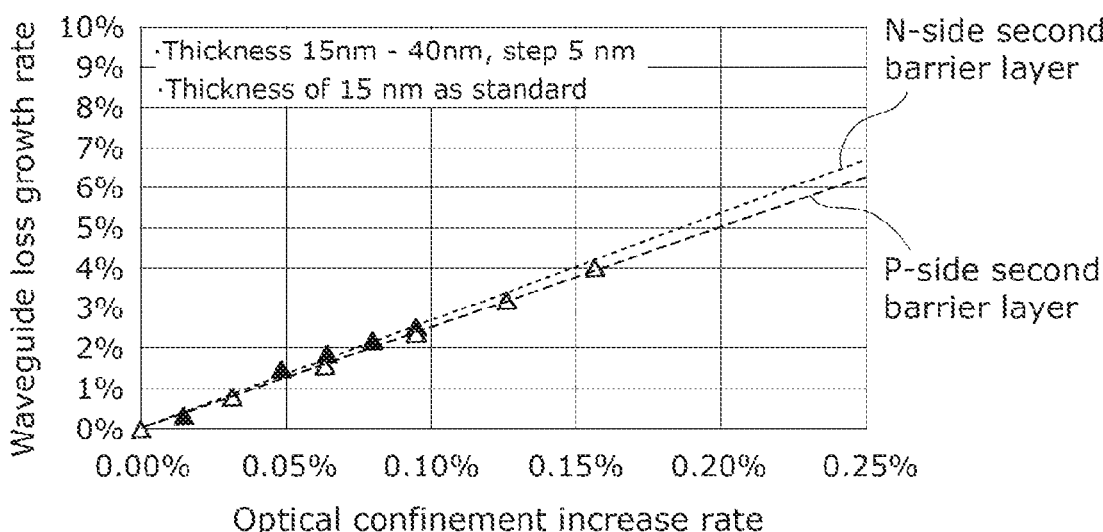
FIG. 10 is a diagram illustrating a relation of waveguide loss to an optical confinement rate with regard to thickness of an N-side second barrier layer and a P-side second barrier layer in the semiconductor laser device according to the embodiment.

The following describes the thicknesses of N-side first barrier layer 42a, N-side second barrier layer 42b, P-side first barrier layer 43a, and P-side second barrier layer 43b in active layer 40 with reference to FIG. 9 and FIG. 10. FIG. 9 illustrates a relation of waveguide loss to an optical confinement rate with regard to the thicknesses of N-side first barrier layer 42a and P-side first barrier layer 43a. FIG. 10 illustrates a relation of waveguide loss to an optical confinement rate with regard to the thicknesses of N-side second barrier layer 42b and P-side second barrier layer 43b. It should be noted that FIG. 9 and FIG. 10 show simulation results when the thickness is changed at intervals of 5 nm in a range from 15 nm to 40 nm. Moreover, in FIG. 9 and FIG. 10, each point is plotted with respect to a thickness of 15 nm.

As shown in FIG. 9, it is clear that by causing the thickness of N-side first barrier layer 42a to be greater than the thickness of P-side first barrier layer 43a, it is possible to increase the optical confinement rate while reducing the waveguide loss. In other words, among N-side first barrier layer 42a, N-side second barrier layer 42b, P-side first barrier layer 43a, and P-side second barrier layer 43b, regarding N-side first barrier layer 42a and P-side first barrier layer 43a closer to well layer 41, it is desirable that the thickness of N-side first barrier layer 42a be greater than the thickness of P-side first barrier layer 43a.

On the other hand, as shown in FIG. 10, among N-side first barrier layer 42a, N-side second barrier layer 42b, P-side first barrier layer 43a, and P-side second barrier layer 43b, regarding N-side second barrier layer 42b and P-side second barrier layer 43b farther from well layer 41, it is clearly desirable that the thickness of P-side second barrier layer 43b be greater than the thickness of N-side second barrier layer 42b. Specifically, it is clear that by causing the thickness of P-side second barrier layer 43b to be greater than the thickness of N-side second barrier layer 42b, it is possible to increase the optical confinement rate while reducing the waveguide loss.

Here, holes have a lower mobility and a lower impurity activation rate than electrons do. For this reason, in order to reduce the series resistance of a semiconductor laser device and decrease rise voltage of PN junction, it is necessary to increase a carrier density of the holes by causing a concentration of impurities with which a P-type semiconductor layer is doped to be higher than a concentration of impurities with which an N-type semiconductor layer is doped. Accordingly, free carrier loss that occurs in a distribution of light propagating through an optical waveguide has influence occurring in the P-type semiconductor layer that is greater than influence occurring in the N-type semiconductor layer, and it is necessary to control a P-type impurity doping profile accurately.

In view of the above, the inventors examined a concentration of impurities with which the P-type semiconductor layer is doped, in semiconductor laser device 1 according to the present embodiment. The following describes the examination results with reference to FIG. 11A to FIG. 16B. It should be noted that in FIG. 11A to FIG. 16B the examinations are performed based on sample 1, sample 2, sample 3, and sample 4 illustrated in FIG. 8A and FIG. 8B.

Figure 11A:
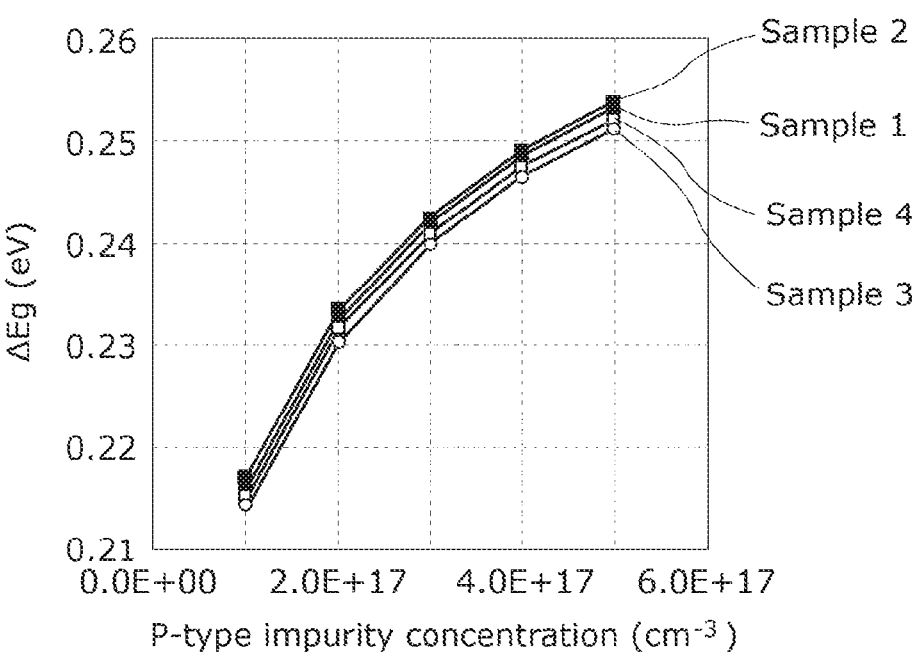
FIG. 11A is a diagram illustrating a P-type impurity concentration dependence of a potential barrier with regard to a P-type guiding layer of the semiconductor laser device according to the embodiment.
Figure 11B:
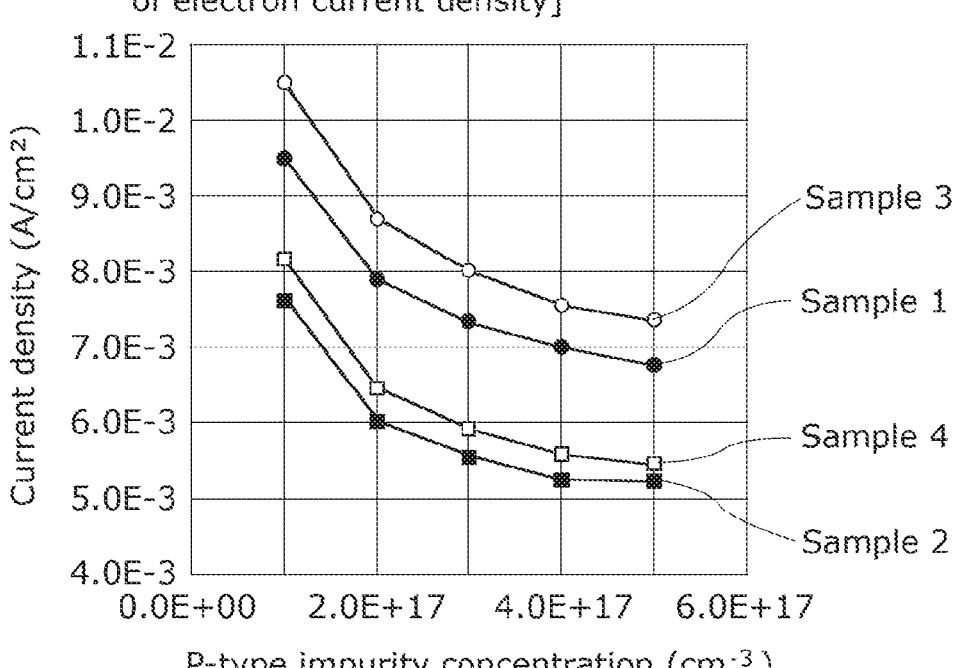
FIG. 11B is a diagram illustrating a P-type impurity concentration dependence of an electron current density with regard to the P-type guiding layer of the semiconductor laser device according to the embodiment.

First, an effect of doping P-type guiding layer 50 with impurities will be described with reference to FIG. 11A and FIG. 11B. FIG. 11A shows a dependence of a potential barrier ($\Delta$Eg) on a P-type impurity concentration of P-type guiding layer 50 when, of P-type guiding layer 50, P-side first barrier layer 43a, and P-side second barrier layer 43b, P-type guiding layer 50 is doped with P-type impurities, and P-side first barrier layer 43a and P-side second barrier layer 43b are not doped with P-type impurities (undoped), in semiconductor laser device 1 according to the present embodiment. FIG. 11B shows a dependence of an electron current density on the P-type impurity concentration of P-type guiding layer 50 at the time.

Specifically, P-side first barrier layer 43a has an AI composition of 0.12 and a thickness of 15 nm, and N-side first barrier layer 42a has an AI composition of 0.18 and a thickness of 30 nm. P-side second barrier layer 43b and N-side second barrier layer 42b have an AI composition sloping from 0.12 to 0.24 or from 0.18 to 0.24, and a thickness of 15 nm. P-side first barrier layer 43a and P-side second barrier layer 43b are both entirely undoped. With regard to N-side first barrier layer 42a, a region having a thickness of 5 nm on the well layer 41 side is an undoped region, and a region at a distance of at least 5 nm from well layer 41 is doped with impurities of $1 \times 10^{17}$ cm$^{-3}$. N-side second barrier layer 42b is entirely doped with impurities of $1.4 \times 10^{17}$ cm$^{-3}$. N-type guiding layer 30 is doped with impurities of $1.4 \times 10^{17}$ cm$^{-3}$. It should be noted that an impurity concentration is increased by doping N-type cladding layer 20 with impurities of $1.4 \times 10^{17}$ cm$^{-3}$, $2 \times 10^{17}$ cm$^{-3}$, $6 \times 10^{17}$ cm$^{-3}$, and $2 \times 10^{18}$ cm$^{-3}$ in multiple stages from a side closest to well layer 41 toward a side farthest from well layer 41.

In this structure, if the P-type impurity concentration of P-type guiding layer 50 having a thickness of 0.2 μm is increased from $1 \times 10^{17}$ cm$^{-3}$ to $5 \times 10^{17}$ cm$^{-3}$, as shown in FIG. 11A and FIG. 11B, it is clear that the potential barrier ($\Delta$Eg) increases from 0.215 eV to at least 0.250 eV, and that there is an effect of reducing ineffective current due to a decrease in electron current flowing through P-type guiding layer 50. In addition, if the P-type impurity concentration of P-type guiding layer 50 is increased, it is possible to reduce electron current flowing through the P-side semiconductor layer over well layer 41.

On the other hand, if the P-type impurity concentration of P-type guiding layer 50 is increased, the potential barrier increases and the series resistance of semiconductor laser device 1 decreases, but waveguide loss increases and luminous efficiency (slope efficiency) decreases.

Accordingly, by causing an average value of concentrations of P-type impurities with which entire P-type guiding layer 50 is doped to be in a range from $2 \times 10^{17}$ cm$^{-3}$ to $4 \times 10^{17}$ cm$^{-3}$, it is possible to reduce the waveguide loss, the series resistance of semiconductor laser device 1, and leakage electron current, and to increase the potential barrier.

It should be noted that since P-side first barrier layer 43a has a higher refractive index than P-side second barrier layer 43b does, a factor for confining light to well layer 41 increases more if the thickness of P-side first barrier layer 43a is increased. In particular, since the factor for confining light to well layer 41 is likely to decrease in the optical waveguide in which a light distribution is lean to the N-type semiconductor layer, it is effective to increase the thickness of P-side first barrier layer 43a in order to reduce a decrease in factor for confining light. In this regard, however, the electron current flowing through P-type guiding layer 50 over well layer 41 increases if the thickness of P-side first barrier layer 43a is increased. Accordingly, it is desirable that P-side first barrier layer 43a have a thickness of at least 10 nm and at most 30 nm.

Figure 12A:
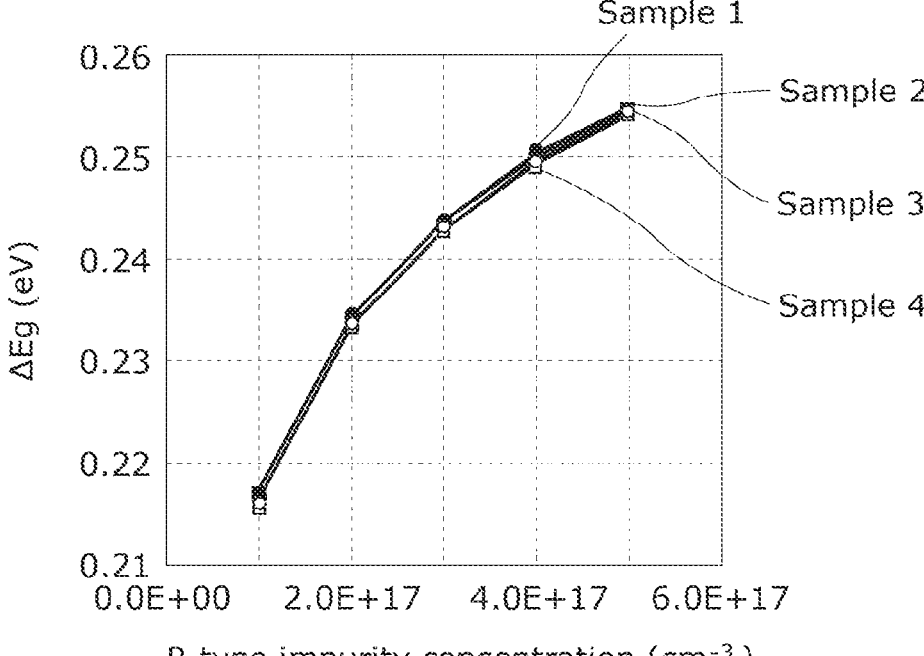
FIG. 12A is a diagram illustrating a P-type impurity concentration dependence of a potential barrier with regard to a P-type semiconductor layer of the semiconductor laser device according to the embodiment.
Figure 12B:
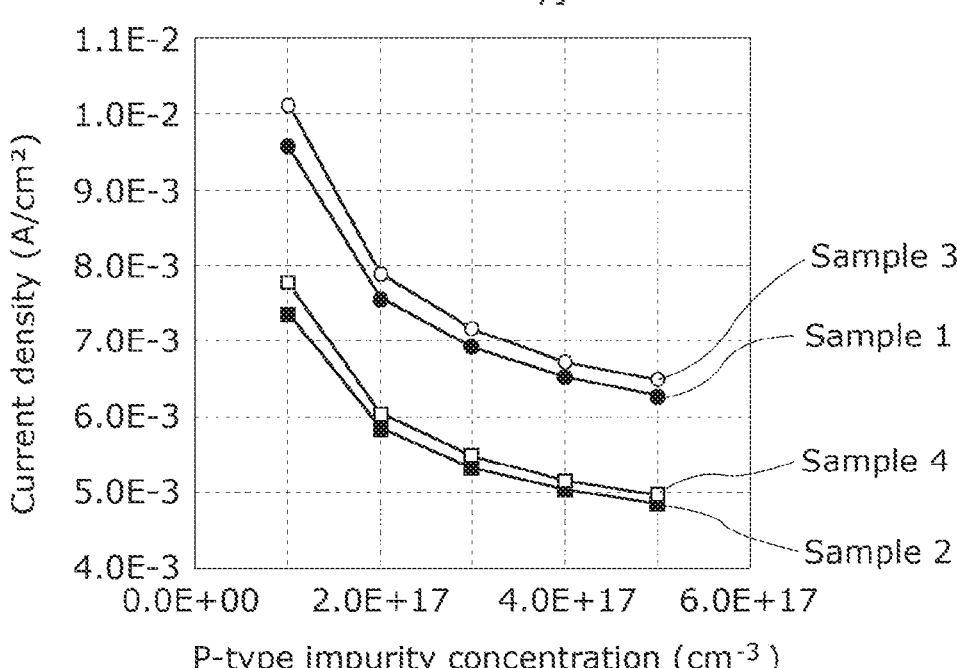
FIG. 12B is a diagram illustrating a P-type impurity concentration dependence of an electron current density with regard to the P-type semiconductor layer of the semiconductor laser device according to the embodiment.

Next, an effect of doping P-side first barrier layer 43a, P-side second barrier layer 43b, and P-type guiding layer 50 with impurities will be described with reference to FIG. 12A and FIG. 12B. FIG. 12A shows a P-type impurity concentration dependence of a potential barrier ($\Delta$Eg) when P-type guiding layer 50, P-side first barrier layer 43a, and P-side second barrier layer 43b are all doped with certain P-type impurities in semiconductor laser device 1 according to the present embodiment. FIG. 12B shows a P-type impurity concentration dependence of an electron current density at the time.

Specifically, P-side first barrier layer 43a has an Al composition of 0.12 and a thickness of 15 nm, and N-side first barrier layer 42a has an Al composition of 0.18 and a thickness of 30 nm. In this case, with regard to P-side first barrier layer 43a, a region having a thickness of 5 nm on the well layer 41 side is an undoped region. In contrast, with regard to N-side first barrier layer 42a, a region having a thickness of 5 nm on the well layer 41 side is an undoped region, and a region at a distance of at least 5 nm from well layer 41 is doped with N-type impurities of $1 \times 10^{17}$ cm$^{-3}$. P-side second barrier layer 43b and N-side second barrier layer 42b have an Al composition sloping from 0.12 to 0.24 or from 0.18 to 0.24, and a thickness of 15 nm. In this case, N-side second barrier layer 42b is entirely doped with the N-type impurities of $1 \times 10^{17}$ cm$^{-3}$. N-type guiding layer 30 is doped with impurities of $1 \times 10^{17}$ cm$^{-3}$. It should be noted that an impurity concentration is increased by doping N-type cladding layer 20 with impurities of $1.4 \times 10^{17}$ cm$^{-3}$, $2 \times 10^{17}$ cm$^{-3}$, $6 \times 10^{17}$ cm$^{-3}$, and $2 \times 10^{18}$ cm$^{-3}$ in multiple stages from the side closest to well layer 41 toward the side farthest from well layer 41.

In this structure, if the P-type impurity concentrations of P-side first barrier layer 43a, P-side second barrier layer 43b, and P-type guiding layer 50 (a thickness of 0.2 μm) are increased from $1 \times 10^{17}$ cm$^{-3}$ to $5 \times 10^{17}$ cm$^{-3}$, as shown in FIG. 12A and FIG. 12B, it is clear that the potential barrier ($\Delta$Eg) increases from 0.216 eV to 0.254 eV, and that there is an effect of reducing ineffective current due to a decrease in electron current flowing through P-type guiding layer 50. On the other hand, if the P-type impurity concentration of P-type guiding layer 50 is increased, the potential barrier increases and the series resistance of semiconductor laser device 1 decreases, but waveguide loss increases and luminous efficiency (slope efficiency) decreases.

Accordingly, by causing an average value of concentrations of P-type impurities with which entire P-type guiding layer 50 is doped to be in a range from $2 \times 10^{17}$ cm$^{-3}$ to $4 \times 10^{17}$ cm$^{-3}$, it is possible to reduce the waveguide loss, the series resistance of semiconductor laser device 1, and leakage electron current, and to increase the potential barrier.

Moreover, compared to a case in which P-side first barrier layer 43a, P-side second barrier layer 43b, and P-type guiding layer 50 are doped with the P-type impurities, by doping P-side first barrier layer 43a, P-side second barrier layer 43b, and P-type guiding layer 50 with the P-type impurities, it is possible to reduce the leakage current due to a decrease in electron current flowing through a P-type semiconductor layer side over well layer 41, and the effect of increasing the potential barrier increases.

It should be noted that since P-side first barrier layer 43a has a higher refractive index than P-side second barrier layer 43b does, a factor for confining light to well layer 41 increases more if the thickness of P-side first barrier layer 43a is increased. In particular, since the factor for confining light to well layer 41 is likely to decrease in the optical waveguide in which a light distribution is lean to the N-type semiconductor layer, it is effective to increase the thickness of P-side first barrier layer 43a in order to reduce a decrease in factor for confining light. In this regard, however, the electron current flowing through P-type guiding layer 50 over well layer 41 increases if the thickness of P-side first barrier layer 43a is increased, and the increase in leakage current is reduced by approximately 10%, compared to the case in which P-side first barrier layer 43a, P-side second barrier layer 43b, and P-type guiding layer 50 are not doped with the P-type impurities. Accordingly, it is possible to increase the thickness of P-side first barrier layer 43a by approximately 10%, compared to the case in which P-side first barrier layer 43a, P-side second barrier layer 43b, and P-type guiding layer 50 are not doped with the P-type impurities, and it is desirable that P-side first barrier layer 43a have a thickness of at least 15 nm and at most 40 nm.

Figure 13A:
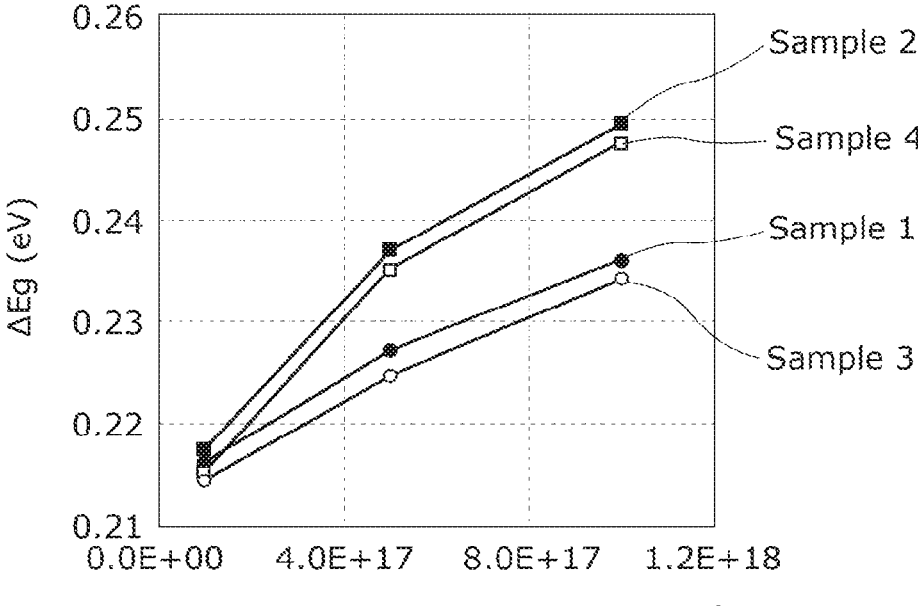
FIG. 13A is a diagram illustrating a P-type impurity concentration dependence of a potential barrier with regard to a P-type semiconductor layer of the semiconductor laser device in Working Example 1.
Figure 13B:
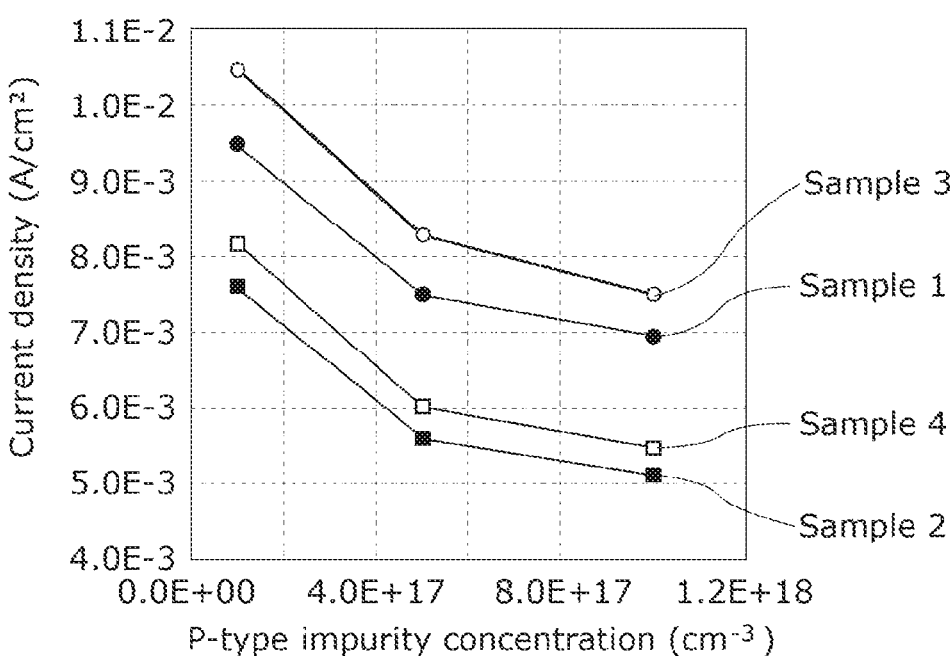
FIG. 13B is a diagram illustrating a P-type impurity concentration dependence of an electron current density with regard to the P-type semiconductor layer of the semiconductor laser device in Working Example 1.

Here, although the concentrations of the P-type impurities with which P-side first barrier layer 43a, P-side second barrier layer 43b, and P-type guiding layer 50 are doped are not sloped in FIG. 12A and FIG. 12B, sloping the concentrations of the P-type impurities with which P-side first barrier layer 43a, P-side second barrier layer 43b, and P-type guiding layer 50 are doped produces results shown in FIG. 13A and FIG. 13B. FIG. 13A shows a P-type impurity concentration dependence of a potential barrier ($\Delta$Eg) when impurities are doped using an impurity doping profile of semiconductor laser device 1 according to Working Example 1 shown in FIG. 5A. FIG. 13B shows a P-type impurity concentration dependence of an electron current density at the time.

Specifically, P-side first barrier layer 43a has an AI composition of 0.12 and a thickness of 15 nm, and N-side first barrier layer 42a has an AI composition of 0.18 and a thickness of 30 nm. In this case, with regard to P-side first barrier layer 43a, a region having a thickness of 5 nm on the well layer 41 side is an undoped region. In contrast, with regard to N-side first barrier layer 42a, a region having a thickness of 5 nm on the well layer 41 side is an undoped region, and a region at a distance of at least 5 nm from well layer 41 is doped with N-type impurities of $1\times10^{17}$ cm$^{-3}$. P-side second barrier layer 43b and N-side second barrier layer 42b have an AI composition sloping from 0.12 to 0.24 or from 0.18 to 0.24, and a thickness of 15 nm. In this case, N-side second barrier layer 42b is entirely doped with the N-type impurities of $1\times10^{17}$ cm$^{-3}$. N-type guiding layer 30 is doped with impurities of $1\times10^{17}$ cm$^{-3}$. It should be noted that an impurity concentration is increased by doping N-type cladding layer 20 with impurities of $1.4\times10^{17}$ cm$^{-3}$, $2\times10^{17}$ cm$^{-3}$, $6\times10^{17}$ cm$^{-3}$, and $2\times10^{18}$ cm$^{-3}$ in multiple stages from the side closest to well layer 41 toward the side farthest from well layer 41.

In this structure, if an impurity concentration at P-type impurity doping start position P1 in P-side first barrier layer 43a is $1\times10^{17}$ cm$^{-3}$, and P-type impurities are doped so that a P-type impurity concentration at position P2 in P-type guiding layer 50 on a side away from well layer 41 increases a slope from $1\times10^{17}$ cm$^{-3}$ to $1\times10^{18}$ cm$^{-3}$, as shown in FIG. 13A and FIG. 13B, the potential barrier (ΔEg) increases from 0.216 eV to 0.254 eV in the case where P-side first barrier layer 43a and N-side first barrier layer 42a have a thickness of 15 nm, and the potential barrier (ΔEg) increases from 0.215 eV to 0.234 eV in the case where P-side first barrier layer 43a and N-side first barrier layer 42a have a thickness of 30 nm.

Moreover, if the P-type impurity concentration at position P2 is increased, it is possible to reduce ineffective current due to a decrease in electron current flowing through P-type guiding layer 50. Here, if the P-type impurity concentration at position P2 is increased, the potential barrier increases and the series resistance of semiconductor laser device 1 also decreases. In addition, since the P-type impurity concentration slopes in P-type guiding layer 50, an increase in waveguide loss is reduced even if the P-type impurity concentration at position P2 is increased.

Accordingly, by causing an average value of concentrations of P-type impurities with which entire P-type guiding layer 50 is doped to be in a range from $2\times10^{17}$ cm$^{-3}$ to $4\times10^{17}$ cm$^{-3}$, it is possible to reduce the waveguide loss, the series resistance of semiconductor laser device 1, and leakage electron current, and to increase the potential barrier.

Additionally, by doping P-side first barrier layer 43a, P-side second barrier layer 43b, and P-type guiding layer 50 with the P-type impurities so that impurity concentrations slope, it is possible to reduce the leakage current.

It should be noted that since P-side first barrier layer 43a has a higher refractive index than P-side second barrier layer 43b does, a factor for confining light to well layer 41 increases more if the thickness of P-side first barrier layer 43a is increased. In particular, since the factor for confining light to well layer 41 is likely to decrease in the optical waveguide in which a light distribution is lean to the N-type semiconductor layer, it is effective to increase the thickness of P-side first barrier layer 43a in order to reduce a decrease in factor for confining light. However, if the thickness of P-side first barrier layer 43a is increased excessively, optical confinement to well layer 41 increases, and COD can easily occur. Specifically, it is desirable that P-side first barrier layer 43a have a thickness of at least 15 nm and at most 50 nm. As a result, it is possible to increase the optical confinement to well layer 41 and decrease an oscillation threshold current value while reducing the occurrence of COD in the light waveguide in which the light distribution is lean to the N-type semiconductor layer.

Figure 14A:
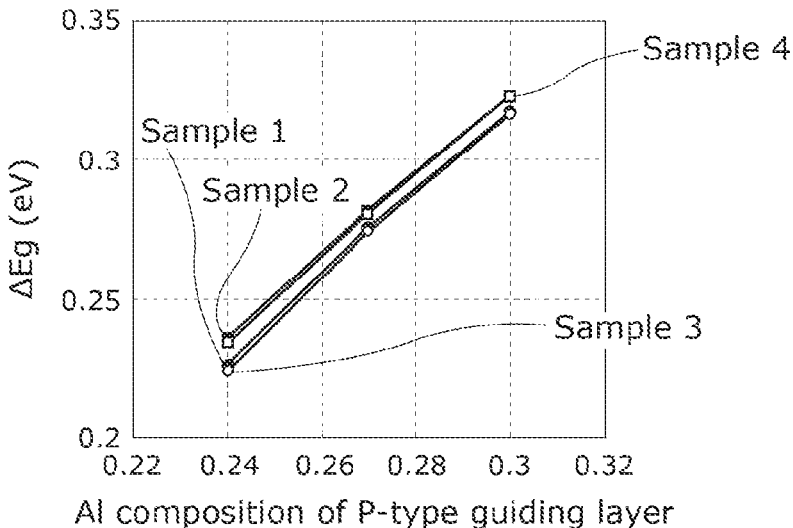
FIG. 14A is a diagram illustrating an Al composition dependence of a potential barrier with regard to a P-type semiconductor layer of the semiconductor laser device in Working Example 3.
Figure 14B:
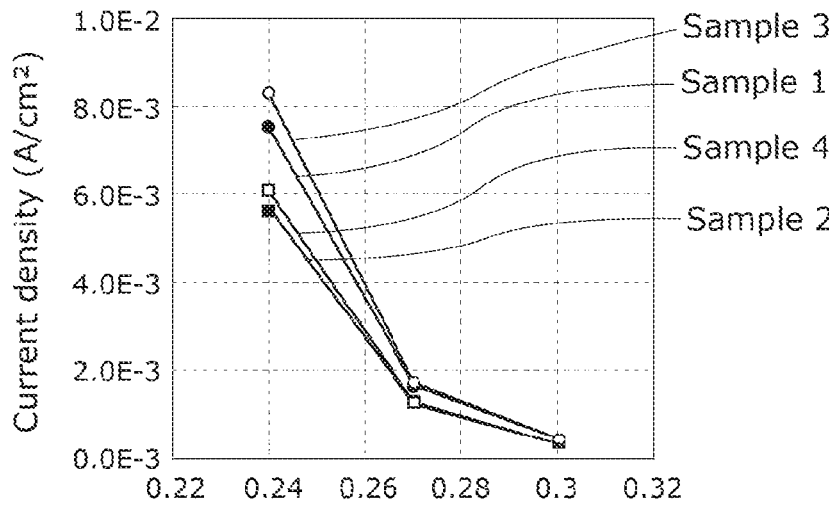
FIG. 14B is a diagram illustrating an Al composition dependence of an electron current density with regard to the P-type semiconductor layer of the semiconductor laser device in Working Example 3.

Although the AI compositions of N-type guiding layer 30 and P-type guiding layer 50 are symmetrical in FIG. 13A and FIG. 13B, causing the AI compositions of N-type guiding layer 30 and P-type guiding layer 50 to be asymmetrical produces results shown in FIG. 14A and FIG. 14B. Specifically, in FIG. 14A and FIG. 14B, the AI composition of P-type guiding layer 50 is caused to be higher than the AI composition of N-type guiding layer 30 so that band gap energy of P-type guiding layer 50 is caused to be greater than band gap energy of N-type guiding layer 30. It should be noted that FIG. 14A shows an AI composition dependence of a potential barrier with regard to P-type guiding layer 50 of semiconductor laser device 1 according to Working Example 3 shown in FIG. 5C. FIG. 14B shows an AI composition dependence of an electron current density with regard to P-type guiding layer 50 of semiconductor laser device 1.

Specifically, P-side first barrier layer 43a has an AI composition of 0.12 and a thickness of 15 nm, and N-side first barrier layer 42a has an AI composition of 0.18 and a thickness of 30 nm. In this case, with regard to P-side first barrier layer 43a, a region having a thickness of 5 nm on the well layer 41 side is an undoped region. In contrast, with regard to N-side first barrier layer 42a, a region having a thickness of 5 nm on the well layer 41 side is an undoped region, and a region at a distance of at least 5 nm from well layer 41 is doped with N-type impurities of $1\times10^{17}$ cm$^{-3}$. N-side second barrier layer 42b has an AI composition sloping from 0.12 to 0.24 or from 0.18 to 0.24, and a thickness of 15 nm. P-side second barrier layer 43b has an AI composition sloping from 0.12 to $X_{pg}$ or from 0.18 to $X_{pg}$, and a thickness of 15 nm. In this case, N-side second barrier layer 42b is entirely doped with the N-type impurities of $1\times10^{17}$ cm$^{-3}$. Moreover, N-type guiding layer 30 has an AI composition of 0.24, and P-type guiding layer 50 has an AI composition of $X_{pg}$. It should be noted that an impurity concentration is increased by doping N-type cladding layer 20 with impurities of $1.4\times10^{17}$ cm$^{-3}$, $2\times10^{17}$ cm$^{-3}$, $6\times10^{17}$ cm$^{-3}$, and $2\times10^{18}$ cm$^{-3}$ in multiple stages from the side closest to well layer 41 toward the side farthest from well layer 41.

In this structure, an impurity concentration at P-type impurity doping start position P1 in P-side first barrier layer 43a is $1\times10^{17}$ cm$^{-3}$, and P-type impurities are doped so that a P-type impurity concentration at position P2 in P-type guiding layer 50 on a side away from well layer 41 increases a slope to $5\times10^{18}$ cm$^{-3}$.

Here, if $X_{pg}$ is changed from 0.24 to 0.3, as shown in FIG. 14A and FIG. 14B, the potential barrier (ΔEg) increases from 0.235 eV to 0.320 eV in the case where P-side first barrier layer 43a and N-side first barrier layer 42a have a thickness of 15 nm, and the potential barrier (ΔEg) increases from 0.250 eV to 0.315 eV in the case where P-side second barrier layer 43b and N-side second barrier layer 42b have a thickness of 30 nm.

Moreover, if the P-type impurity concentration at position P2 is increased, it is possible to reduce ineffective current due to a decrease in electron current flowing through P-type guiding layer 50. Here, if the P-type impurity concentration at position P2 is increased, the potential barrier increases and the series resistance of semiconductor laser device 1 also decreases. In addition, since the P-type impurity concentration slopes in P-type guiding layer 50, an increase in waveguide loss is reduced even if the P-type impurity concentration at position P2 is increased.

Moreover, it is clear that if the Al composition of P-type guiding layer 50 increases, the electron current flowing through P-type guiding layer 50 over well layer 41 decreases rapidly. Since an average value of P-type impurity concentrations in P-type guiding layer 50 is approximately $3 \times 10^{17}$ cm$^{-3}$, and impurities are doped so that a P-type impurity concentration on a side closer to well layer 41 decreases, it is possible to reduce the increase in potential barrier while reducing the series resistance in a state in which the waveguide loss is small.

Furthermore, by causing the Al composition of P-type guiding layer 50 to be relatively higher than the Al composition of N-type guiding layer 30, it is possible to achieve the above-described effect. Specifically, if the Al composition of P-type guiding layer 50 is caused to be higher than the Al composition of N-type guiding layer 30 by 0.02, the potential barrier increases by 0.03 eV, and it is possible to decrease the electron current flowing through P-type guiding layer 50 by approximately at least 50%. Moreover, if the Al composition of P-type guiding layer 50 is caused to be 0.27 that is higher than the Al composition of N-type guiding layer 30 by 0.03, it is possible to increase the potential barrier to at least 0.27 eV; and if the Al composition of P-type guiding layer 50 is caused to be 0.29 that is higher than the Al composition of N-type guiding layer 30 by 0.05, it is possible to increase the potential barrier to at least 0.30 eV.

Furthermore, by causing well layer 41 to have a thickness of at least 8 nm, the Al composition of P-type cladding layer 60 to be higher than the Al composition of N-type cladding layer 20, and the Al composition of P-type guiding layer 50 to be higher than the Al composition of N-type guiding layer 30, it is possible to cause the light distribution to be lean to the N-type semiconductor layer and reduce leakage of light to P-type cladding layer 60 while increasing the factor for confining light to well layer 41. As a result, it is possible to obtain a semiconductor laser device that has a high thermal saturation level, favorable temperature characteristics, and a high polarization ratio.

Figure 15A:
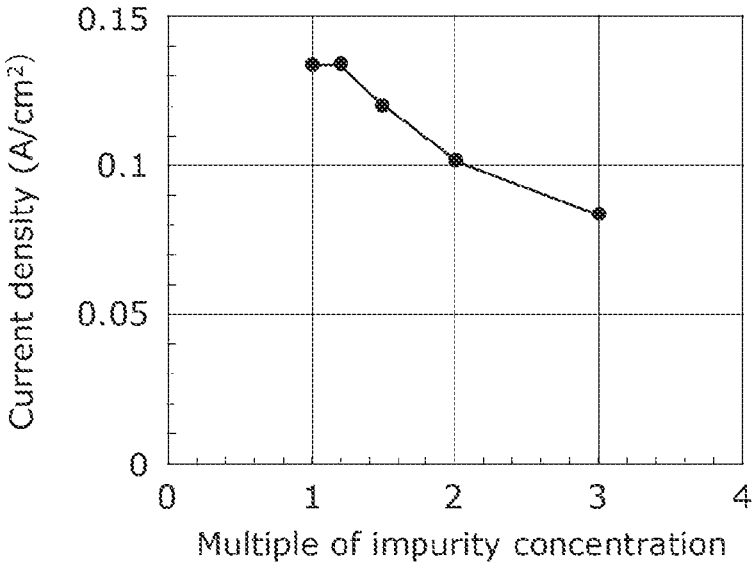
FIG. 15A is a diagram illustrating an N-type impurity concentration dependence of a hole current density at a position at a distance of 100 nm from an N-side interface of a well layer in the semiconductor laser device according to the embodiment.
Figure 15B:
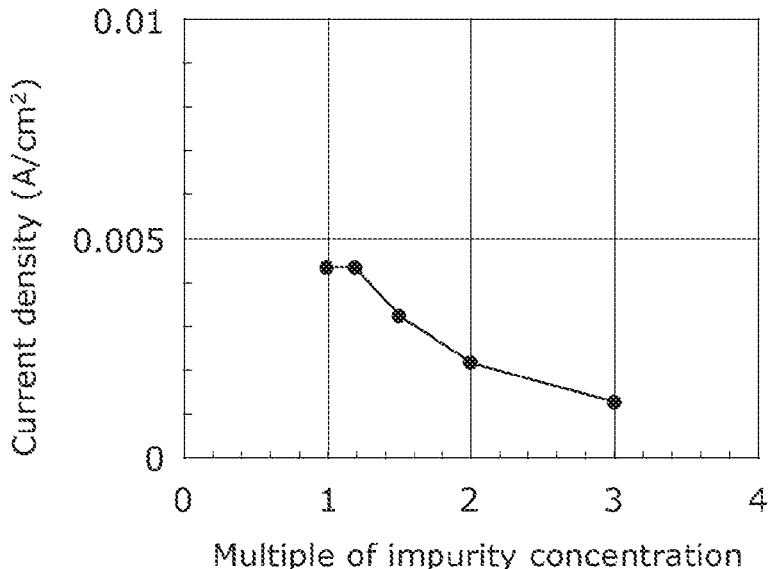
FIG. 15B is a diagram illustrating an N-type impurity concentration dependence of a hole current density at a position of an interface of an N-type cladding layer on a substrate side in the semiconductor laser device according to the embodiment.
Figure 16A:
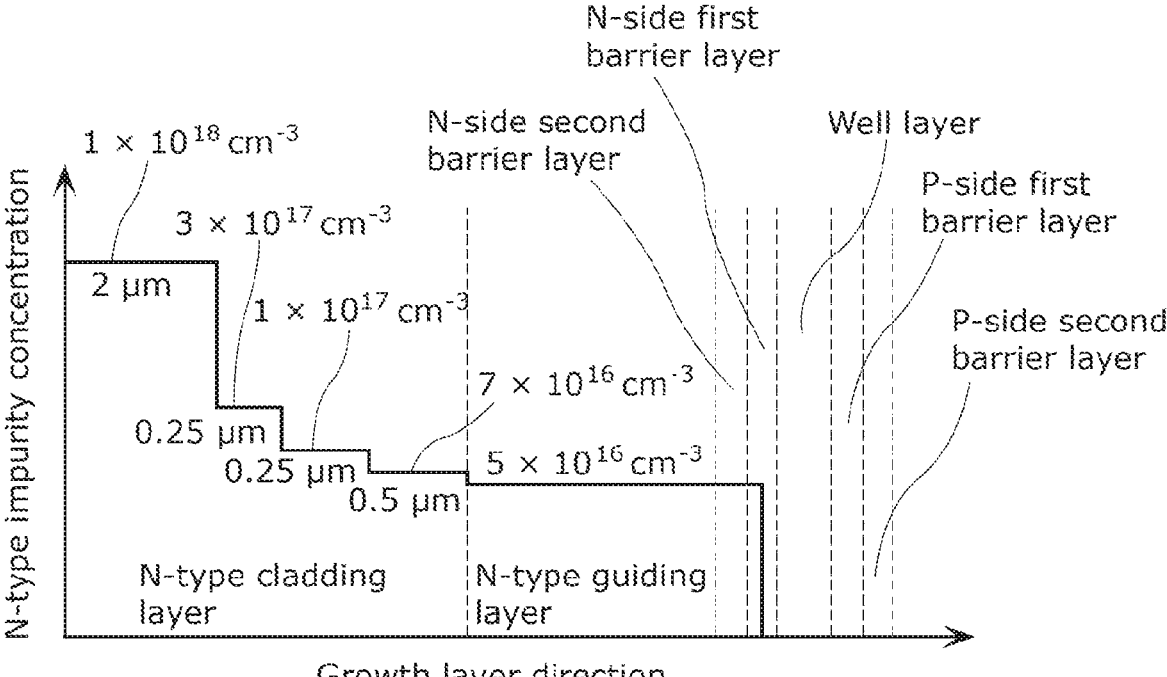
FIG. 16A is a diagram showing the first example of an N-type impurity concentration distribution in an N-type semiconductor layer, in the semiconductor laser device according to the embodiment.

Next, an influence of an N-type impurity concentration on hole leakage current will be described with reference to FIG. 15A, FIG. 15B, FIG. 16A, and FIG. 16B. FIG. 15A shows an N-type impurity concentration dependence of a hole current density at a position at a distance of 100 nm from an N-side interface of well layer 41 in semiconductor laser device 1 according to the present embodiment. FIG. 15B shows an N-type impurity concentration dependence of a hole current density at a position of an interface of an N-type cladding layer on a substrate side in semiconductor laser device 1 according to the present embodiment. FIG. 16A shows an example of an N-type impurity concentration distribution in an N-type semiconductor layer, in semiconductor laser device 1 according to the present embodiment. FIG. 16 shows another example of the N-type impurity concentration distribution in the N-type semiconductor layer.

In this structure, an impurity concentration at P-type impurity doping start position P1 in P-side first barrier layer 43*a* is $1 \times 10^{17}$ cm$^{-3}$, and P-type impurities are doped so that a P-type impurity concentration at position P2 in P-type guiding layer 50 on a side away from well layer 41 increases aslope from $1 \times 10^{17}$ cm$^{-3}$ to $1 \times 10^{18}$ cm$^{-3}$. Moreover, P-type cladding layer 60 is doped with the P-type impurities of $2 \times 10^{18}$ cm$^{-3}$.

If the P-type impurity concentration at position P2 is increased, it is possible to reduce ineffective current due to a decrease in electron current flowing through P-type guiding layer 50. Here, if the P-type impurity concentration at position P2 is increased, the potential barrier increases and the series resistance of semiconductor laser device 1 also decreases. In addition, since the P-type impurity concentration slopes in P-type guiding layer 50, an increase in waveguide loss is reduced even if the P-type impurity concentration at position P2 is increased.

Accordingly, by causing an average value of concentrations of P-type impurities with which entire P-type guiding layer 50 is doped to be in a range from $2 \times 10^{17}$ cm$^{-3}$ to $4 \times 10^{17}$ cm$^{-3}$, it is possible to reduce the waveguide loss, the series resistance of semiconductor laser device 1, and leakage electron current, and to increase the potential barrier.

Moreover, since the N-type semiconductor layer is doped with N-type impurities so that a light distribution in the vertical direction is lean to the N-type semiconductor layer, the doping is performed so that the N-type impurity concentration increases in a direction away from well layer 41. In the case shown in FIG. 16A, N-type guiding layer 30 and a region ranging from N-side first barrier layer 42 at a position at a distance of at least 5 nm from well layer 41 to N-type guiding layer 30 in a direction toward substrate 10 are doped with N-type impurities of $5 \times 10^{16}$ cm$^{-3}$, and an impurity concentration is increased by doping N-type guiding clad layer 20 with impurities of $7 \times 10^{16}$ cm$^{-3}$ (thickness: 0.25 μm), $1 \times 10^{17}$ cm$^{-3}$ (thickness: 0.25 μm), $3 \times 10^{17}$ cm$^{-3}$ (thickness: 0.5 μm), and $1 \times 10^{18}$ cm$^{-3}$ (thickness: 2 μm) in multiple stages from the side closest to well layer 41 toward the side farthest from well layer 41. It should be noted that if N-type cladding layer 20 is doped with N-type impurities in multiple stages, among adjacent regions having different impurity concentrations in N-type cladding layer 20, a region farthest from well layer 41 is thickest, and among the other regions, a region closer to well layer 41 has a thickness less than or equal to a thickness of a region farther from well layer 41. This is because in the region farthest from well layer 41 and having the highest impurity concentration in N-type cladding layer 20, a light-distributed intensity in the vertical direction attenuates, and an influence of free carrier loss is small even if the impurity concentration is increased, which do not lead to an increase in waveguide loss, and make it possible to produce the effect of reducing the series resistance of semiconductor laser device 1.

Furthermore, the light-distributed intensity in the vertical direction in N-type cladding layer 20 and a rate of change of attenuation of the intensity increase with the decreasing distance from well layer 41. In view of this, in order to avoid an increase in waveguide loss due to an increase in impurity concentration, it is desirable that a thickness of a region closer to well layer 41 and included in regions each having a constant concentration be decreased if an impurity concentration is increased in multiple stages in a region in which a light distribution in the vertical direction does not sufficiently attenuate.

With this N-type impurity concentration profile being as a standard and concentrations each being as a multiple of 1, 1.2, 1.5, 2, and 3, FIG. 15A shows calculation results of a hole current density at a position at a distance of 100 nm from the N-side interface of well layer 41, and FIG. 15B shows calculation results of a hole current density at a position in an interface of the N-type cladding layer on the substrate side.

As shown in FIG. 15A and FIG. 15B, it is clear that the hole current density decreases with an increase in N-type impurity concentration, and hole current leaking to and flowing through the N-type semiconductor layer over well layer 41 is reduced.

Moreover, since the series resistance of semiconductor laser device 1 is reduced by increasing the N-type impurity concentration, it is also possible to reduce operating current of semiconductor laser device 1. Furthermore, since a light distribution is caused to be lean to the N-type semiconductor layer so that a ratio of the light distribution is highest in N-type guiding layer 30, by causing the N-type impurity concentration of N-type guiding layer 30 to be lower than the N-type impurity concentrations of the other N-type semiconductor layers, it is possible to reduce waveguide loss. In view of this, by causing the N-type impurity doping profile to fit the pattern shown in FIG. 16, it is possible to reduce both the series resistance of semiconductor laser device 1 and the waveguide loss at the same time.

Figure 16B:
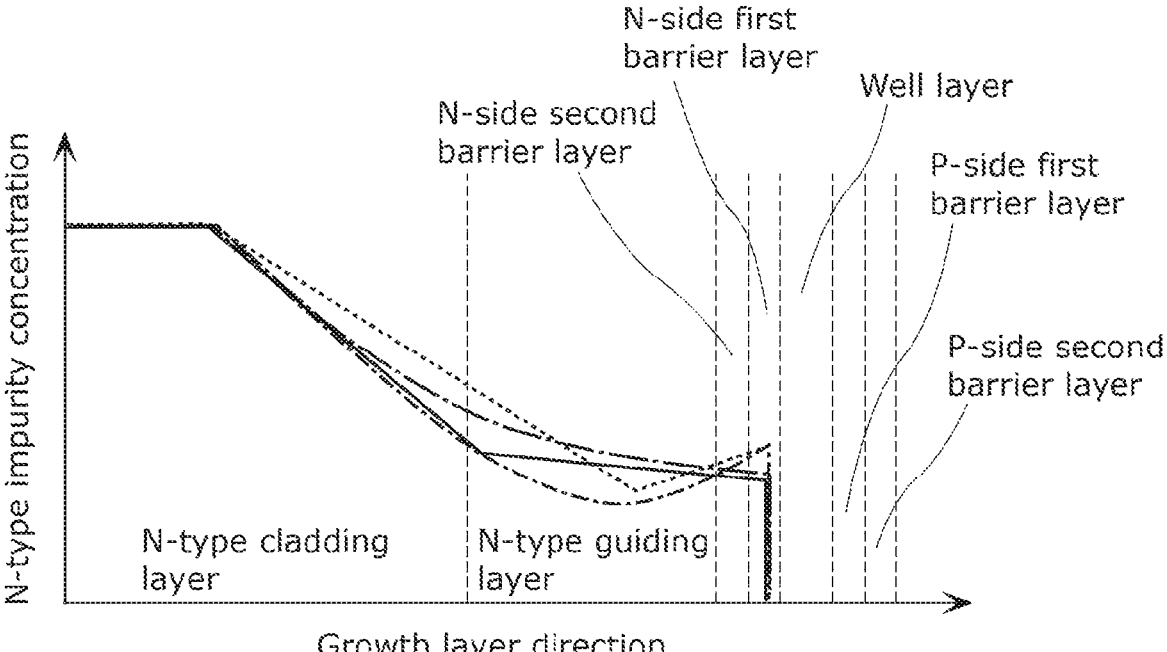
FIG. 16B is a diagram showing the second example of the N-type impurity concentration distribution in the N-type semiconductor layer, in the semiconductor laser device according to the embodiment.

It should be noted that although the N-type impurity doping profile is changed stepwise as shown in FIG. 16A, an N-type impurity concentration on the substrate 10 side may be caused to increase continuously as shown by the solid line in FIG. 16B. Moreover, it is possible to further reduce the waveguide loss by, as shown by the broken line in FIG. 16B, decreasing an N-type impurity concentration at a position at which a light-distributed intensity is highest in N-type guiding layer 30, and causing the N-type impurity concentration to increase continuously or stepwise from the position toward the substrate 10 side. It should be noted that an N-type impurity concentration may be changed non-linearly as shown by the alternate long and short dash line in FIG. 16B.

Figure 16C:
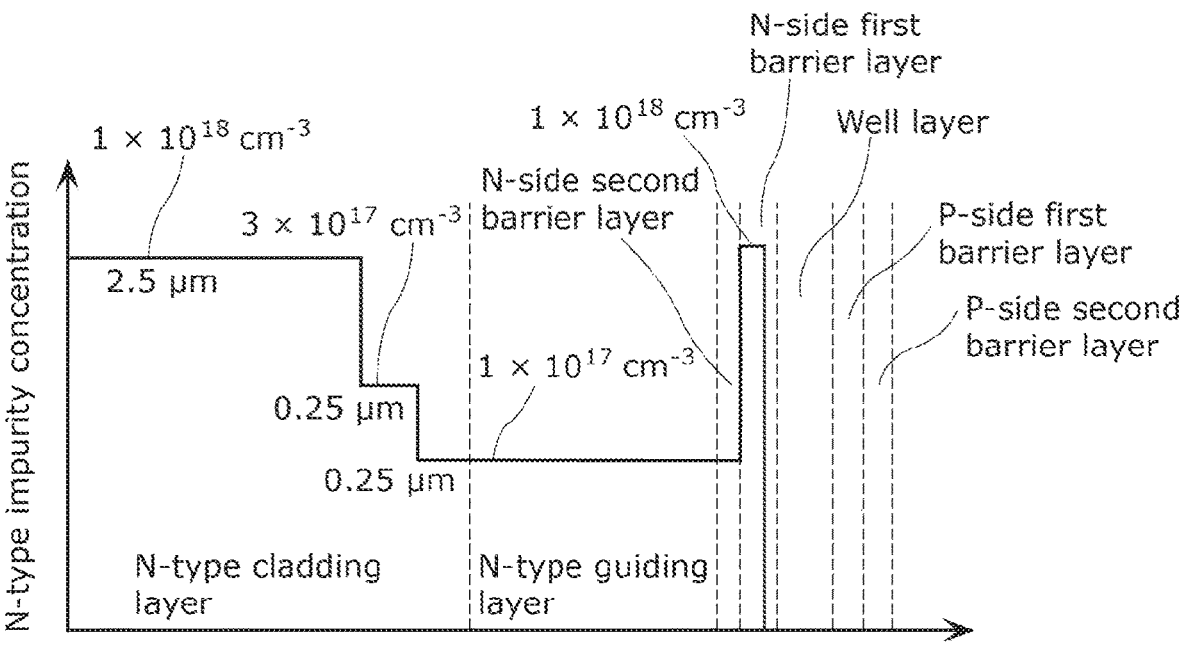
FIG. 16C is a diagram showing the third example of the N-type impurity concentration distribution in the N-type semiconductor layer, in the semiconductor laser device according to the embodiment.

Furthermore, as shown in FIG. 16C, an N-type impurity concentration may be caused to increase in stages from well layer 41 toward substrate 10 by causing an impurity concentration of N-side second barrier layer 42b to be lower than a doping concentration of N-side first barrier layer 42a by increasing a concentration of impurities with which N-side first barrier layer 42a is doped.

In this case, the concentration of the impurities with which N-side first barrier layer 42a is doped may be in a range from $5 \times 10^{17}$ cm$^{-3}$ to $1 \times 10^{18}$ cm$^{-3}$. Accordingly, a potential in a valance band of N-side first barrier layer 42a decreases, and it is possible to reduce a leakage of hole current caused by holes injected to well layer 41 leaking to an N-type layer side, and to further improve the high-temperature high-output operation of semiconductor laser device 1. Moreover, as with the impurity concentration of N-side first barrier layer 42a, an N-type impurity concentration of N-side second barrier layer 42b may be caused to be higher than an N-type impurity concentration of N-type guiding layer 30. However, since this involves an increase in waveguide loss, it is possible to reduce a leakage of hole current in N-side second barrier layer 42b even if an N-type impurity concentration of a region at a distance of at most 10 nm from the vicinity of an interface between N-side second barrier layer 42b and N-side first barrier layer 42a.

Furthermore, if the doping concentration of N-side first barrier layer 42 is increased, an atomic exchange with well layer 41 via N-type impurities can easily occur even when a temperature in a thermal annealing step for forming a window portion is decreased in the case where a window region is formed by vacancy diffusion or ion injection, and it is possible to produce an effect of causing band gap energy of the window portion in well layer 41 to easily increase.

Figure 16D:
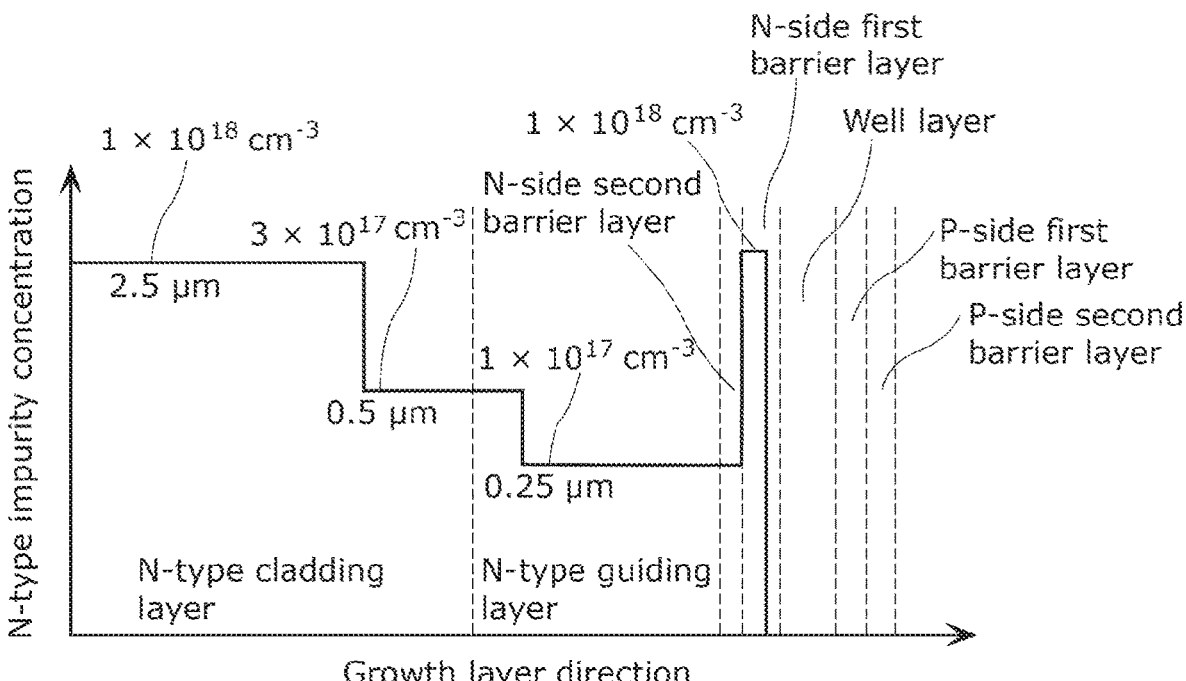
FIG. 16D is a diagram showing the fourth example of the N-type impurity concentration distribution in the N-type semiconductor layer, in the semiconductor laser device according to the embodiment.

In addition, as shown in FIG. 16D, doping N-type guiding layer 30 with N-type impurities may be increased in stages from the vicinity of an interface with N-type cladding layer 20 toward the substrate 10 side. Since a portion having the highest light intensity in the light distribution perpendicular to the substrate normal direction is in a region of N-type guiding layer 30 on the well layer 41 side in the optical waveguide in which an N-type light distribution is lean to the N-type semiconductor layer, it is possible to reduce an increase in waveguide loss in N-type guiding layer 30 if a region having the lowest N-type impurity concentration is in the region of N-type guiding layer 30 on the well layer 41 side.

In the examples shown in FIG. 16A to FIG. 16D, if the minimum value of the N-type impurity concentration in N-type guiding layer 30 is at least $5 \times 10^{16}$ cm$^{-3}$ and at most $3 \times 10^{17}$ cm$^{-3}$, it is possible to produce all the effects of reducing an increase in waveguide loess, reducing the occurrence of hole leakage current, and reducing an increase in series resistance of semiconductor laser device 1. Moreover, a ratio of light in a region of N-type cladding layer 20 at a distance of at least 1 μm from the interface between N-type guiding layer 30 and N-type cladding layer 20 toward the substrate 10 side is low even if the N-type impurity concentration of N-type cladding layer 20 on the substrate 10 side is increased, an increase in waveguide loss is small. Accordingly, in order to reduce the series resistance of semiconductor laser device 1, it is desirable that the N-type impurity concentration of the region of N-type cladding layer 20 at the distance of at least 1 μm from the interface between N-type guiding layer 30 and N-type cladding layer 20 toward the substrate 10 side be high to such an extent that a mobility does not decrease, for example, be at least $1 \times 10^{18}$ cm$^{-3}$ and at most $3 \times 10^{18}$ cm$^{-3}$.

Furthermore, the N-type impurity concentrations of N-side second barrier layer 42b, N-type guiding layer 30, and N-type cladding layer 20 may be continuously changed as shown in FIG. 16B while increasing the N-type impurity concentration of N-side first barrier layer 42a as shown in FIG. 16C and FIG. 16D. Additionally, even if a region whose N-type impurity concentration is increased in the vicinity of well layer 41 includes not only a portion of N-side first barrier layer 42a but also a portion of N-side second barrier layer 42b, as long as the region has a thickness of at least 10 nm, it is possible to reduce the series resistance of semiconductor laser device 1 and further reduce a leakage of the hole current while reducing an increase in waveguide loss.

Figure 17:
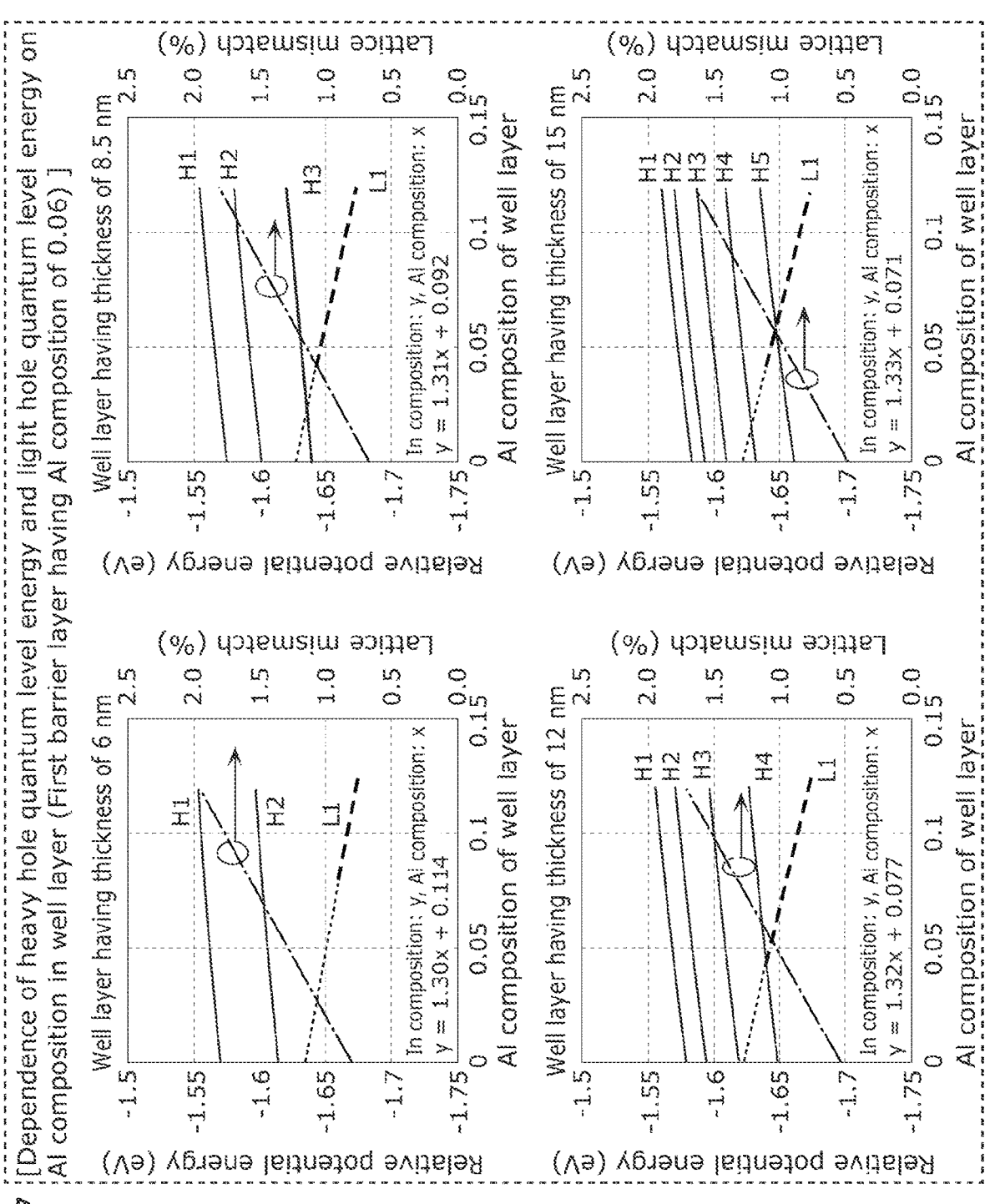
FIG. 17 is a diagram illustrating a dependence of heavy hole quantum level energy and light hole quantum level energy on Al composition in a well layer, if a P-side first barrier layer and an N-side second barrier layer have an Al composition of 0.06.
Figure 18:
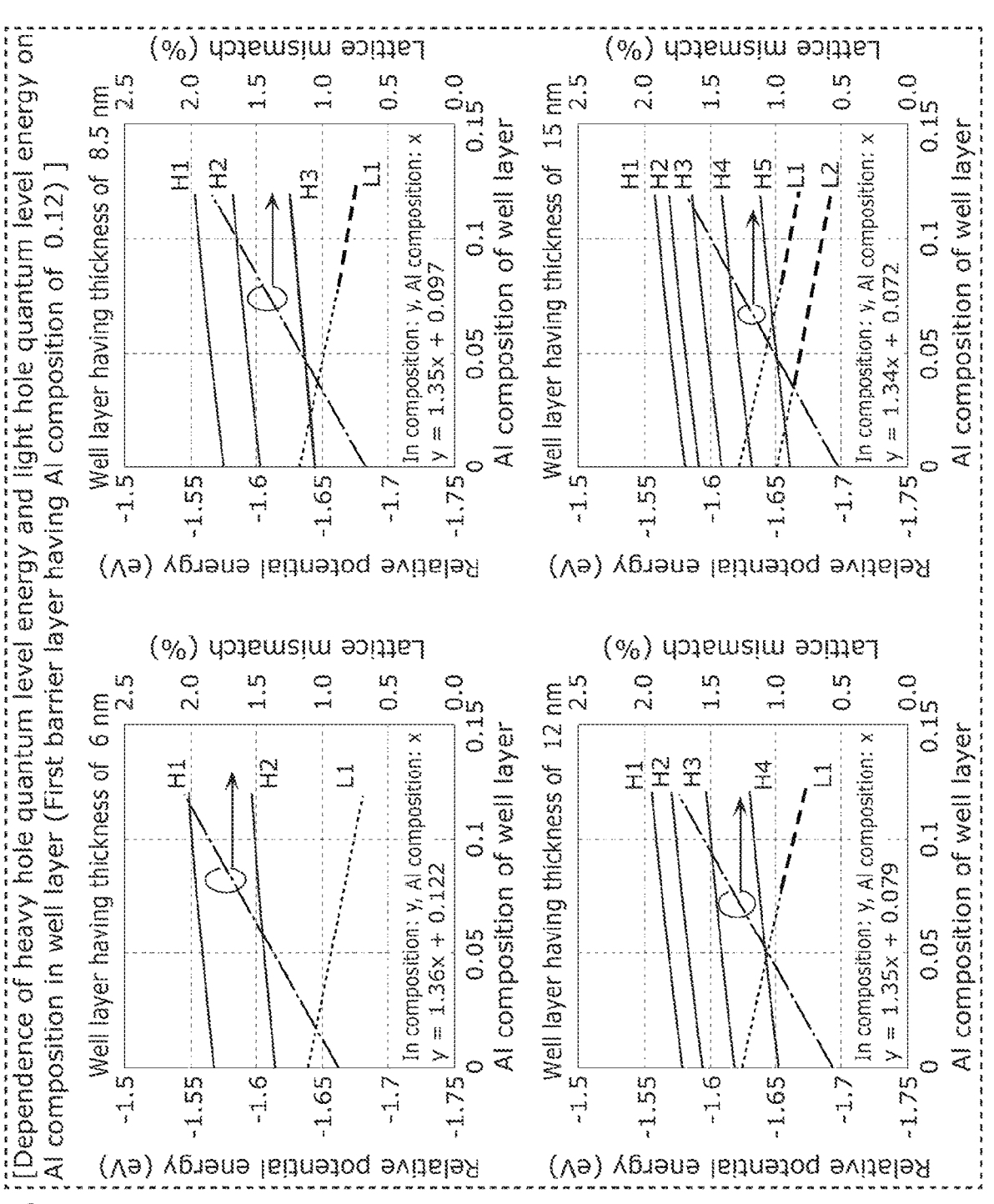
FIG. 18 is a diagram illustrating a dependence of heavy hole quantum level energy and light hole quantum level energy on Al composition in a well layer, if a P-side first barrier layer and an N-side second barrier layer have an Al composition of 0.12.
Figure 19:
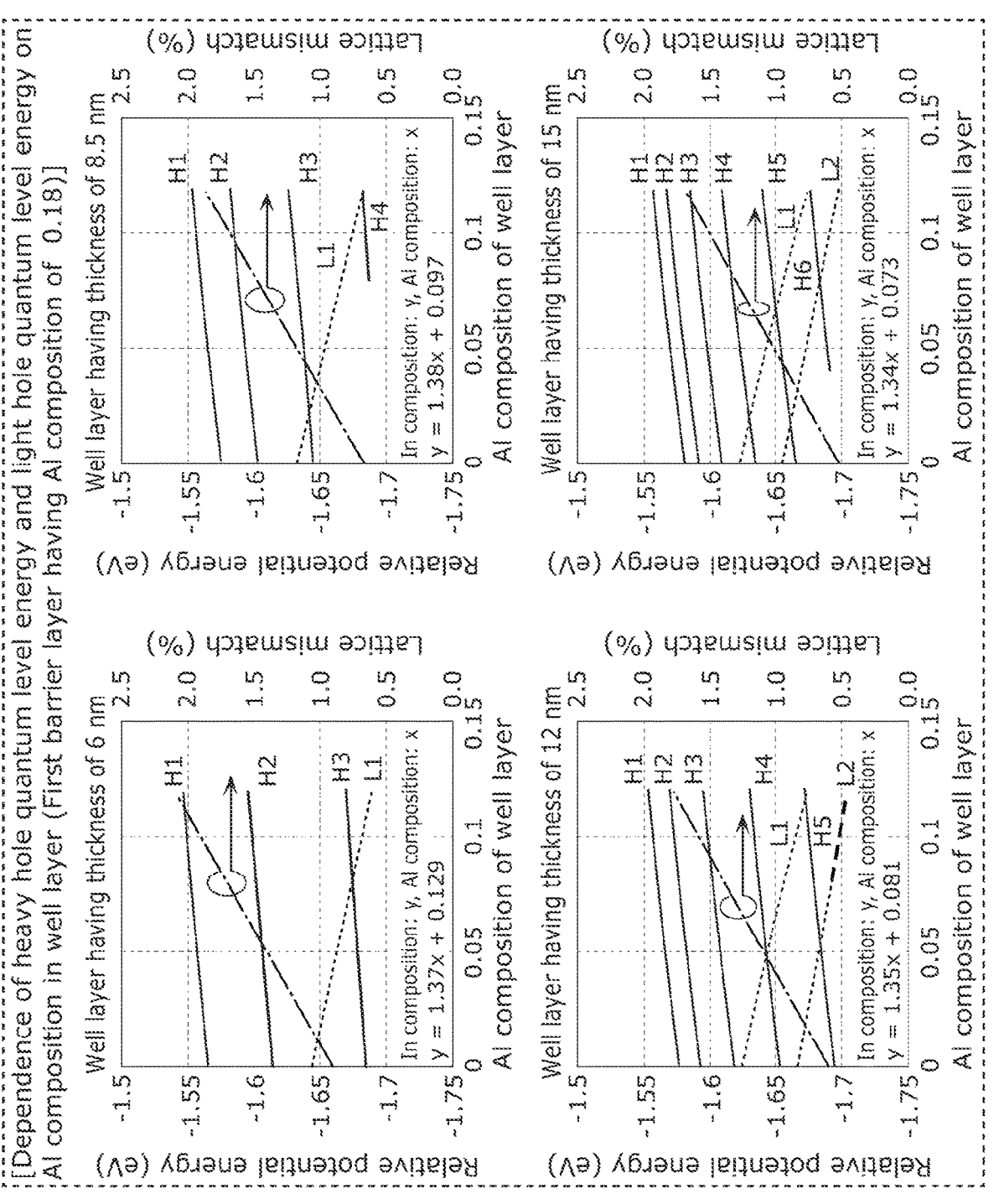
FIG. 19 is a diagram illustrating a dependence of heavy hole quantum level energy and light hole quantum level energy on Al composition in a well layer, if a P-side first barrier layer and an N-side second barrier layer have an Al composition of 0.18.

Next, a quantum well structure of well layer 41 of active layer 40 was examined. The following describes the examination results with reference to FIG. 17 to FIG. 19. FIG. 17 to FIG. 19 each are a diagram illustrating a dependence of heavy hole quantum level energy and light hole quantum level energy on Al composition in a well layer.

FIG. 17 shows calculation results of a dependence of relative potential energy of a heavy hole (HH) level and a light hole (LH) level on Al composition in well layer 41, if the thickness of well layer 41 is set to 6 nm, 8.5 nm, 12 nm, and 15 nm in the case where P-side first barrier layer 43a and N-side first barrier layer 42a are represented by $Al_{0.06}Ga_{0.94}As$ and have a thickness of 15 nm, P-side second barrier layer 43b and N-side second barrier layer 42b are represented by $Al_{0.24}Ga_{0.76}As$ and have a thickness of 15 nm, and well layer 41 is represented by $Al_XGa_{1-X-Y}In_YAs$. Here, an electron level, an HH level, and an LH level are denoted as En, Hn, and Ln, respectively. In addition, n is a natural number, and a ground level is 1. In those calculations, an energy difference between E1 and H1 is kept constant (1.35 eV) in order to obtain the same oscillation wavelength in a wavelength band of 915 nm. It should be noted that FIG. 17 shows relations between In composition Y and Al composition X for obtaining the same oscillation wavelength if Al composition X of well layer 41 is changed. Additionally, a lattice misfit with a GaAs substrate in well layer 41 having each Al composition is shown by an alternate long and short dash line.

Here, a magnitude relationship of potential energy with an electron level is opposite to a magnitude relationship of potential energy with a hole level. In the calculation results shown in FIG. 17, if potential energies between levels are relatively compared, it is interpreted that a level having the largest relative potential energy (located in the uppermost part of the graph) has the lowest potential relative to holes.

As shown in FIG. 17, if well layer 41 has a thickness of 6 nm, two HH levels having relatively lower potential energy than L1 are formed. For this reason, if holes are injected into well layer 41, H1, H2, and L1 are filled with the holes in sequence in order of increasing potential energy.

Here, since the compression strain of well layer 41 increases if the Al composition of well layer 41 is increased, the HH level changes in a direction in which the potential energy of the holes is low, and the LH level changes in a direction in which the potential energy of the holes is high. In view of this, the more the compression strain is increased by increasing the Al composition of well layer 41, the larger the energy difference between H1 and L1 becomes, the more easily holes are located in H1 having the lowest hole potential energy among HH, and conversely the less easily holes are located in L1 having the highest hole potential energy among LH. This indicates that if the compression strain is increased by increasing the Al composition of well layer 41, the number of holes in HH level increases, and the number of holes in LH level decreases. Since LH contributes to the generation of TM mode light having a polarization direction in the substrate normal direction in oscillated laser light, an increase in the number of holes in LH level leads to a decrease in polarization ratio (TE/(TE+TM)). Accordingly, it is clear that it is possible to increase a polarization ratio by increasing the compression strain by increasing the Al composition of well layer 41.

Moreover, since two HH levels having potential energy lower than the potential energy of LH are formed if well layer 41 has a thickness of 6 nm, holes can be preferentially located in the HH levels, and it is possible to obtain laser light having many TE mode components and a high polarization ratio.

In a result in the case where well layer 41 has a thickness of 8.5 nm, the hole potential energy of the LH level is greater than energy in a valance band of a first barrier layer if well layer 41 has an Al composition of at least 0.08, an LH quantum level is not formed in a quantum well formed by P-side first barrier layer 43a, N-side first barrier layer 42a, and well layer 41, and a quantum level for which P-side second barrier layer 43b and N-side second barrier layer 42b serve as a barrier layer is formed. In this case, since a state density of the quantum level is in inverse proportion to the thickness of the quantum well structure, a state density of L1 further decreases, and an effect of increasing a polarization ratio increases. This state is indicated by the thick broken line of L1 in each graph shown in FIG. 17. As shown in FIG. 17, it is clear that if well layer 41 is caused to have a thickness of at least 8.5 nm, LH is not formed in P-side first barrier layer 43a and N-side first barrier layer 42a in the case where well layer 41 has an Al composition of at least 0.04, and the thicker well layer 41 is, the more LH is not formed in P-side first barrier layer 43a and N-side first barrier layer 42a in a state in which a lattice misfit of well layer 41 is low. In addition, it is clear that the HH level having lower hole potential energy than L1 increases with an increase in thickness of well layer 41, and the number of holes in L1 easily decreases.

As shown in FIG. 17, if well layer 41 is caused to have a thickness of at least 8.5 nm, the number of HH levels having lower hole potential energy than L1 in the case where well layer 41 has an Al composition of at least 0.04 is three, and it is possible to decrease the number of LHs in the LH level, which is effective to increase a polarization ratio.

Moreover, if well layer 41 is caused to have a thickness of at least 12 nm, the number of HH levels having lower hole potential energy than L1 in the case where well layer 41 has an Al composition of at least 0 is three, and it is possible to decrease the number of LHs in the LH level, which is effective to increase a polarization ratio.

It should be noted that since well layer 41 has a high refractive index, a factor for confining light to well layer 41 increases with an increase in thickness of well layer 41, and since a threshold carrier density necessary for laser oscillation is decreased, the number of holes in L1 decreases, and a polarization ratio increases.

Since P-side first barrier layer 43a and N-side first barrier layer 42a have a low Al composition and a higher refractive index than P-side second barrier layer 43b, N-side second barrier layer 42b, N-type guiding layer 30, N-type cladding layer 20, P-type guiding layer 50, and P-type cladding layer 60 do, a factor for confining light to well layer 41 increases with an increase in thickness of P-side first barrier layer 43a and N-side first barrier layer 42a. Additionally, since a threshold carrier density necessary for laser oscillation is decreased, the number of holes in L1 decreases, and a polarization ratio increases. For example, causing a total thickness of P-side first barrier layer 43a and N-side first barrier layer 42a to be at least 20 nm has an effect on an increase in optical confinement factor. In this regard, however, since increasing the total thickness excessively causes an increase in factor for confining light to well layer 41, which results in a decrease in COD level, the total thickness may be at most 80 nm.

FIG. 18 shows calculation results of a dependence of relative potential energy of a heavy hole (HH) level and a light hole (LH) level on Al composition in well layer 41, when the thickness of well layer 41 is set to 6 nm, 8.5 nm, 12 nm, and 15 nm in the case where P-side first barrier layer 43a and N-side first barrier layer 42a are represented by $Al_{0.12}Ga_{0.88}As$ and have a thickness of 15 nm, P-side second barrier layer 43b and N-side second barrier layer 42b are represented by $Al_{0.24}Ga_{0.76}As$ and have a thickness of 15 nm, and well layer 41 is represented by $Al_XGa_{1-X-Y}In_YAs$. Here, as with FIG. 17, an electron level, an HH level, and an LH level are denoted as En, Hn, and Ln, respectively. In addition, n is a natural number, and a ground level is 1. In those calculations, an energy difference between E1 and H1 is kept constant (1.35 eV) in order to obtain the same oscillation wavelength in a wavelength band of 915 nm. It should be noted that FIG. 18 shows relations between In composition Y and Al composition X for obtaining the same oscillation wavelength if Al composition X of well layer 41 is changed. Additionally, a lattice misfit with a GaAs substrate in well layer 41 having each Al composition is shown by an alternate long and short dash line.

As shown in FIG. 18, if well layer 41 has a thickness of 6 nm, two HH levels having relatively lower potential energy than L1 are formed. For this reason, as with the above description, if holes are injected into well layer 41, H1, H2, and L1 are filled with the holes in sequence in order of increasing potential energy.

Here, since the compression strain of well layer 41 increases if the AI composition of well layer 41 is increased, the HH level changes in a direction in which the potential energy of the holes is low, and the LH level changes in a direction in which the potential energy of the holes is low. In view of this, the more the compression strain is increased by increasing the AI composition of well layer 41, the larger the energy difference between H1 and L1 becomes, the more easily holes are located in H1 having the lowest hole potential energy among HH, and conversely the less easily holes are located in L1 having the highest hole potential energy among LH. This indicates that if the compression strain is increased by increasing the AI composition of well layer 41, the number of holes in HH level increases, and the number of holes in LH level decreases. Since LH contributes to the generation of TM mode light having a polarization direction in the substrate normal direction in oscillated laser light, an increase in the number of holes in LH level leads to a decrease in polarization ratio (TE/(TE+TM)). Accordingly, it is clear that it is possible to increase a polarization ratio by increasing the compression strain by increasing the AI composition of well layer 41.

Moreover, since two HH levels having potential energy lower than the potential energy of LH are formed if well layer 41 has a thickness of 6 nm, holes can be preferentially located in the HH levels, and it is possible to obtain laser light having many TE mode components and a high polarization ratio.

In a result in the case where well layer 41 has a thickness of 8.5 nm, the hole potential energy of the LH level is higher than energy in a valance band of a first barrier layer if well layer 41 has an AI composition of at least 0.08, an LH quantum level is not formed in a quantum well formed by P-side first barrier layer 43a, N-side first barrier layer 42a, and well layer 41, and a quantum level for which P-side second barrier layer 43b and N-side second barrier layer 42b serve as a barrier layer is formed. In this case, since a state density of the quantum level is in inverse proportion to the thickness of the quantum well structure, a state density of L1 further decreases, and an effect of increasing a polarization ratio increases. This state is indicated by the thick broken line of L1 or L2 in each graph shown in FIG. 18. As shown in FIG. 18, it is clear that if well layer 41 is caused to have a thickness of at least 8.5 nm, LH is not formed in P-side first barrier layer 43a and N-side first barrier layer 42a in the case where well layer 41 has an AI composition of at least 0.08, and the thicker well layer 41 is, the more LH is not formed in P-side first barrier layer 43a and N-side first barrier layer 42a in a state in which a lattice misfit of well layer 41 is low. In addition, it is clear that the HH level having lower hole potential energy than L1 increases with an increase in thickness of well layer 41, and the number of holes in L1 easily decreases.

As shown in FIG. 18, if well layer 41 is caused to have a thickness of at least 8.5 nm, the number of HH levels having lower hole potential energy than L1 in the case where well layer 41 has an AI composition of at least 0.02 is three, and it is possible to decrease the number of LHs in the LH level, which is effective to increase a polarization ratio.

Moreover, if well layer 41 is caused to have a thickness of at least 12 nm, the number of HH levels having lower hole potential energy than L1 in the case where well layer 41 has an AI composition of at least 0.00 is three, and it is possible to decrease the number of LHs in the LH level, which is effective to increase a polarization ratio.

It should be noted that since well layer 41 has a high refractive index, a factor for confining light to well layer 41 increases with an increase in thickness of well layer 41, and since a threshold carrier density necessary for laser oscillation is decreased, the number of holes in L1 decreases, and a polarization ratio increases.

Since P-side first barrier layer 43a and N-side first barrier layer 42a have a low AI composition and a higher refractive index than P-side second barrier layer 43b, N-side second barrier layer 42b, N-type guiding layer 30, N-type cladding layer 20, P-type guiding layer 50, and P-type cladding layer 60 do, a factor for confining light to well layer 41 increases with an increase in thickness of P-side first barrier layer 43a and N-side first barrier layer 42a. Additionally, since a threshold carrier density necessary for laser oscillation is decreased, the number of holes in L1 decreases, and a polarization ratio increases. For example, causing a total thickness of P-side first barrier layer 43a and N-side first barrier layer 42a to be at least 25 nm has an effect on an increase in optical confinement factor. In this regard, however, since increasing the total thickness excessively causes an increase in factor for confining light to well layer 41, which results in a decrease in COD level, the total thickness may be at most 90 nm.

FIG. 19 shows calculation results of a dependence of relative potential energy of a heavy hole (HH) level and a light hole (LH) level on AI composition in well layer 41, if the thickness of well layer 41 is set to 6 nm, 8.5 nm, 12 nm, and 15 nm in the case where P-side first barrier layer 43a and N-side first barrier layer 42a are represented by $Al_{0.18}Ga_{0.82}As$ and have a thickness of 15 nm, P-side second barrier layer 43b and N-side second barrier layer 42b are represented by $Al_{0.24}Ga_{0.76}As$ and have a thickness of 15 nm, and well layer 41 is represented by $Al_{X}Ga_{1-X-Y}In_{Y}As$. Here, as with FIG. 17, an electron level, an HH level, and an LH level are denoted as En, Hn, and Ln, respectively. In addition, n is a natural number, and a ground level is 1. In those calculations, an energy difference between E1 and H1 is kept constant (1.35 eV) in order to obtain the same oscillation wavelength in a wavelength band of 915 nm. It should be noted that FIG. 19 shows relations between In composition Y and AI composition X for obtaining the same oscillation wavelength if AI composition X of well layer 41 is changed. Additionally, a lattice misfit with a GaAs substrate in well layer 41 having each AI composition is shown by an alternate long and short dash line.

As shown in FIG. 19, if well layer 41 has a thickness of 6 nm, two HH levels having relatively lower potential energy than L1 are formed. For this reason, as with the above description, if holes are injected into well layer 41, H1, H2, and L1 are filled with the holes in sequence in order of increasing potential energy.

Here, since the compression strain of well layer 41 increases if the AI composition of well layer 41 is increased, the HH level changes in a direction in which the potential energy of the holes is low, and the LH level changes in a direction in which the potential energy of the holes is low. In view of this, as with the above description, the more the compression strain is increased by increasing the AI composition of well layer 41, the larger the energy difference between H1 and L1 becomes, the more easily holes are located in H1 having the lowest hole potential energy among HH, and conversely the less easily holes are located in L1 having the highest hole potential energy among LH. This indicates that if the compression strain is increased by increasing the Al composition of well layer 41, the number of holes in HH level increases, and the number of holes in LH level decreases. Since LH contributes to the generation of TM mode light having a polarization direction in the substrate normal direction in oscillated laser light, an increase in the number of holes in LH level leads to a decrease in polarization ratio (TE/(TE+TM)). Accordingly, it is clear that it is possible to increase a polarization ratio by increasing the compression strain by increasing the Al composition of well layer 41.

Moreover, since two HH levels having potential energy lower than the potential energy of LH are formed if well layer 41 has a thickness of 6 nm, holes can be preferentially located in the HH levels, and it is possible to obtain laser light having many TE mode components and a high polarization ratio.

As shown in FIG. 19, if well layer 41 is caused to have a thickness of at least 8.5 nm, the number of HH levels having lower hole potential energy than L1 in the case where well layer 41 has an Al composition of at least 0.02 is three, and it is possible to decrease the number of LHs in the LH level, which is effective to increase a polarization ratio.

Moreover, if well layer 41 is caused to have a thickness of at least 12 nm, the number of HH levels having lower hole potential energy than L1 in the case where well layer 41 has an Al composition of at least 0.00 is three, and it is possible to decrease the number of LHs in the LH level, which is effective to increase a polarization ratio.

It should be noted that since well layer 41 has a high refractive index, a factor for confining light to well layer 41 increases with an increase in thickness of well layer 41, and since a threshold carrier density necessary for laser oscillation is decreased, the number of holes in L1 decreases, and a polarization ratio increases.

Since P-side first barrier layer 43*a* and N-side first barrier layer 42*a* have a low Al composition and a higher refractive index than P-side second barrier layer 43*b*, N-side second barrier layer 42*b*, N-type guiding layer 30, N-type cladding layer 20, P-type guiding layer 50, and P-type cladding layer 60 do, a factor for confining light to well layer 41 increases with an increase in thickness of P-side first barrier layer 43*a* and N-side first barrier layer 42*a*. Additionally, since a threshold carrier density necessary for laser oscillation is decreased, the number of holes in L1 decreases, and a polarization ratio increases. For example, causing a total thickness of P-side first barrier layer 43*a* and N-side first barrier layer 42*a* to be at least 30 nm has an effect on an increase in optical confinement factor. In this regard, however, since increasing the total thickness excessively causes an increase in factor for confining light to well layer 41, which results in a decrease in COD level, the total thickness may be at most 100 nm.

As described with reference to FIG. 17 to FIG. 19 above, since at least the two HH levels having the potential energy lower than the potential energy of LH are formed if the Al composition of P-side first barrier layer 43*a* and N-side first barrier layer 42*a* ranges from 0.06 to 0.18, and the thickness of well layer 41 ranges from 6 nm to 15 nm, the holes can be preferentially located in the HH levels, and it is possible to obtain the laser light having many TE mode components and the high polarization ratio.

Moreover, if the Al composition of P-side first barrier layer 43*a* and N-side first barrier layer 42*a* ranges from 0.06 to 0.18, and the thickness of well layer 41 ranges from 8.5 nm to 15 nm, it is possible to increase the HH level having the potential energy lower than the hole potential energy of LH in an Al composition range of well layer 41 wider than well layer 41 having a thickness of 6 nm.

Furthermore, even if InGaAs having an Al composition of at least 0.02 in the case where well layer 41 has a thickness of 8.5 nm is used as well layer 41, or InGaAs having an Al composition of 0 in the case where well layer 41 has a thickness of 12 nm is used as well layer 41, it is possible to increase the number of HH levels having the potential energy lower than the hole potential energy to at least three, the number of LHs in L1 decreases, and it is possible to produce an effect of increasing a polarization ratio.

It should be noted that if the thickness of well layer 41 becomes greater than 15 nm, there is a possibility that a factor for confining light to well layer 41 increases, which results in a decrease in COD level. Moreover, if well layer 41 increases in thickness excessively in the case where the window region is formed in the vicinity of the end face of the resonator, wavelength conversion of a band gap in the window region into a short wavelength due to a group-III atomic exchange between (i) P-side first barrier layer 43*a* and N-side first barrier layer 42*a* and (ii) well layer 41 is reduced, and an effect of reducing the occurrence of COD is reduced. Furthermore, if well layer 41 decreases in thickness excessively, in a high-temperature annealing step at the time of forming a window, a wavelength of a band gap in a gain portion of well layer 41 in which window region 120 is not formed can be easily converted into a short wavelength, and the temperature characteristics of semiconductor laser device 1 deteriorate. Accordingly, it is desirable that well layer 41 have a thickness of at least 6 nm and at most 15 nm.

Moreover, although the Al composition of P-side first barrier layer 43*a* and N-side first barrier layer 42*a* including AlGaAs ranges from 0.06 to 0.16 in FIG. 17 to FIG. 19, if the Al composition of P-side first barrier layer 43*a* and N-side first barrier layer 42*a* is increased excessively, the factor for confining light to well layer 41 decreases, which results in the deterioration of the temperature characteristics of semiconductor laser device 1. Accordingly, it is desirable that P-side first barrier layer 43*a* and N-side first barrier layer 42*a* have an Al composition of at least 0.06 and at most 0.22.

Furthermore, since it is possible to reduce the leakage of electron current from well layer 41 to the P-type layer side and the leakage of hole current from well layer 41 to the N-type layer side by increasing the Al composition of N-side second barrier layer 42*b* and P-side second barrier layer 43*b* including AlGaAs, it is desirable that the Al composition be at least 0.24. However, since increasing the Al composition of N-side second barrier layer 42*b* and P-side second barrier layer 43*b* excessively results in an increase in operating voltage, it is desirable that the Al composition be at most 0.32.

In semiconductor laser device 1 according to the present embodiment, a resonator length is increased. Specifically, the resonator length of semiconductor laser device 1 is at least 2 mm.

By increasing the resonator length of semiconductor laser device 1 as above, thermal resistance of semiconductor laser device 1 is reduced, and heat dissipation is improved. As a result, it is possible to increase light output that is to be thermally saturated.

It should be noted that although increasing the resonator length of semiconductor laser device 1 may result in an increase in mirror loss of the resonator and a decrease in slope efficiency, in the present disclosure, since the waveguide loss is reduced by causing the light distribution to be lean to the N-type semiconductor layer, it is possible to reduce a decrease in slope efficiency even if the resonator length of semiconductor laser device 1 is increased, and to increase the maximum light output.

Variation

Although the semiconductor laser device and the method of manufacturing the same according to the present disclosure have been described above based on the embodiment, the present disclosure is not limited to the aforementioned embodiment.

Figure 20:
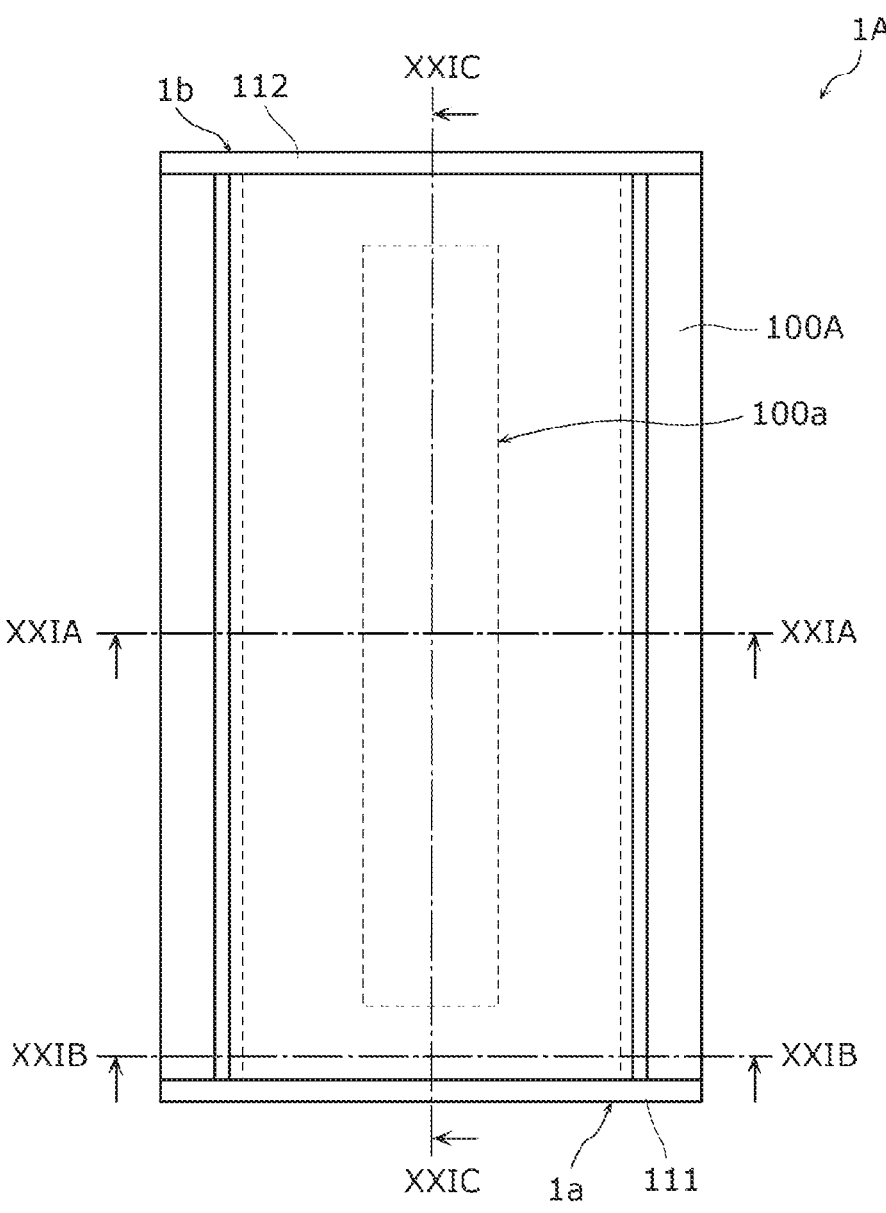
FIG. 20 is a top view of a semiconductor laser device according to a variation.
Figure 21A:
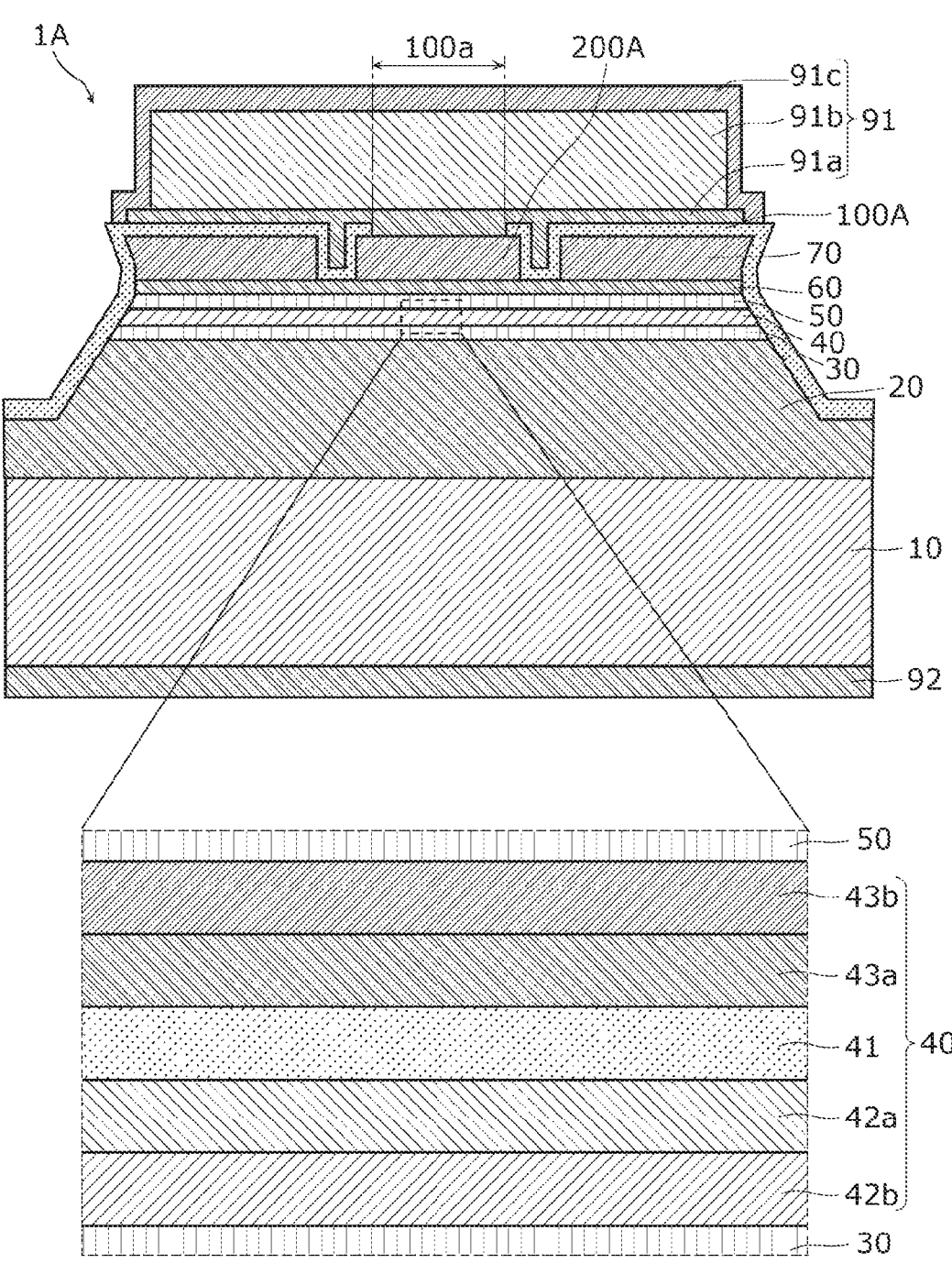
FIG. 21A is a cross-sectional view of the semiconductor laser device according to the variation, along line XXIA-XXIA shown in FIG. 20.
Figure 21B:
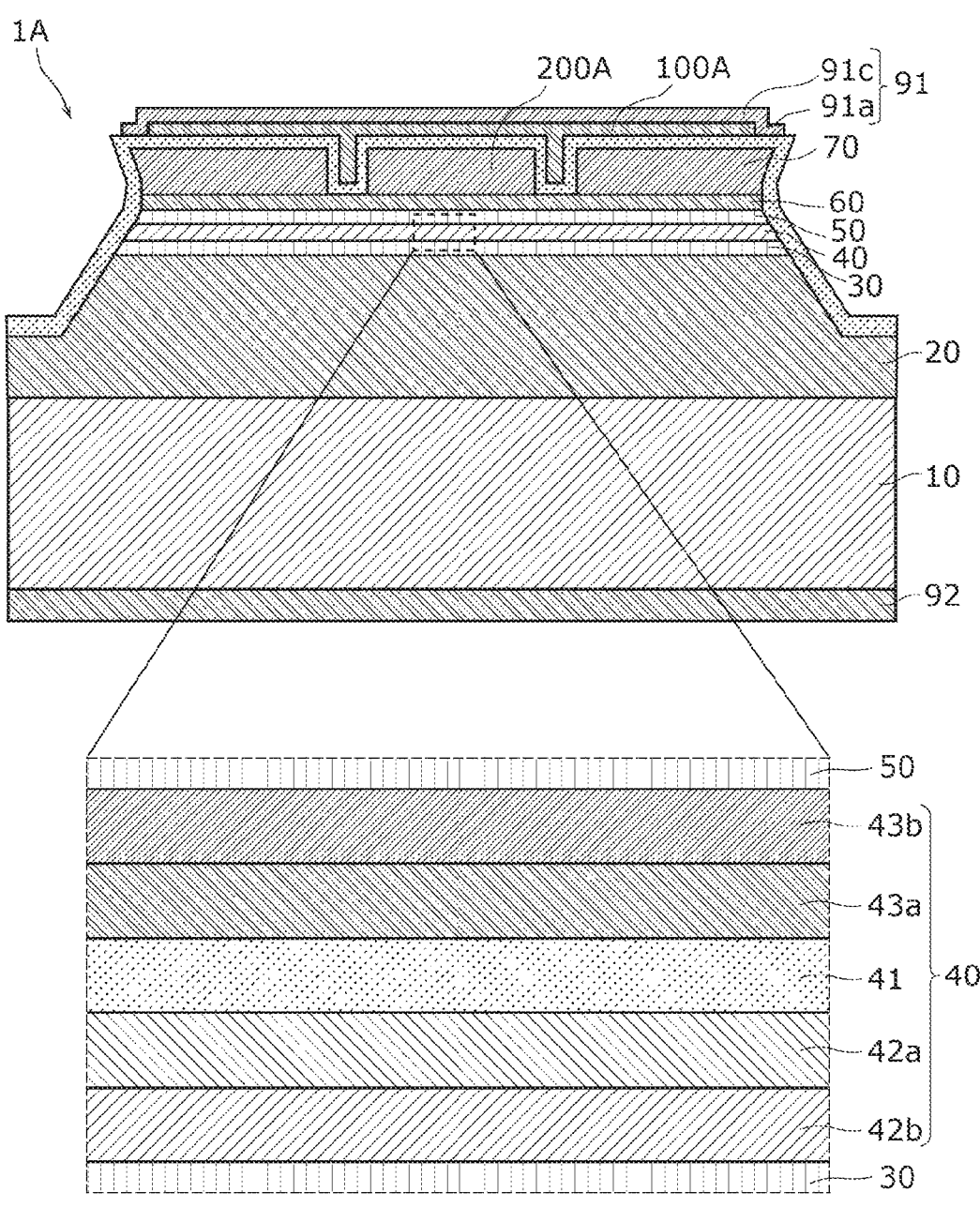
FIG. 21B is a cross-sectional view of the semiconductor laser device according to the variation, along line XXIB-XXIB shown in FIG. 20.
Figure 21C:
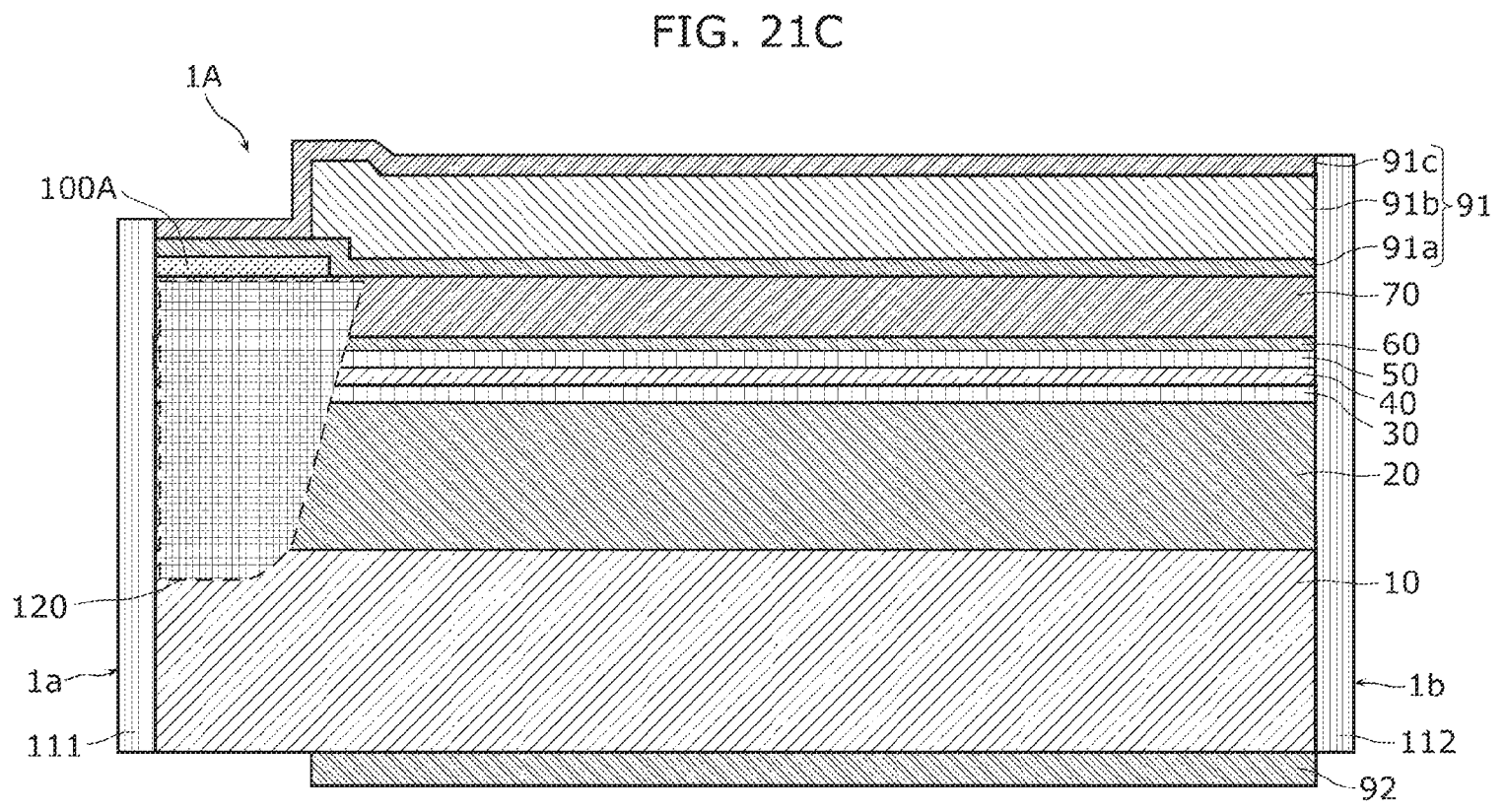

For example, although the current injection region is defined by disposing current blocking layer 80 including opening 80a in P-type contact layer 70 in the aforementioned embodiment, the present disclosure is not limited to this example. Specifically, as in semiconductor laser device 1A shown in FIG. 20, FIG. 21A, FIG. 21B, and FIG. 21C, a current injection region may be defined by providing ridge portion 200A. FIG. 20 is a top view of semiconductor laser device 1A according to a variation. FIG. 21A is a cross-sectional view of semiconductor laser device 1A taken along line XXIA-XXIA in FIG. 20. FIG. 21B is a cross-sectional view of semiconductor laser device 1A taken along line XXIB-XXIB in FIG. 20. FIG. 21C is a cross-sectional view of semiconductor laser device 1A taken along line XXIC-XXIC in FIG. 20. It should be noted that FIG. 21A shows a cross section in a gain portion of semiconductor laser device 1A, and FIG. 21B shows a cross section in an end face portion on a front end face 1a side of semiconductor laser device 1A.

As shown in FIG. 20 to FIG. 21C, semiconductor laser device 1A according to the present variation is a semiconductor laser element having a ridge stripe structure including, as an optical waveguide, ridge portion 200A extending in a resonator length direction.

In semiconductor laser device 1A, insulating film 100A including opening 100a corresponding to ridge portion 200A is provided. Insulating film 100A is a dielectric film having a current blocking function. Insulating film 100A includes an insulating film such as $SiO_2$.

In the present variation, a pair of grooves having a depth of 0.2 μm are provided to P-type contact layer 70 in order to provide ridge portion 200A, and a surface of P-type contact layer 70 other than ridge portion 200A to be a current injection path is covered with insulating film 100A. Accordingly, it is possible to cause inflowing current to flow through ridge portion 200A in a concentrated manner. It should be noted that the grooves for providing ridge portion 200A may be provided not only to P-type contact layer 70 but also to P-type cladding layer 60.

The configuration other than ridge portion 200A and insulating film 100A in the present variation is basically the same as the configuration of semiconductor laser device 1 according to the aforementioned embodiment.

For this reason, semiconductor laser device 1A according to the present variation produces the same advantageous effects as semiconductor laser device 1 according to the aforementioned embodiment.

It is possible to achieve semiconductor laser devices in various wavelength bands by combinations of opening 80a in the aforementioned embodiment and opening 100a in the present variation each defining the current injection region, the resonator length, and well layer 41.

For example, it is possible to achieve a semiconductor laser device having a wavelength in a band approximately from at least 780 nm to at most 800 nm and optical characteristics for emitting laser light having a light output of approximately at least 15 W and at most 30 W, by causing a making current and a making voltage to the semiconductor laser device having an opening width of approximately at least 90 μm and at most 300 μm and a resonator length of approximately at least 2000 μm and at most 6000 μm to be approximately at least 15 A and at most 40 A and approximately at least 1.7 V and at most 3.0 V, respectively.

For example, it is possible to achieve a semiconductor laser device having a wavelength in a band approximately from at least 800 nm to at most 820 nm and optical characteristics for emitting laser light having a light output of approximately at least 15 W and at most 30 W, by causing a making current and a making voltage to the semiconductor laser device having an opening width of approximately at least 90 μm and at most 300 μm and a resonator length of approximately at least 2000 μm and at most 6000 μm to be approximately at least 15 A and at most 40 A and approximately at least 1.6 V and at most 3.0 V, respectively.

For example, it is possible to achieve a semiconductor laser device having a wavelength in a band approximately from at least 850 nm to at most 900 nm and optical characteristics for emitting laser light having a light output of approximately at least 15 W and at most 30 W, by causing a making current and a making voltage to the semiconductor laser device having an opening width of approximately at least 90 μm and at most 300 μm and a resonator length of approximately at least 2000 μm and at most 6000 μm to be approximately at least 15 A and at most 40 A and approximately at least 1.5 V and at most 3.0 V, respectively.

For example, it is possible to achieve a semiconductor laser device having a wavelength in a band approximately from at least 900 nm to at most 930 nm and optical characteristics for emitting laser light having a light output of approximately at least 15 W and at most 40 W, by causing a making current and a making voltage to the semiconductor laser device having an opening width of approximately at least 90 μm and at most 300 μm and a resonator length of approximately at least 2000 μm and at most 6000 μm to be approximately at least 15 A and at most 50 A and approximately at least 1.45 V and at most 3.00 V, respectively.

For example, it is possible to achieve a semiconductor laser device having a wavelength in a band approximately from at least 930 nm to at most 960 nm and optical characteristics for emitting laser light having a light output of approximately at least 15 W and at most 40 W, by causing a making current and a making voltage to the semiconductor laser device having an opening width of approximately at least 90 μm and at most 300 μm and a resonator length of approximately at least 2000 μm and at most 6000 μm to be approximately at least 15 A and at most 50 A and approximately at least 1.4 V and at most 3.0 V, respectively.

For example, it is possible to achieve a semiconductor laser device having a wavelength in a band approximately from at least 960 nm to at most 990 nm and optical characteristics for emitting laser light having a light output of approximately at least 1 W and at most 40 W, by causing a making current and a making voltage to the semiconductor laser device having an opening width of approximately at least 4 μm and at most 300 μm and a resonator length of approximately at least 2000 μm and at most 6000 μm to be approximately at least 1 A and at most 50 A and approximately at least 1.4 V and at most 3.0 V, respectively.

Since semiconductor laser device 1A according to the present variation includes ridge portion 200A, it is possible to reduce characteristic deterioration etc. when semiconductor laser device 1A is mounted on a submount etc. This point will be described below.

If the resonator length of semiconductor laser device 1A is increased, the influence of shear strain on the optical waveguide grows, the shear strain occurring in an end portion of semiconductor laser device 1A in a width direction when semiconductor laser device 1A is mounted on the submount In this case, if a bilaterally asymmetric shear stress occurs in the current injection region to be the optical waveguide, a polarization plane for laser light propagating through the optical waveguide is inclined, and an elliptically polarized wave is generated, which causes a decrease in polarization ratio.

In view of this, as in semiconductor laser device 1A according to the present variation, if a ridge optical waveguide is obtained by providing ridge portion 200A, a shear stress occurring in the ridge optical waveguide is reduced by a shear stress occurring in ridge portion 200A and a shear stress occurring in the end portion of semiconductor laser device 1A in the width direction cancelling each other out when semiconductor laser device 1A is junction-down mounted. Accordingly, it is possible to reduce a decrease in polarization ratio due to the inclination of a polarization plane for laser light propagating through the optical waveguide.

Figure 22:
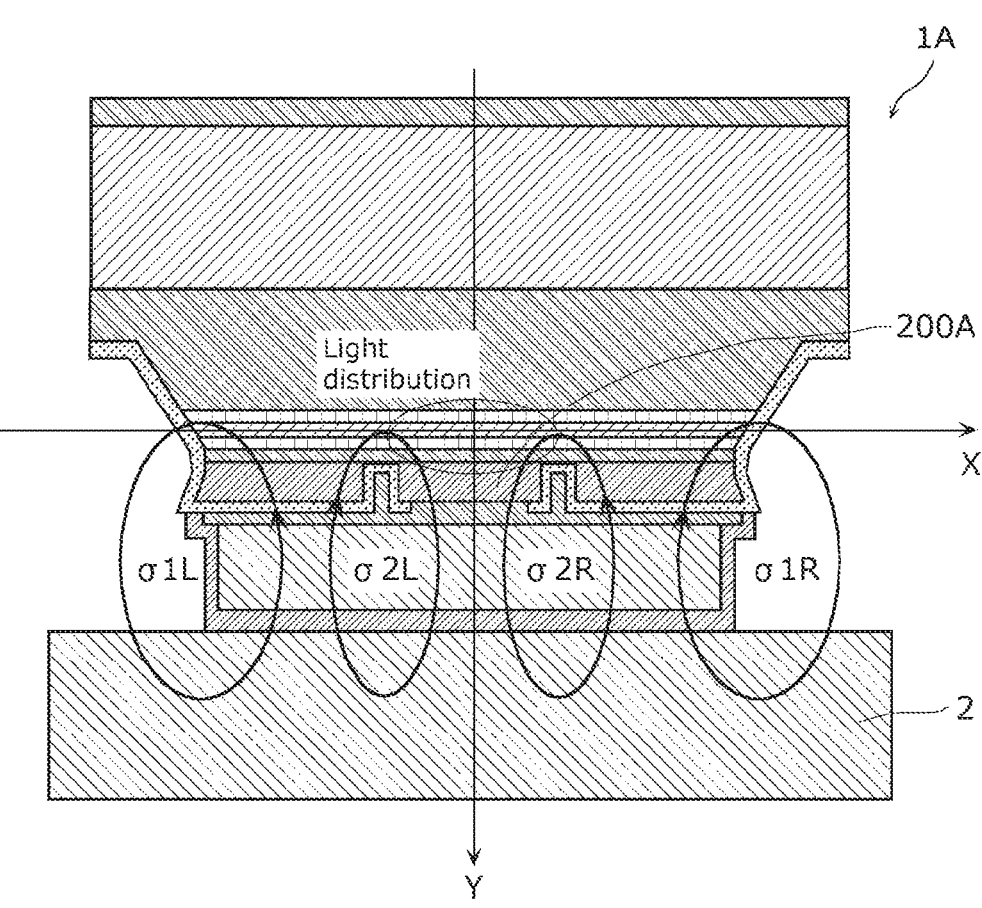
FIG. 22 is a diagram illustrating a state when the semiconductor laser device according to the variation is junction-down mounted on a submount.

This effect will be further described with reference to FIG. 22. FIG. 22 is a diagram illustrating a state when semiconductor laser device 1A according to the present variation is junction-down mounted on submount 2.

A submount having a thermal expansion coefficient higher than a thermal expansion coefficient of semiconductor laser device 1A is used as submount 2. For example, among the semiconductor materials constituting semiconductor laser device 1A, GaAs has a thermal expansion coefficient of $5.35 \times 10^{-6}$, AlAs has a thermal expansion coefficient of $3.40 \times 10^{-6}$, InAs has a thermal expansion coefficient of $4.33 \times 10^{-6}$, GaN has a thermal expansion coefficient of $5.59 \times 10^{-6}$, AlN has a thermal expansion coefficient of $4.15 \times 10^{-6}$, and InN has a thermal expansion coefficient of $2.85 \times 10^{-6}$. Accordingly, a submount including a metal material or a ceramic material as a main constituent material is used as submount 2. Examples of the main constituent material of submount 2 include Cu (thermal expansion coefficient of $16.8 \times 10^{-6}$), Ti (thermal expansion coefficient of $8.4 \times 10^{-6}$), Pt (thermal expansion coefficient of $8.4 \times 10^{-6}$), Au (thermal expansion coefficient of $14.2 \times 10^{-6}$), Ni (thermal expansion coefficient of $13.4 \times 10^{-6}$), and SiC (thermal expansion coefficient of $6.6 \times 10^{-6}$).

In this case, if semiconductor laser device 1A is junction-down (face-down) mounted on submount 2 as shown in FIG. 22, a shear stress (σ1) occurring in an end portion of semiconductor laser device 1A in the width direction and a shear stress (62) occurring in ridge portion 200A are applied to active layer 40 of semiconductor laser device 1A due to a difference in thermal expansion coefficient between semiconductor laser device 1A and submount 2.

Here, if an average thermal expansion coefficient (e.g., in the case where submount 2 comprises materials of multiple layers, $\Sigma L(i)T(i)/\Sigma L(i)$), where a thermal expansion coefficient of each material is denoted by L(i) and a thickness of each material is denoted by T(i)) of submount 2 is higher than an average thermal expansion coefficient of semiconductor laser device 1A, a stress occurs in semiconductor laser device 1A, with the result that submount 2 shrinks semiconductor laser device 1A in the horizontal direction (the X direction in FIG. 22). Moreover, since a thermal expansion coefficient of metal embedded in the grooves located on the both sides of ridge portion 200A is higher than the thermal expansion coefficient of semiconductor laser device 1A, a stress occurs in semiconductor laser device 1A, with the result that the widths of the grooves are increased. In consequence, shear stresses antisymmetric to the center of the current injection region between the grooves occur in the XY plane of semiconductor laser device 1A as shown in FIG. 22.

Specifically, in active layer 40 located at the same position in the X direction as the grooves provided to the sides of ridge portion 200A, since a shear stress (σ1L) occurring in a left end portion of semiconductor laser device 1A in the width direction and a shear stress (σ2L) occurring in the groove to the left of ridge portion 200A are in opposite directions, and a shear stress (σ1R) occurring in a right end portion of semiconductor laser device 1A in the width direction and a shear stress (σ2R) occurring in the groove to the right of ridge portion 200A are in opposite directions, the shear stresses cancel each other out, and the magnitude of the shear stresses is reduced.

Moreover, since a light distribution of light propagating through the optical waveguide extends to the regions of the grooves relative to the horizontal direction, the influence of the shear stresses on the light distribution at end portions of the light distribution is canceled out and reduced by the shear stresses in the grooves.

It should be noted that if left and right shear stresses are not completely antisymmetric to the center of ridge portion 200A in the width direction, a correlation integral between the light distribution and the shear stresses is not 0 in the case where the shear stresses cause birefringence in semiconductor laser device 1A, which causes a polarization plane to incline.

As stated above, according to semiconductor laser device 1A according to the present variation, since it is possible to cause the shear stresses in the grooves located to the sides of ridge portion 200A to cancel out the shear stresses occurring in the end portions of semiconductor laser device 1A when semiconductor laser device 1A is mounted on submount 2, it is possible to reduce the influence of the shear stresses on the light distribution. Accordingly, it is possible to reduce a decrease in polarization ratio due to the inclination of the polarization plane for the laser light propagating through the optical waveguide.

Increasing the Al composition of P-type cladding layer 60 to at least 0.8 is effective in reducing the influence of the shear stresses occurring in the end portions of ridge semiconductor laser device 1A in the width direction on the laser light propagating through the optical waveguide, because such an increase makes it possible to reduce leakage of light to P-type cladding layer 60. Since there is a possibility that if the Al composition is increased to more than 0.9, a lattice misfit with the GaAs substrate becomes large, and crystallinity is reduced due to the occurrence of lattice defect, it is desirable that the Al composition be at least 0.8 and at most 0.9.

It should be noted that it is desirable that the width of each of the grooves provided to the sides of ridge portion 200A be at least 10 μm. In this manner, it is possible to reduce shear stresses outside ridge portion 200A. Specifically, since weight at the time of mounting is concentrated on ridge portion 200A to be the current injection region if the width of each of the grooves is increased excessively, it is desirable that the width of each of the grooves be 25 μm f 15 μm. By causing the grooves to have such a width, it is possible to effectively reduce the rotation of the polarization plane caused by the shear stresses.

Although semiconductor laser device 1A according to the present variation is junction-down mounted on submount 2, the present disclosure is not limited to this example. For example, semiconductor laser device 1A may be junction-up (face-up) mounted on a supporting base substrate such as submount 2.

It should be noted that with regard to a case in which semiconductor laser device 1 according to the aforementioned embodiment is mounted on a submount, semiconductor laser device 1 may be mounted using one of a junction-down method or a junction-up method.

Other Variations

Although semiconductor laser device 1 according to the aforementioned embodiment comprises an AlGaInAs-based semiconductor material as an example, the present disclosure is not limited to this example, and other semiconductor materials may be used.

Figure 23:
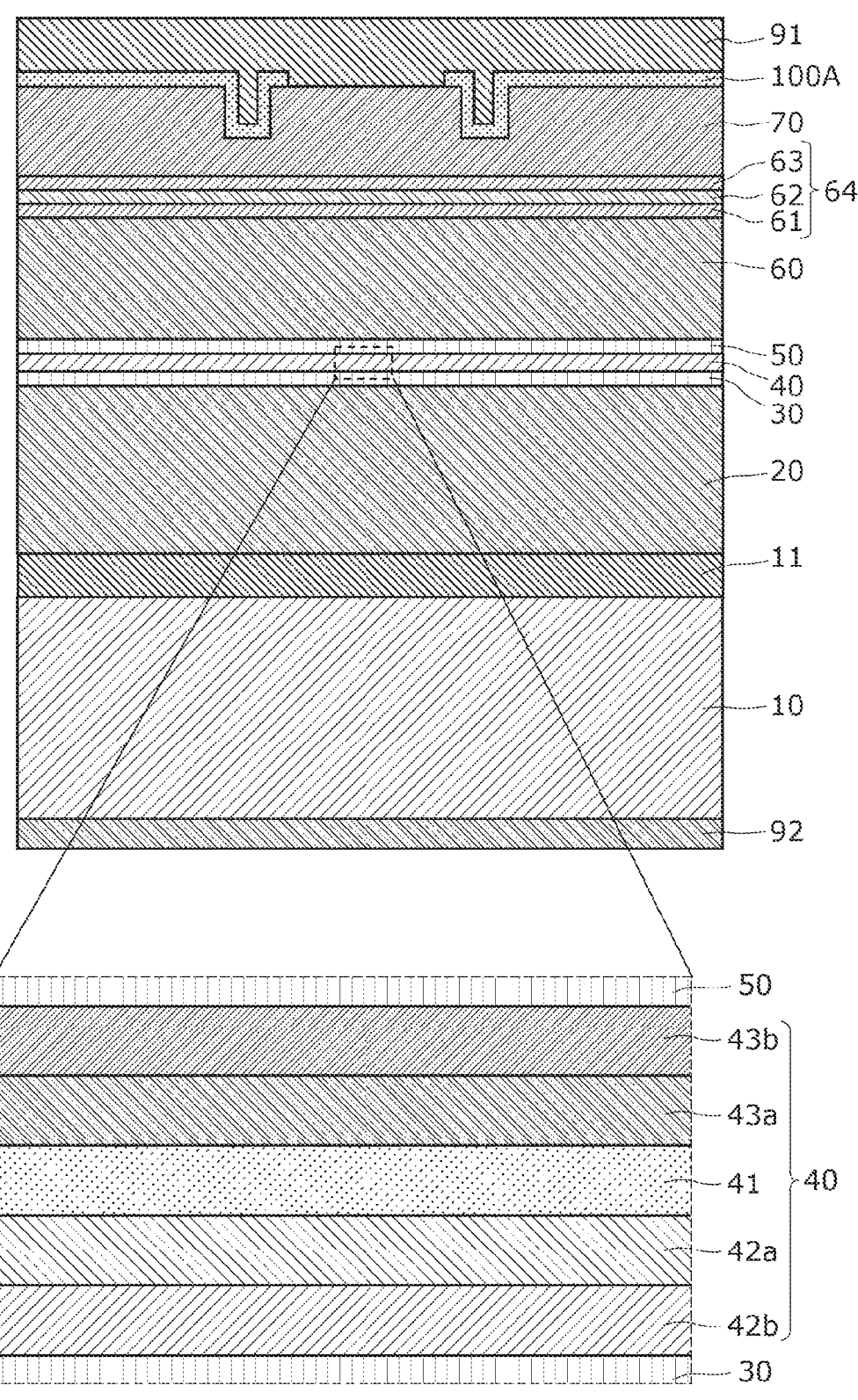
FIG. 23 is a cross-sectional view of a semiconductor laser device according to another variation.

Specifically, a semiconductor laser device may comprise an AlGaInP-based semiconductor material. In this case, as shown in FIG. 23, the semiconductor laser device comprising the AlGaInP-based semiconductor material can have a configuration in which, for example, N-type buffer layer 11, N-type cladding layer 20, N-type guiding layer 30, active layer 40, P-type guiding layer 50, P-type cladding layer 60, intermediate layer 64, P-type contact layer 70, insulating film 100A, and P-side electrode 91 are sequentially stacked on substrate 10 that is an n-type GaAs substrate. Intermediate layer 64 has a configuration in which first intermediate layer 61, second intermediate layer 62, and third intermediate layer 63 are sequentially stacked.

As an example, N-type buffer layer 11 comprises AlGaAs or GaAs (thickness: 0.5 μm, Si impurity concentration: $3\times10^{17}$ cm$^{-3}$). N-type cladding layer 20 is represented by $(Al_xGa_{1-x})_{0.5}In_{0.5}P$ (thickness: 3.6 μm, AI composition: 0.18, Si impurity concentration: multistage of $2\times10^{18}$ cm$^{-3}$, $6\times10^{17}$ cm$^{-3}$, $1.4\times10^{17}$ cm$^{-3}$). An interface region between N-type buffer layer 11 and N-type cladding layer 20 is represented by $Al_xGa_{1-x}As$ and has a thickness of 75 nm, an AI composition that continuously changes from 0 to 0.31, and an impurity concentration of $3\times10^{17}$ cm$^{-3}$. N-type guiding layer 30 is represented by $(Al_xGa_{1-x})_{0.5}In_{0.5}P$ (thickness: 85 nm, AI composition: 0, 80 nm on active layer 40 side: undoped, Si impurity concentration of the remaining portion: $1\times10^{17}$ cm$^{-3}$). An interface region between N-type cladding layer 20 and N-type guiding layer 30 has a thickness of 20 nm and an AI composition that continuously changes from 0.18 to 0.

With regard to active layer 40, N-side second barrier layer 42b comprises AlGaAs (thickness: 6.5 nm, AI composition: 0.59, undoped); N-side first barrier layer 42a comprises AlGaAs (thickness: 3.5 nm, AI composition: 0.53, undoped); well layer 41 comprises GaInAs (thickness: 8.5 nm, In composition: 0.12); P-side first barrier layer 43a comprises AlGaAs (thickness: 3.5 nm, AI composition: 0.53, undoped); and P-side second barrier layer 43b comprises AlGaAs (thickness: 17.5 nm, AI composition: 0.59, undoped).

P-type guiding layer 50 is represented by $(Al_xGa_{1-x})_{0.5}In_{0.5}P$ (thickness: 0.17 μm, AI composition: 0, 50 nm on active layer 40 side: undoped, Si impurity concentration of the remaining portion: $5\times10^{17}$ cm$^{-3}$). P-type cladding layer 60 is represented by $(Al_xGa_{1-x})_{0.5}In_{0.5}P$ (thickness: 0.6 μm, AI composition: 0.69, C impurity concentration: multistage of $5\times10^{17}$ cm$^{-3}$ and $1.2\times10^{18}$ cm$^{-3}$). An interface region between P-type guiding layer 50 and P-type cladding layer 60 has a thickness of 50 nm, an AI composition that continuously changes from 0 to 0.69, and a C impurity concentration of $5\times10^{17}$ cm$^{-3}$.

With regard to intermediate layer 64, first intermediate layer 61 is represented by $(Al_xGa_{1-x})_{0.5}In_{0.5}P$ (thickness: 0.2 μm, AI composition: 0.30, C impurity concentration: $1.2\times10^{18}$ cm$^{-3}$); second intermediate layer 62 is represented by $(Al_xGa_{1-x})_{0.5}In_{0.5}P$ (thickness: 0.038 μm, AI composition: 0, C impurity concentration: $1.2\times10^{18}$ cm$^{-3}$); and third intermediate layer 63 comprises AlGaAs (thickness: 0.05 μm, AI composition slope: continuously changing from 0.52 to 0, C impurity concentration: $1.2\times10^{18}$ cm$^{-3}$).

It should be noted that P-type contact layer 70 comprises GaAs (thickness: 0.4 μm, C impurity concentration: $2\times10^{18}$ cm$^{-3}$).

The semiconductor laser device according to the present variation having such a configuration produces the same advantageous effects as Embodiment 1. For example, even if well layer 41 is increased in thickness, it is possible to reduce blocking of the effect of increasing a COD level while reducing a deterioration of temperature characteristics and a decrease in long-term reliability.

Moreover, the semiconductor laser device according to the present variation shown in FIG. 23 produces the following effects.

Firstly, since the semiconductor laser device according to the present variation comprises the AlGaInP-based semiconductor material having band gap energy greater than band gap energy of the AlGaAs-based semiconductor material, the semiconductor laser device obtains a high potential barrier. This makes it possible to reduce carriers leaking to P-type guiding layer 50 over active layer 40, so it is possible to obtain a semiconductor laser device capable of performing a high-temperature high-output operation while improving slope efficiency.

Secondly, since impurities (Zn) are more likely to diffuse, it is possible to decrease an impurity concentration necessary for forming a window. This makes it possible to reduce free carrier loss caused by the impurities, so it is possible to improve the slope efficiency.

Thirdly, since it is possible to perform lattice matching between N-type cladding layer 20, N-type guiding layer 30, P-type guiding layer 50, and P-type cladding layer 60, and substrate 10 that is a GaAs substrate, the warpage of the semiconductor laser device (element) is reduced. Since, even if asymmetrical strain occurs in the semiconductor laser device at the time of junction-down mounting, the reduction of the warpage makes it possible to reduce the asymmetrical strain, it is possible to enhance the effect of insulating film 100A that is a current blocking layer including an oxide film, that is, the effect of causing the shear stresses due to the ridge shape to cancel out the shear stresses occurring in the end portions of the semiconductor laser device.

Fourthly, intermediate layer 64 makes it possible to reduce an increase in drive voltage of the semiconductor laser device. Specifically, since the AI composition is reduced in stages by first intermediate layer 61 and second intermediate layer 62 in intermediate layer 64, it is possible to minimize a band gap energy difference generated when AlGaInP and GaAs are joined, and to reduce an increase in drive voltage. In addition, since third intermediate layer 63 serves as an inclined layer for the AI composition of AlGaAs, it is possible to smooth band gap energy in a hetero interface and reduce an increase in drive voltage.

Although the lateral surfaces of the semiconductor stacked body are caused to be the inclined surfaces by forming the constricted structure to the semiconductor layers constituting the semiconductor stacked body in semiconductor laser device 1 according to the aforementioned embodiment, the present disclosure is not limited to this example.

Forms that can be obtained by various modifications to the aforementioned embodiment that may be conceived by a person skilled in the art, and forms realized by arbitrarily combining the constituent elements and functions in the aforementioned embodiment without departing from the essence of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser device according to the present disclosure can be applied to light sources for various applications such as, as a high-output light source, a light source for an image display device such as a display, a projector, and the like, a light source for a vehicular headlamp, a light source for industrial lighting or household lighting, or a light source for industrial equipment such as laser welding equipment, a thin-film annealer, and laser processing equipment.

The invention claimed is:

1. A semiconductor laser device that emits laser light, the semiconductor laser device comprising:
    a substrate;
    an N-type cladding layer above the substrate;
    an active layer above the N-type cladding layer; and
    a P-type cladding layer above the active layer,
    wherein the active layer includes:
        a well layer;
        a P-side first barrier layer above the well layer; and
        a P-side second barrier layer above the P-side first barrier layer,
    the P-side second barrier layer has an Al composition ratio higher than an Al composition ratio of the P-side first barrier layer,
    the P-side second barrier layer has band gap energy greater than band gap energy of the P-side first barrier layer,
    the semiconductor laser device further comprises:
        a P-type guiding layer between the P-side second barrier layer and the P-type cladding layer; and
        a P-side high Al composition layer between the well layer and the P-side first barrier layer,
    the P-side high Al composition layer has an Al composition ratio higher than the Al composition ratio of the P-side first barrier layer,
    the P-type guiding layer has band gap energy greater than the band gap energy of the P-side second barrier layer, and
    the semiconductor laser device has an end face window structure in which band gap energy of a portion of the well layer in a vicinity of an end face that emits the laser light is greater than band gap energy of a central portion of the well layer in a resonator length direction.

2. The semiconductor laser device according to claim 1, wherein the P-type cladding layer has band gap energy greater than band gap energy of the N-type cladding layer.

3. The semiconductor laser device according to claim 1, wherein the well layer has a thickness of at least 6 nm.

4. The semiconductor laser device according to claim 1, wherein the well layer comprises a semiconductor material represented by a composition formula of $Al_XGa_{1-X-Y}In_YAs$, where $0 < X < 1$ and $0 < Y < 1$.

5. The semiconductor laser device according to claim 1, wherein the band gap energy of the P-side second barrier layer gradually increases with distance from the well layer.

6. The semiconductor laser device according to claim 1, wherein the P-side first barrier layer includes an undoped region that is doped with no impurities, and
the undoped region has a thickness of at least 5 nm.

7. The semiconductor laser device according to claim 1, wherein the P-side second barrier layer is entirely doped with impurities, and
the P-side first barrier layer includes an undoped region that is doped with no impurities in a region on a side close to the well layer, and a doped region that is doped with impurities in a region on a side far from the well layer.

8. The semiconductor laser device according to claim 1, wherein a concentration of impurities with which the P-side second barrier layer is doped gradually increases with distance from the well layer.

9. The semiconductor laser device according to claim 1, wherein an Al composition ratio at least in an interface region between the P-type guiding layer and the P-type cladding layer gradually increases with distance from the well layer.

10. The semiconductor laser device according to claim 1, wherein a concentration of impurities with which the P-type guiding layer is doped gradually increases with distance from the well layer.

11. The semiconductor laser device according to claim 1, wherein the active layer further includes an N-side first barrier layer below the well layer, and an N-side second barrier layer below the N-side first barrier layer,
the N-side second barrier layer has an Al composition ratio higher than an Al composition ratio of the N-side first barrier layer, and
the N-side second barrier layer has band gap energy greater than band gap energy of the N-side first barrier layer.

12. The semiconductor laser device according to claim 11, wherein the band gap energy of the N-side second barrier layer gradually increases with distance from the well layer.

13. The semiconductor laser device according to claim 11, wherein the N-side second barrier layer is entirely doped with impurities, and
the N-side first barrier layer includes an undoped region that is doped with no impurities in a region on a side close to the well layer, and a doped region that is doped with impurities in a region on a side far from the well layer.

14. The semiconductor laser device according to claim 11, the P-side second barrier layer has the band gap energy greater than the band gap energy of the N-side second barrier layer.

15. The semiconductor laser device according to claim 11, further comprising:
    an N-side high Al composition layer between the well layer and the N-side first barrier layer, the N-side high Al composition layer having an Al composition ratio higher than the Al composition ratio of the N-side first barrier.

16. The semiconductor laser device according to claim 11, further comprising:

an N-type guiding layer between the N-side second barrier layer and the N-type cladding layer.

17. The semiconductor laser device according to claim 16, wherein an Al composition ratio at least in an interface region between the N-type guiding layer and the N-type cladding layer gradually increases with distance from the well layer.

18. The semiconductor laser device according to claim 16, wherein a concentration of impurities with which each of the N-type cladding layer, the N-type guiding layer, the N-side second barrier layer, and the N-side first barrier is doped gradually increases with distance from the well layer or increases in stages.

19. The semiconductor laser device according to claim 1, wherein the active layer further includes an N-side first barrier layer below the well layer, and an N-side second barrier layer below the N-side first barrier layer, the N-side second barrier layer has an Al composition ratio higher than an Al composition ratio of the N-side first barrier layer, the N-side second barrier layer has band gap energy greater than band gap energy of the N-side first barrier layer, the semiconductor laser device further comprises an N-type guiding layer between the N-side second barrier layer and the N-type cladding layer, and the P-type guiding layer has band gap energy different from band gap energy of the N-type guiding layer.

20. The semiconductor laser device according to claim 5, further comprising:

an N-side first barrier layer and an N-side second barrier layer between the well layer and the N-type cladding layer, in a direction from the well layer to the N-type cladding layer, the N-side second barrier layer has an Al composition ratio higher than an Al composition ratio of the N-side first barrier layer, the N-side second barrier layer has band gap energy greater than band gap energy of the N-side first barrier layer, the band gap energy of the N-side second barrier layer gradually increases with distance from the well layer, and a maximum value of the band gap energy of the P-side second barrier layer is larger than a maximum value of the band gap energy of the N-side second barrier layer.

21. The semiconductor laser device according to claim 1, wherein the P-side second barrier layer is in direct contact with the P-side first barrier layer.

22. The semiconductor laser device according to claim 1, wherein the well layer has a single quantum well structure including a single quantum well layer.

23. The semiconductor laser device according to claim 1, wherein the active layer further includes an N-side first barrier layer below the well layer, and an N-side second barrier layer below the N-side first barrier layer, and a total thickness of the P-side first barrier layer and the N-side first barrier layer is at least 20 nm and at most 80 nm.

24. A method of manufacturing a semiconductor laser device that emits laser light, the method comprising:

disposing an N-type cladding layer above a substrate;

disposing a well layer above the N-type cladding layer;

depositing a P-side high Al composition layer above the well layer depositing a P-side first barrier layer above the P-side high Al composition layer;

depositing a P-side second barrier layer above the P-side first barrier layer;

depositing a P-type guiding layer above the P-side second barrier layer; and disposing a P-type cladding layer above the P-type guiding layer, wherein the P-side second barrier layer has an Al composition ratio higher than an Al composition ratio of the P-side first barrier layer, the P-side second barrier layer has band gap energy greater than band gap energy of the P-side first barrier layer, the P-side high Al composition layer has an Al composition ratio higher than the Al composition ratio of the P-side first barrier layer, the P-type guiding layer has band gap energy greater than the band gap energy of the P-side second barrier layer, and the semiconductor laser device has an end face window structure in which band gap energy of a portion of the well layer in a vicinity of an end face that emits the laser light is greater than band gap energy of a central portion of the well layer in a resonator length direction.

* * * * *